United States Patent
Katagiri et al.

(10) Patent No.: US 6,867,123 B2
(45) Date of Patent: Mar. 15, 2005

(54) SEMICONDUCTOR INTEGRATED CIRCUIT DEVICE AND ITS MANUFACTURING METHOD

(75) Inventors: Mitsuaki Katagiri, Nishitokyo (JP); Yuji Shirai, Hamura (JP); Kunihiko Nishi, Kokubunji (JP); Takehiro Ohnishi, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/250,939

(22) PCT Filed: Nov. 30, 2001

(86) PCT No.: PCT/JP01/10491
§ 371 (c)(1),
(2), (4) Date: Jul. 9, 2003

(87) PCT Pub. No.: WO02/063681
PCT Pub. Date: Aug. 15, 2002

(65) Prior Publication Data
US 2004/0023450 A1 Feb. 5, 2004

(30) Foreign Application Priority Data
Feb. 8, 2001 (JP) .......................................... 2001-32015

(51) Int. Cl.⁷ ............................................... H01L 21/44
(52) U.S. Cl. ........................ 438/614; 438/612; 438/613; 438/622; 257/758; 257/759
(58) Field of Search ................................. 438/622–637, 438/758–760, 612–614; 257/758–760, 700

(56) References Cited

U.S. PATENT DOCUMENTS

2002/0046880 A1 * 4/2002 Takubo et al. ............... 174/261
2004/0007778 A1 * 1/2004 Shinozaki et al. ........... 257/759

FOREIGN PATENT DOCUMENTS

| JP | 7-161761 | 6/1995 |
| JP | 7-263451 | 10/1995 |
| JP | 10-189813 | 7/1998 |
| JP | 11-40563 | 2/1999 |
| JP | 2000-216253 | 8/2000 |
| WO | WO99/23696 | 5/1999 |

* cited by examiner

*Primary Examiner*—Dung A. Le
(74) *Attorney, Agent, or Firm*—Miles & Stockbridge P.C.

(57) ABSTRACT

A semiconductor wafer which has finished formation of a relocating wiring layer thereon is stored and after determination of a design, solder bumps are formed over bump lands (one end of the relocating wiring layer) in accordance with a pattern which differs with a design, whereby a function or characteristic depending on the design is selected. The semiconductor wafer is then cut into a plurality of semiconductor chips, whereby a wafer level CSP is available.

21 Claims, 60 Drawing Sheets

FIG. 22

| FUNCTION | PAD | | BIT CONSTITUTION | OPERATION MODE | |
|---|---|---|---|---|---|
| | BP1 | BP2 | | DDR | SYNCHRONOUS |
| FUNCTION 1 | Vdd | Vdd | ×32Bit | ○ | — |
| FUNCTION 2 | Vdd | Vss | ×32Bit | — | ○ |
| FUNCTION 3 | Vss | Vdd | ×64Bit | ○ | — |
| FUNCTION 4 | Vss | Vss | ×64Bit | — | ○ |

FIG. 23
(a)
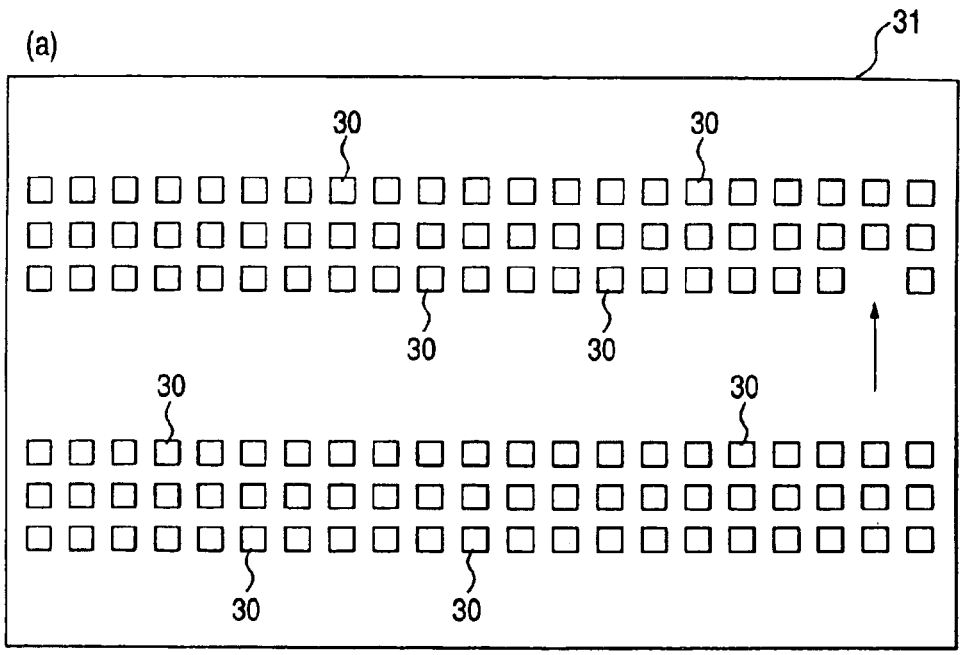
(b)
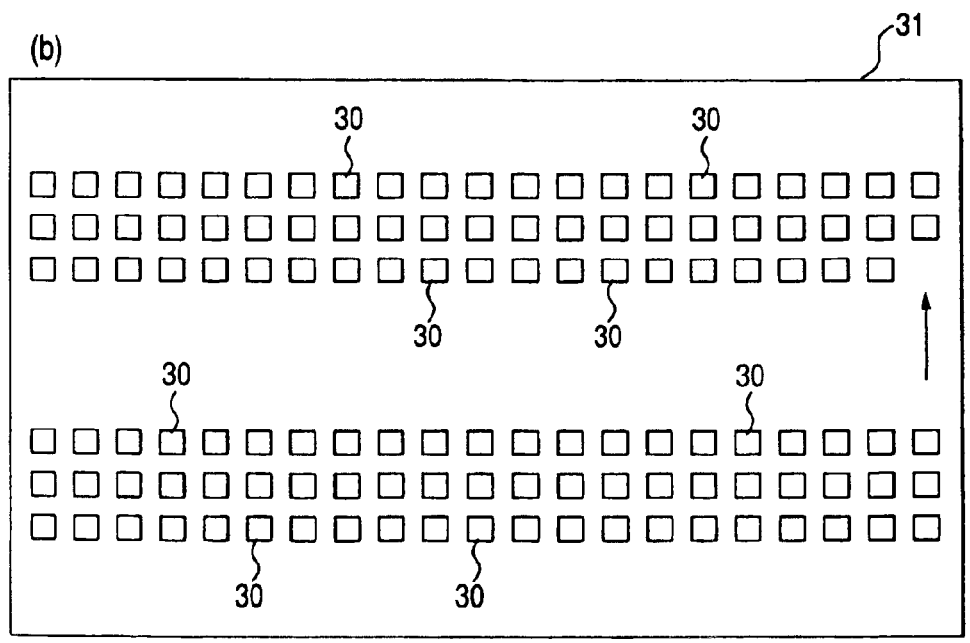

FIG. 47
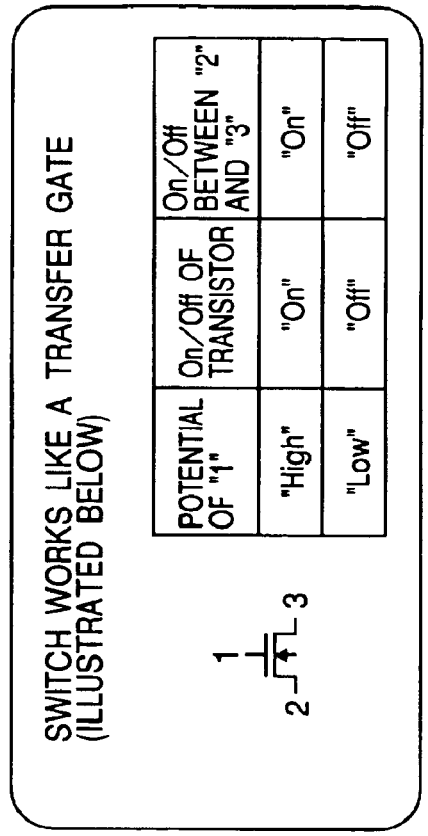
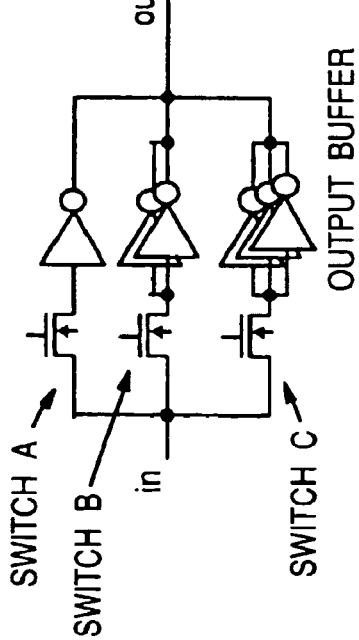

| POTENTIAL OF "1" | POTENTIAL OF "A/B/C" | On/Off OF SWITCH "a/b/c" | POTENTIAL OF "VCL-out" |
|---|---|---|---|
| "NO INPUT" | "High/Low/Low" | "On/Off/Off" | "vddq" |
| "High" | "Low/High/Low" | "Off/On/Off" | "vddq1" |
| "Low" | "Low/Low/High" | "Off/Off/On" | "vddq2" |

| W/L RATIO OF MP1 AND MP2 | W/L RATIO OF MN1 AND MN2 | THROUGH RATE RATIO |
|---|---|---|
| 5/1 | 5/2 | ONE TIME (I/O DRIVE CIRCUIT A) |
| 5/2 | 5/4 | TWO TIMES (I/O DRIVE CIRCUIT B) |
| 5/3 | 5/6 | THREE TIMES (I/O DRIVE CIRCUIT C) |

FIG. 60
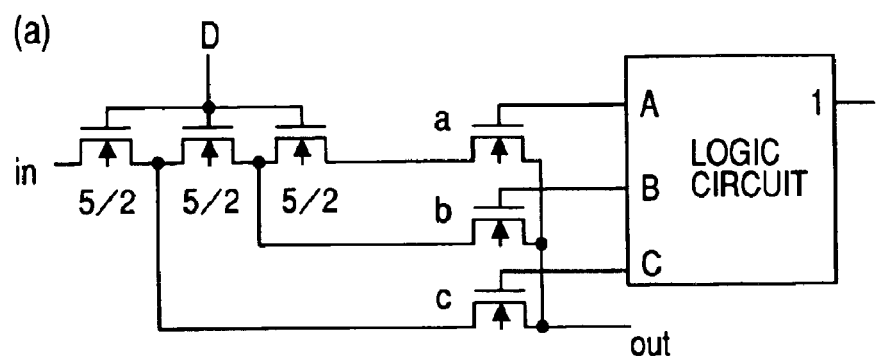
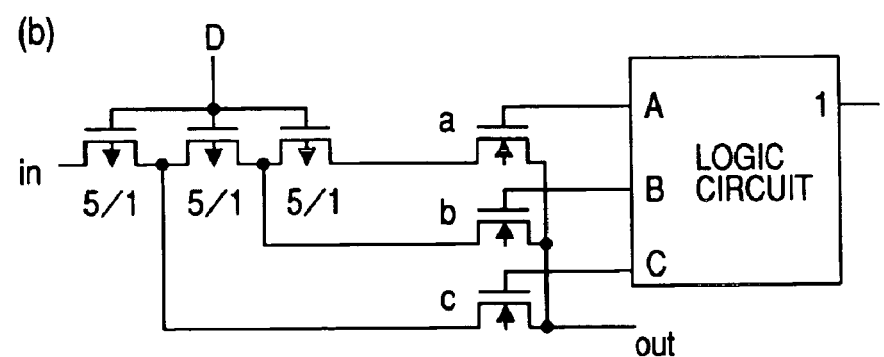

FIG. 61

| POTENTIAL OF "1" | POTENTIAL OF "A/B/C" | On/Off OF SWITCH "a/b/c" | THROUGH RATE RATIO |
|---|---|---|---|
| "NO INPUT" | "High/Low/Low" | "On/Off/Off" | ONE TIME (I/O DRIVE CIRCUIT A) |
| "High" | "Low/High/Low" | "Off/On/Off" | TWO TIMES (I/O DRIVE CIRCUIT B) |
| "Low" | "Low/Low/High" | "Off/Off/On" | THREE TIMES (I/O DRIVE CIRCUIT C) |

SEMICONDUCTOR INTEGRATED CIRCUIT DEVICE AND ITS MANUFACTURING METHOD

This application is a 571 of PCT/JP01/10491 Nov. 30, 2001.

TECHNICAL FIELD

The present invention relates to a semiconductor integrated circuit device and its manufacturing method. More specifically, the invention pertains to a technique effective when applied to a CSP (chip size package) formed by making use of a wafer process, that is, a wafer level CSP (WL-CSP) or a wafer process package (Wafer Process Package) which is a system of finishing a packaging step at a wafer level.

BACKGROUND ART

A packaging technique called a wafer level (Wafer Level) CSP, that is, a system of integrating a packaging process which is an assembly step with a wafer process which mainly uses photolithography, and completing a packaging step at a wafer level has an advantage of drastically reducing the number of steps compared with the conventional method in which each chip is subjected to a packaging process after cut out from the wafer, because in the wafer level CSP, the packaging process is conducted by making use of the wafer process. The wafer level CSP is also called wafer process•package (WPP).

The above-described wafer level CSP is expected to actualize a reduction in the manufacturing cost of the CSP together with a reduction in the number of steps, because as compared, for example, with a CSP having a structure in which a tape-shaped interconnect having a copper (Cu) interconnect formed over an insulating tape is adhered onto the main surface of the semiconductor chip, an interconnect layer (tape-shaped interconnect) inside of the former CSP, which is called "interposer", for converting the pitch of a bonding pad to the pitch of a solder bump can be replaced with a relocating wiring layer formed over the wafer.

A description on the wafer level CSP can be found in, for example, pages 81 to 113, Electronics Jisso Gijutsu: 2000, Extra Number (published by Gicho Publishing and Advertising Co., Ltd., on May 28, 2000), or International Laid-Open No. WO/23696.

In the conventional method of subjecting every chip cut out from a wafer to a packaging process (post-step), an operation mode such as word constitution or bit constitution was changed (design was switched) by bonding option, for example, in memory LSI such as DRAM (Dynamic Random Access Memory) in order to meet the request of users promptly. Such a technique of changing electrical characteristics, that is, carrying out bonding option after dividing into individual chips is described in Japanese Unexamined Patent Publication No. Hei 11 (1999)-40563 or Hei 7 (1995)-161761.

In Japanese Unexamined Patent Publication No. Hei 11 (1999)-40563, disclosed are: (1) a method of connecting, in advance, two interconnects having different electrical characteristics to a bonding pad (semiconductor element electrode disposed on a semiconductor chip) to be connected to a bonding wire, tape lead or external connection ball and cutting by laser one of these interconnects in accordance with the electrical characteristics requested; (2) a method of changing the wiring of a bonding wire which connects a semiconductor element electrode (bonding pad) disposed on the semiconductor chip to the electrode portion of a semiconductor package; and (3) a method of changing the disposal position of an external connection ball to be connected to the electrode (bonding pad) of a semiconductor chip in a CSP.

In Japanese Unexamined Patent Publication No. Hei 7 (1995)-161761, described is a method of forming, in a semiconductor device in which bonding pads on the semiconductor element surface and a plurality of leads are connected via a bonding wire, plural rows of pad groups, each having a row of a plurality of bonding pads equal in function, at the central part of the semiconductor device while classifying the groups by function, and changing the bonding pad to which a bonding wire is connected, thereby altering the combination of connection between the lead and bonding pad, depending on the design.

DISCLOSURE OF THE INVENTION

Since in a wafer level CSP, a wafer process is started after determination of the design and steps up to the formation of an external connection terminal (solder bump) are conducted by the wafer process, alternation in the operation mode cannot be conducted as usual after division of a wafer into chips. The wafer level CSP is therefore accompanied with such a drawback as the prolongation of the development term from receipt of order to delivery of the product. When the wafer process is started in anticipation of an order amount by each design in order to shorten the development term, an increase in the manufacturing cost due to unnecessary large stocks inevitably occurs.

In the case of package such as CSP, disposal of terminals having a specific function must sometimes be changed by user option, but disposal of pins cannot be changed after division of a wafer into chips.

An object of the present invention is to provide a technique of shortening the development term of a wafer level CSP.

Another object of the present invention is to provide a technique of reducing the manufacturing cost of a wafer level CSP.

A further object of the present invention is to provide a technique capable of reducing stocks which will otherwise be maintained by market production.

A still further object of the present invention is to provide a technique permitting switch-over of the design by wafer.

A still further object of the present invention is to provide a technique permitting easy switch-over of the characteristics or functions of a wafer level CSP.

The above-described and the other objects, and novel features of the present invention will be apparent from the description herein and accompanying drawings.

Of the inventions disclosed by the present application, typical ones will next be described briefly.

A semiconductor integrated circuit device of the present invention comprise a semiconductor substrate having a main surface, circuit elements formed on the main surface and constituting an integrated circuit having a plurality of functions or a plurality of characteristics, electrodes formed on the main surface and being connected to the circuit elements, first wirings formed in the same layer with the electrodes and connecting the circuit elements and the electrodes, an insulating layer covering therewith the first wirings and circuit elements and formed to expose the electrodes, second wirings formed over the insulating layer and made of a layer different from the first wirings, and external connection terminals disposed over the insulating layer and electrically connected to the second wirings, wherein one of the plurality of functions or plurality of characteristics of the integrated circuit is selected by the combination of the second wirings and the external connection terminals connected.

The manufacturing method of the semiconductor integrated circuit device of the present invention comprises:

(a) forming circuit elements constituting an integrated circuit having a plurality of functions or a plurality of characteristics in a plurality of chip regions over the main surface of a semiconductor wafer;

(b) forming, over the circuit elements, electrodes to be connected to the circuit elements, and first wirings formed in the same layer with the electrodes to connect the circuit elements and the electrodes, (c) forming an insulating layer to cover the first wirings and the circuit elements and expose the electrodes, (d) forming, over the insulating layer, second wirings to electrically connect, at one ends thereof, to the electrodes, (e) selecting one of the plurality of functions or the plurality of characteristics by connecting a predetermined second wiring, among the second wirings, to an external connection terminal; and (f) dividing the semiconductor wafer by the plurality of chip regions, thereby forming a plurality of semiconductor chips.

BRIEF DESCRIPTION OF THE DRAWINGS

FIG. 22 is an explanatory view of the corresponding relationship between the voltage input into a function-selecting bonding pad and the function;

FIGS. 23(a) and (b) are each a fragmentary plan view of a solder printing mask to be used for the manufacture of the semiconductor integrated circuit device according to the one embodiment of the present invention;

FIG. 47 is a block diagram illustrating a further example of the I/O drive circuit;

FIGS. 60(a) and (b) are each a circuit diagram of a through rate control switch circuit in the through rate control circuit;

FIG. 61 is an explanatory view of the corresponding relationship between a voltage input into a bonding pad and ON/OFF of a switch;

BEST MODE FOR CARRYING OUT THE INVENTION

Figure 1:
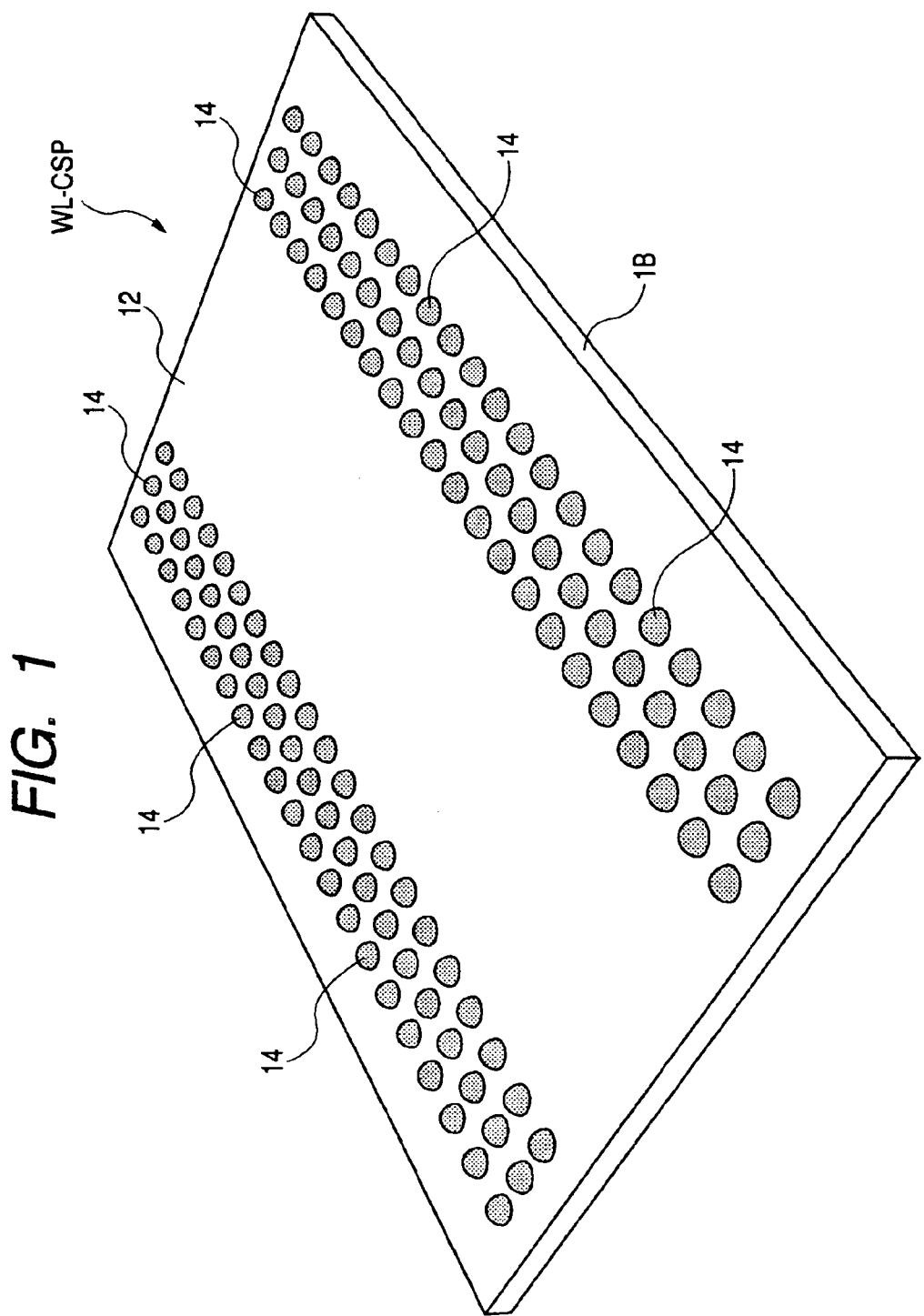
FIG. 1 is a perspective view illustrating the appearance of a semiconductor integrated circuit device according to one embodiment of the present invention.

The embodiments of the present invention will hereinafter be described specifically based on accompanying drawings. In all the drawings for describing the below-described embodiments, elements having like function will be identified by like reference numerals and overlapping descriptions will be omitted.

(Embodiment 1)

Figure 2:
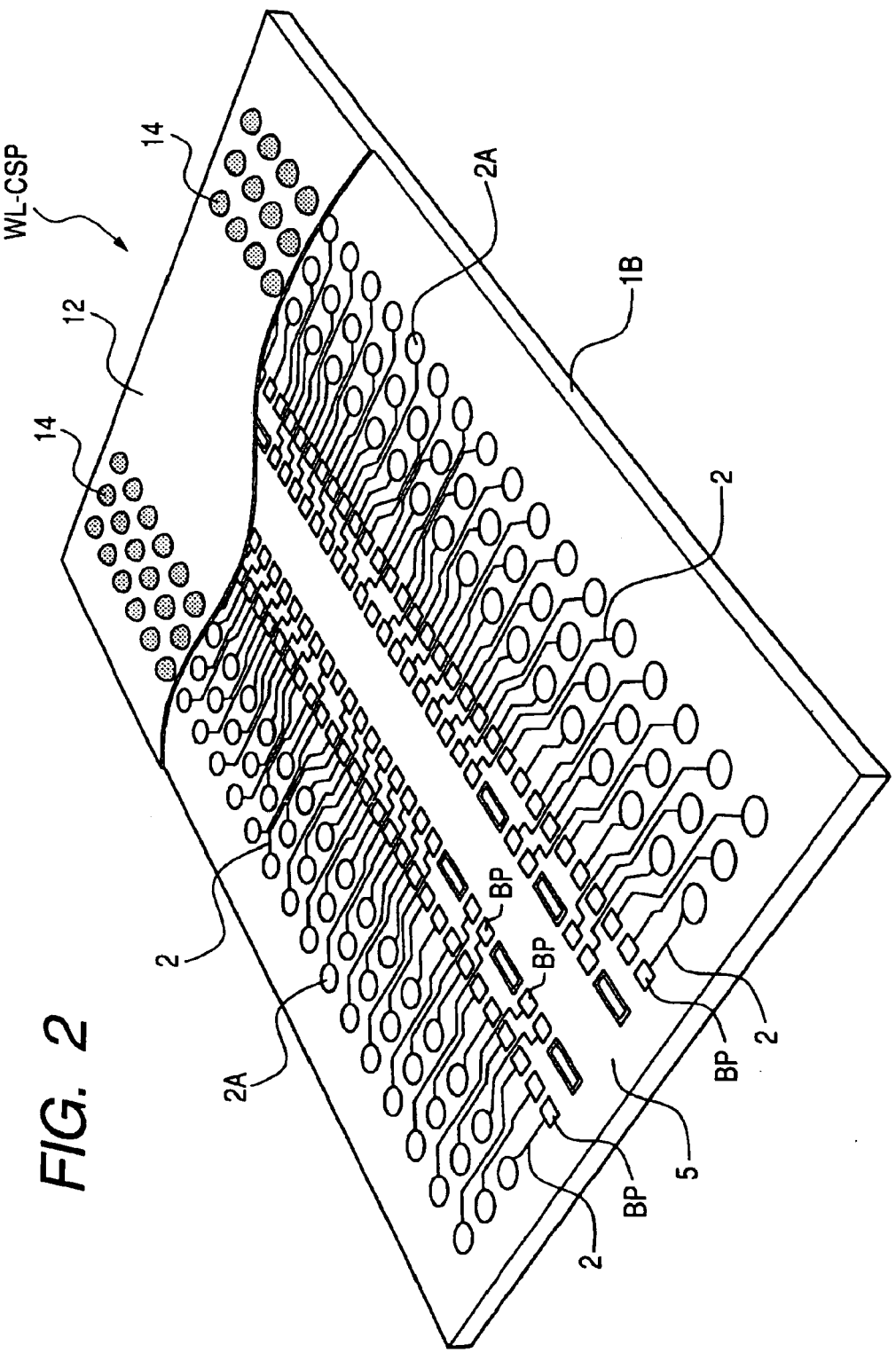
FIG. 2 is a perspective view illustrating relocating wiring (relocating wiring layers) of the semiconductor integrated circuit device according to the one embodiment of the present invention.
Figure 3:
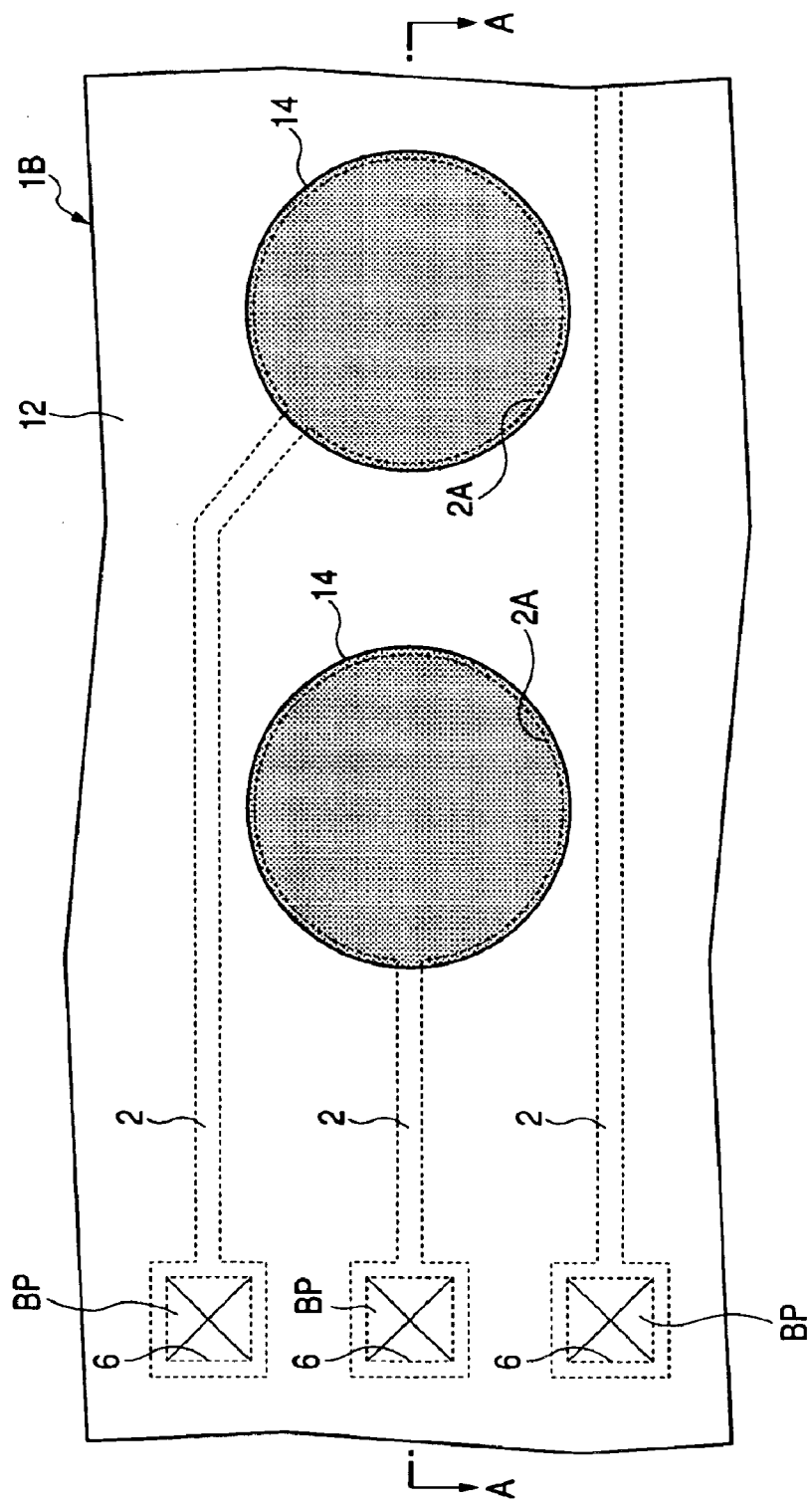
FIG. 3 is an enlarged fragmentary plan view of FIG. 2.
Figure 4:
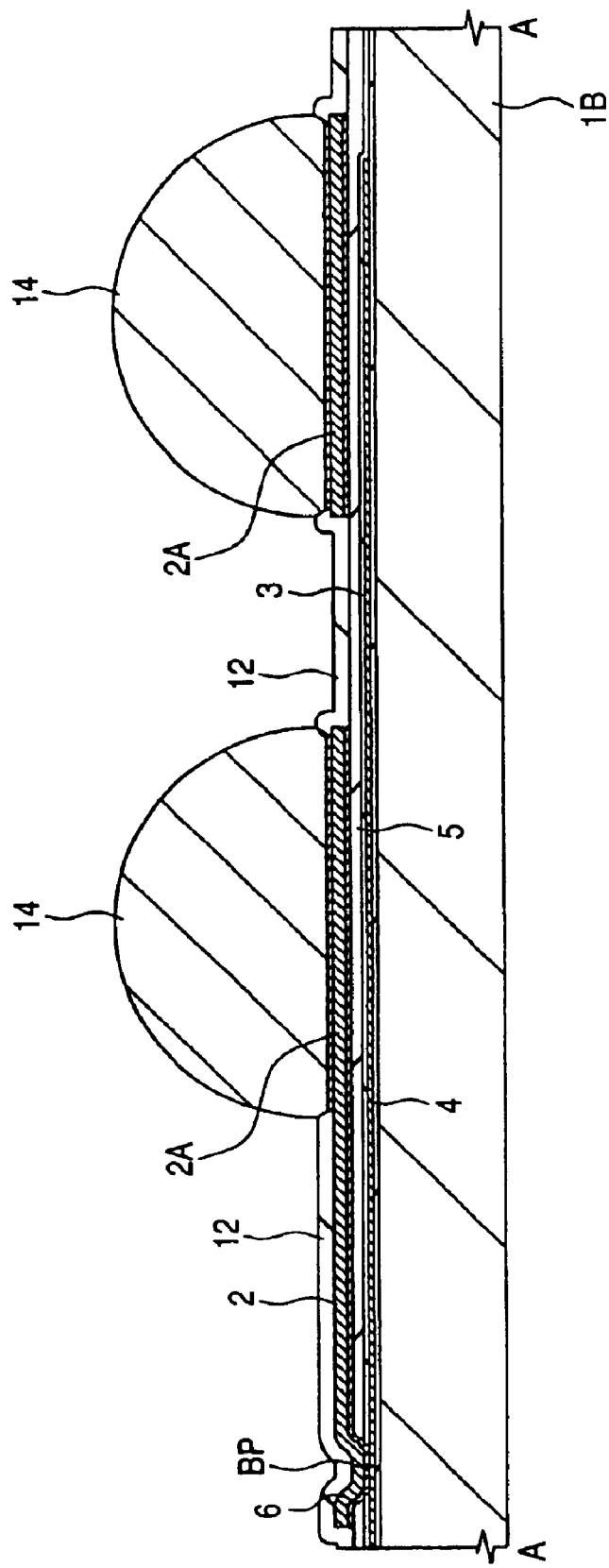
FIG. 4 is a cross-sectional view taken along a line A—A of FIG. 3.

FIG. 1 is a perspective view illustrating the completed state of a CSP which is a semiconductor integrated circuit device according to this Embodiment 1 formed using a wafer process, that is, so-called wafer level CSP (which will hereinafter be called "WL-CSP") which is a system of completing a packaging step at a wafer level; FIG. 2 is a perspective view illustrating relocating wiring (relocating wiring layer) and a bonding pad of the WL-CSP; and FIG. 3 is an enlarged fragmentary plan view of the WL-CSP; and FIG. 4 is a cross-sectional view taken along a line A—A of FIG. 3.

The WL-CSP of Embodiment 1 illustrated in FIGS. 1 to 4 has, on the main surface of a semiconductor chip (which will hereinafter be called "chip", simply) 1B, for example, having an outside dimension of 8.7 mm in long side, 5.7 mm in short side and about 725 $\mu$m in thickness and made of single crystal silicon, a plurality of solder bumps 14 and the uppermost protective film 12 for insulating between these plurality of solder bumps 14. Over the main surface of the chip 1B, DRAM (Dynamic Random Access Memory) is formed, though it is not illustrated.

At the central part of the main surface of the chip 1B, a plurality of bonding pads (electrodes) BP constituted of a portion of the uppermost interconnect (first wiring) 4 are arranged in 4 rows. The upper part of the uppermost interconnect 4, except the upper part of the bonding pads BP, is covered with a surface protective (passivation) film 3. Over the surface protective film 3, a relocating wiring layer (second wiring) 2 is formed via a photosensitive polyimide resin film (insulating layer) 5 which is an organic passivation film. The upper part of the relocating wiring layer 2, except the upper part of the bump land 2A existing at one end thereof is covered with the uppermost protective film 12.

The relocating wiring layer 2 is electrically connected, at the other end thereof, to the bonding pad BP via an opening 6 formed in the photosensitive polyimide resin film 5. Over the bump land 2A which is one end of the relocating wiring layer 2, solder bumps 14 are formed to constitute external connection terminals of the WL-CSP. As described later, some of the external connection terminals (solder bumps 14) are disposed according to a layout which differs with the design of the product.

A manufacturing method of a WL-CSP having the constitution as described above will be described in the order of steps based on FIGS. 5 to 24.

Figure 5:
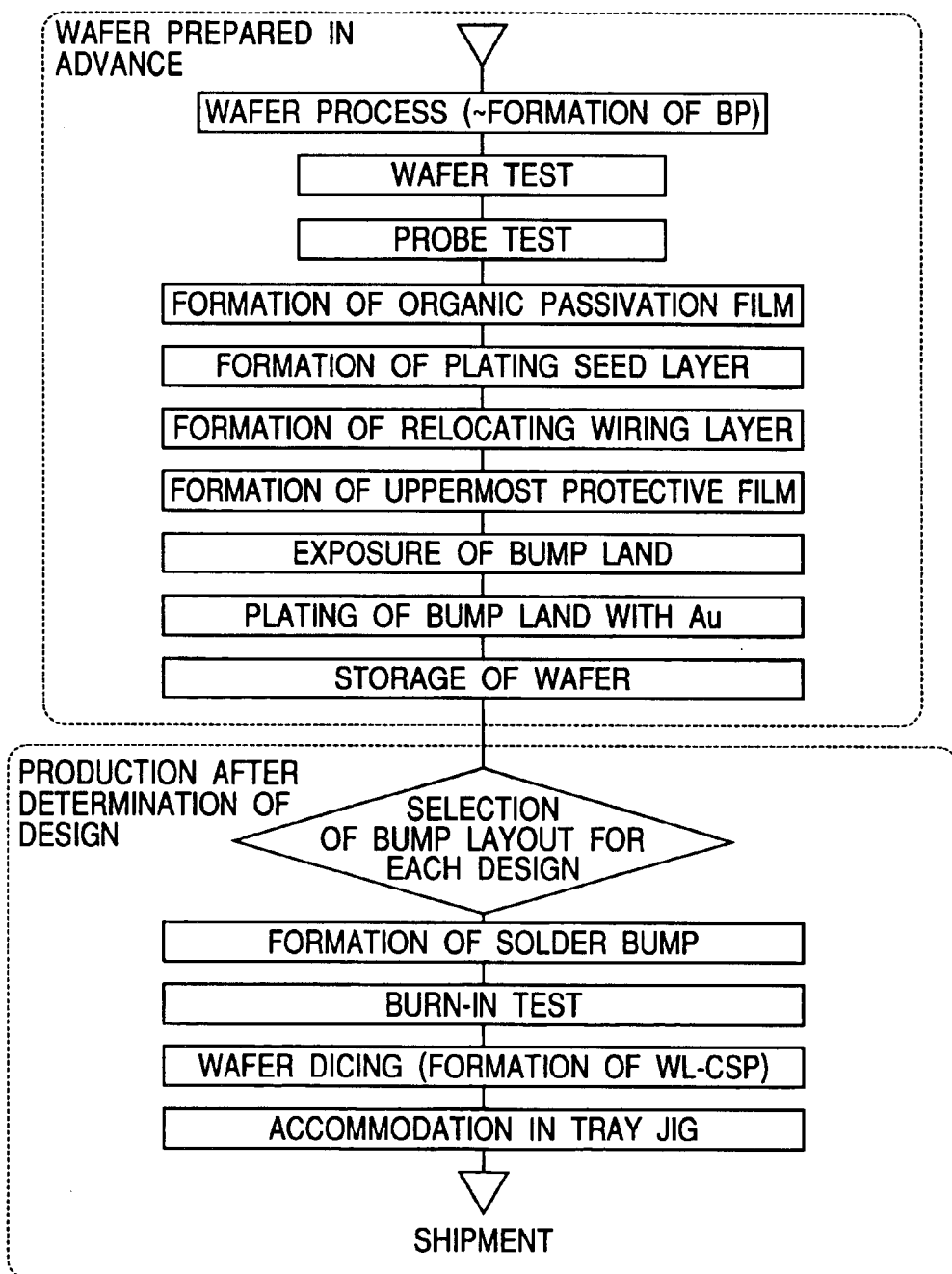
FIG. 5 is a flow chart showing a manufacturing step of the semiconductor integrated circuit device according to the one embodiment of the present invention.

As is apparent from the production flow chart of FIG. 5, the manufacturing method of Embodiment 1 is as follows. First, a semiconductor wafer after completion of the formation of the relocating wiring layer 2 is stored (stocked). After determination of the design, solder bumps 14 are formed over the bump•lands 2A in accordance with a layout differing with the design of the product. The semiconductor wafer is then cut into individual plural chips 1B, whereby the WL-CSP as illustrated in FIGS. 1 to 4 is formed. This manufacturing method will be described more specifically along the production flow of FIG. 5.

Figure 6:
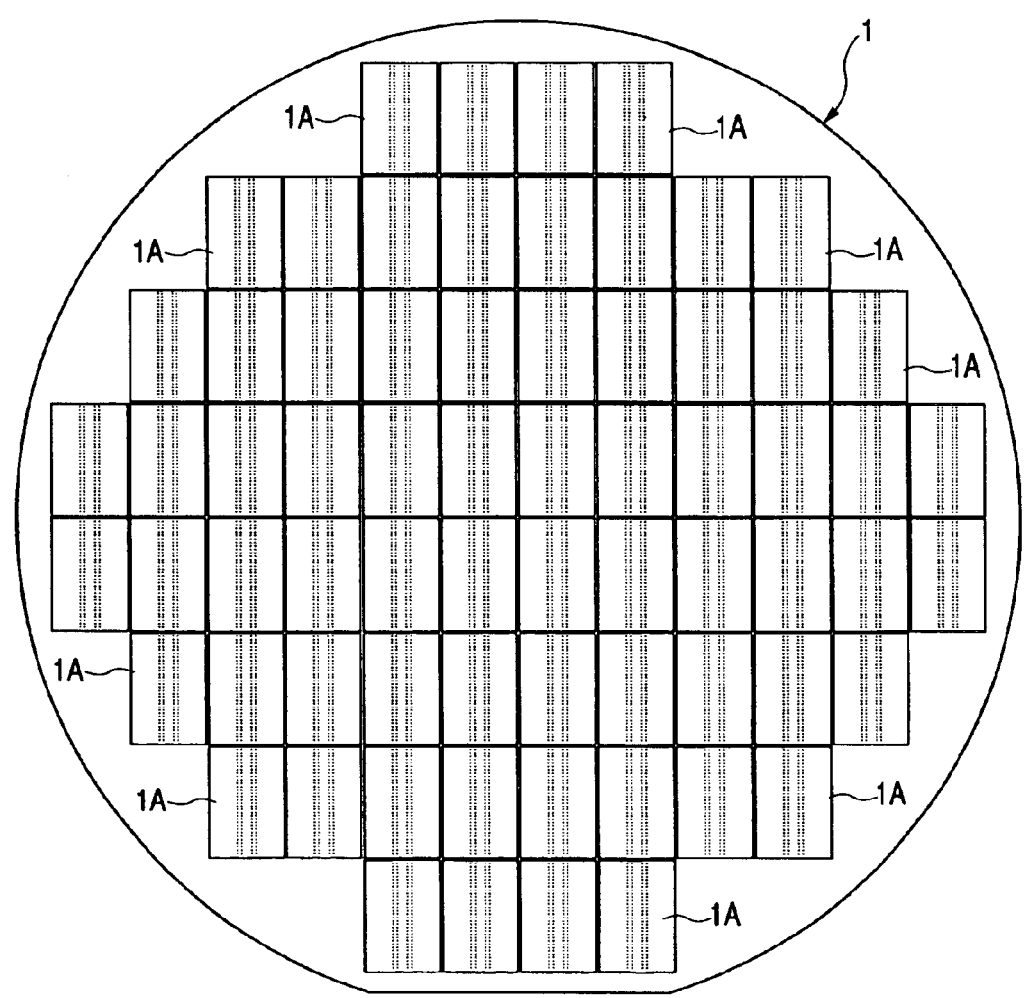
FIG. 6 is a plan view illustrating a manufacturing method of the semiconductor integrated circuit device according to the one embodiment of the present invention.
Figure 7:
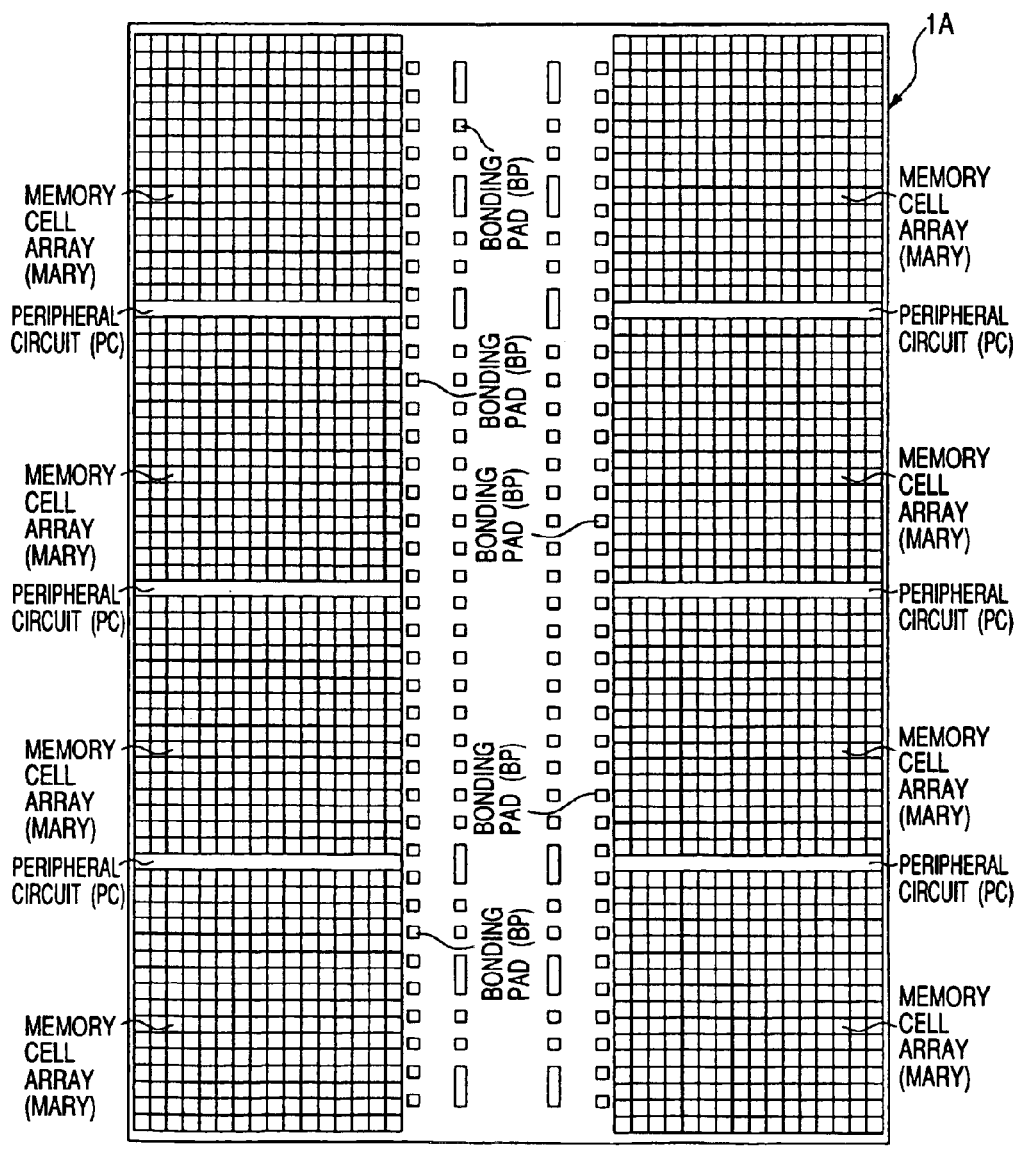
FIG. 7 is an enlarged plan view illustrating a portion of FIG. 6.
Figure 8:
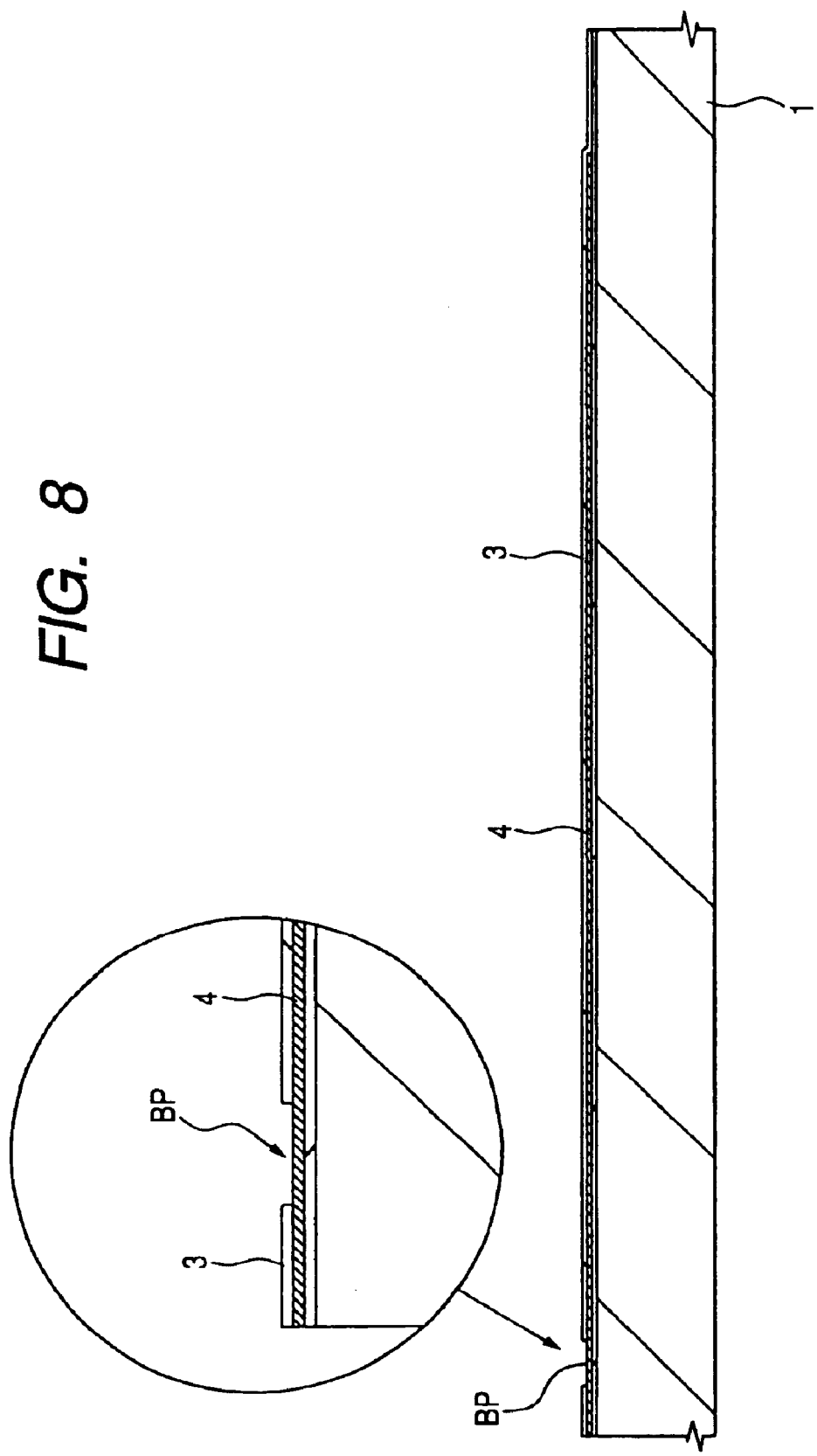
FIG. 8 is a fragmentary cross-sectional view illustrating the manufacturing method of the semiconductor integrated circuit device according to the one embodiment of the present invention.

First, a semiconductor wafer (which will hereinafter be called "wafer" simply) as illustrated in FIGS. 6 to 8 and made of single crystal silicon is prepared. FIG. 6 is an overall plan view of the wafer 1, FIG. 7 is a plan view illustrating a region (chip region 1A) corresponding to one chip of the wafer 1; and FIG. 8 is a fragmentary cross-sectional view of the chip region 1A.

As illustrated in FIG. 6, the main surface of the wafer 1 is divided into a plurality of chip regions 1A and in each chip region 1A, DRAM is formed. As illustrated in FIG. 7, the DRAM has a plurality of memory cell arrays (MARY) and peripheral circuit portions PC disposed therebetween. At the central part of the chip region 1A, a plurality of bonding pads BP are arranged in 4 rows.

Although not illustrated, each of the memory cell arrays (MARY) in the DRAM has a plurality of word lines and a plurality of bit lines which are formed to extend at right angles each other. At each of the intersects between the word lines and bit lines, a memory cell having one MISFET (Metal Insulator Semiconductor Field Effect Transistor) and one capacitor (capacitance element) is formed, and over the memory cell, two-layer metal interconnects are formed. The peripheral circuit portion PC is, on the other hand, composed of n channel type MISFET, p channel type MISFET and three-layer metal interconnects formed over them. The MISFET, capacitor and metal interconnects constituting the DRAM are formed by a known wafer process.

As illustrated in FIG. 8, the bonding pads BP disposed at the central part of the chip region 1A are each formed by etching the surface protective (passivation) film 3 covering the surface of the wafer 1, thereby forming an opening to expose therefrom a portion of the uppermost interconnect 4. The surface protective film 3 is composed of, for example, an insulating film laminate of a silicon oxide film of about 0.3 $\mu$m thick and a silicon nitride film of about 1.3 $\mu$m thick. The uppermost interconnect 4 (and bonding pad BP) is composed of, for example, an Al (aluminum) film or Al alloy film of about 0.8 $\mu$m thick. Steps up to the formation of the bonding pads BP in each chip region 1A of the wafer 1 are carried out in a known wafer process.

Figure 9:
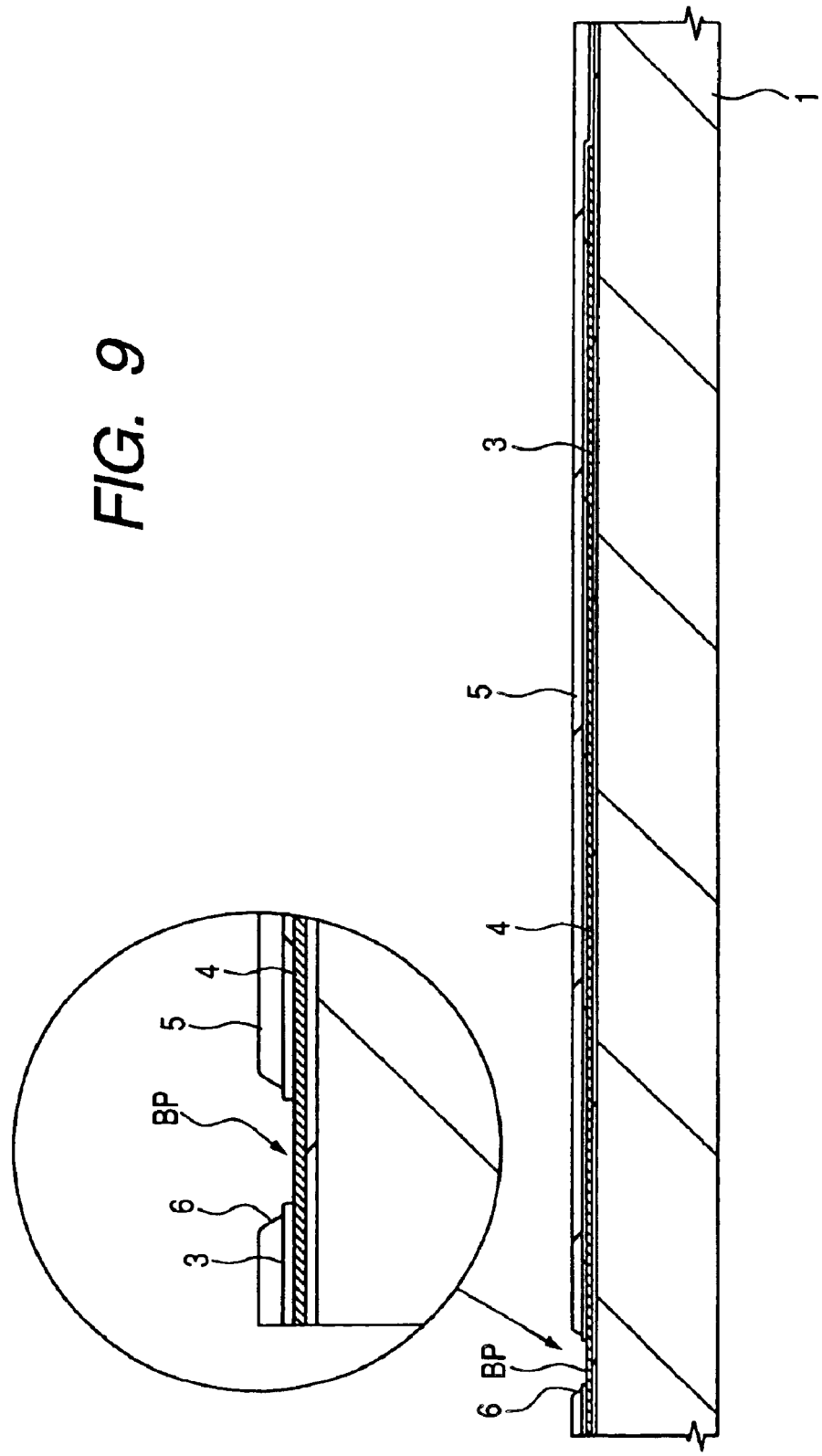
FIG. 9 is a fragmentary cross-sectional view illustrating the manufacturing method of the semiconductor integrated circuit device according to the one embodiment of the present invention.
Figure 10:
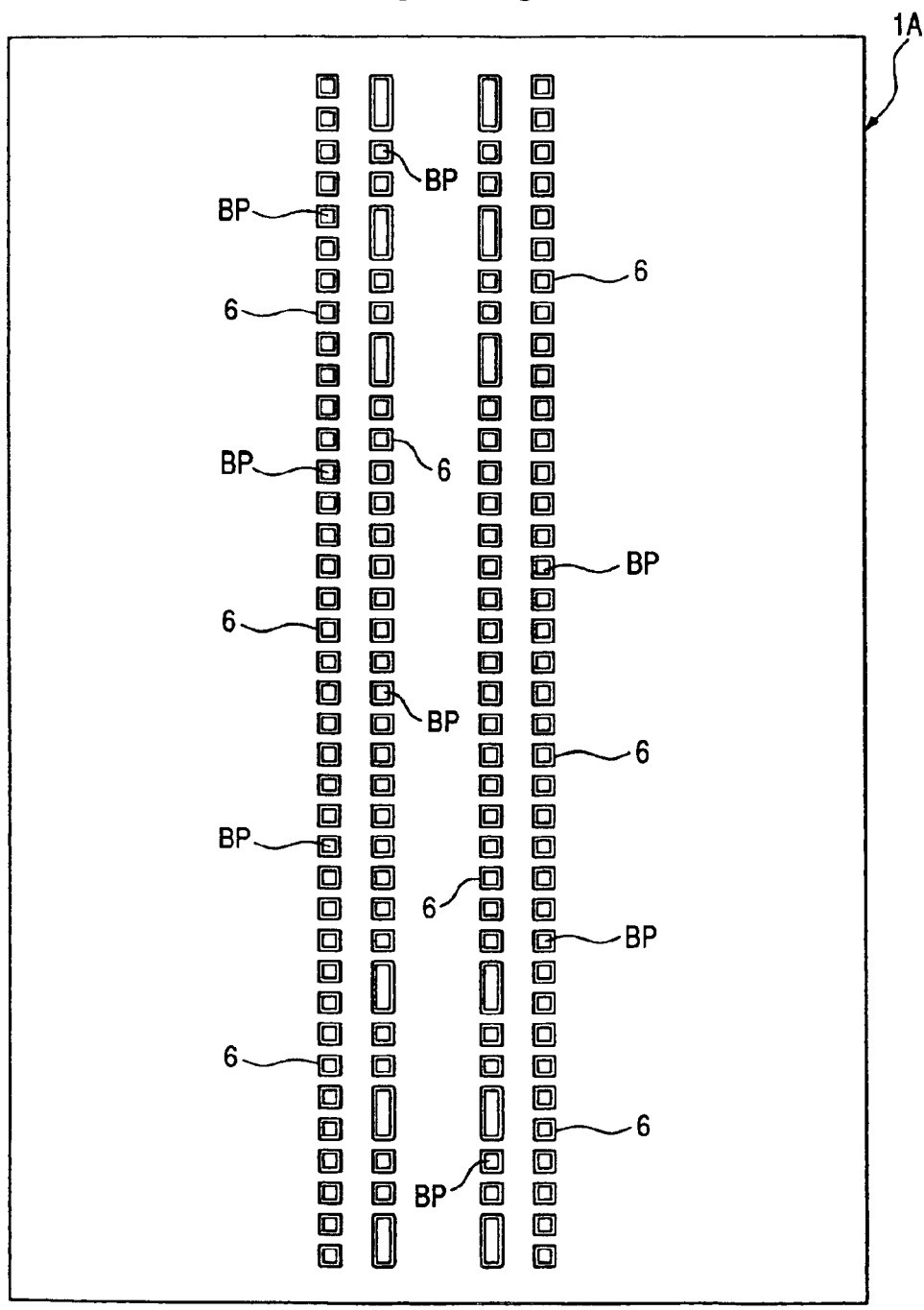
FIG. 10 is a fragmentary plan view illustrating the manufacturing method of the semiconductor integrated circuit device according to the one embodiment of the present invention.

After a test (wafer test or probe test) to judge whether each chip region 1A is good or not by applying a probe to the bonding pads BP, a relocating wiring layer 2 is formed in each chip region 1A of the wafer 1. The relocating wiring layer 2 is formed by forming, as illustrated in FIGS. 9 and 10, a photosensitive polyimide resin film 5 of about 35 $\mu$m thick over the surface protective film 3 covering the surface of the wafer 1 by the spin coating method, prebaking the film, for example, at 92° C. for 300 seconds and then making an opening 6 in the photosensitive polyimide resin film 5 over the bonding pads BP. The opening 6 is made by exposing and baking (for example, at 112° C. for 60 seconds) the photosensitive polyimide resin film 5 in a region except the upper portion of the bonding pads BP, thereby semi-hardening the film and then, removing an unexposed (unhardened) portion over the bonding pads BP by development. The resulting photosensitive polyimide resin film 5 functions, together with the underlying surface protective film 3, as an interlevel insulating film for insulating the uppermost interconnect 4 from the relocating wiring layer 2.

Figure 11:
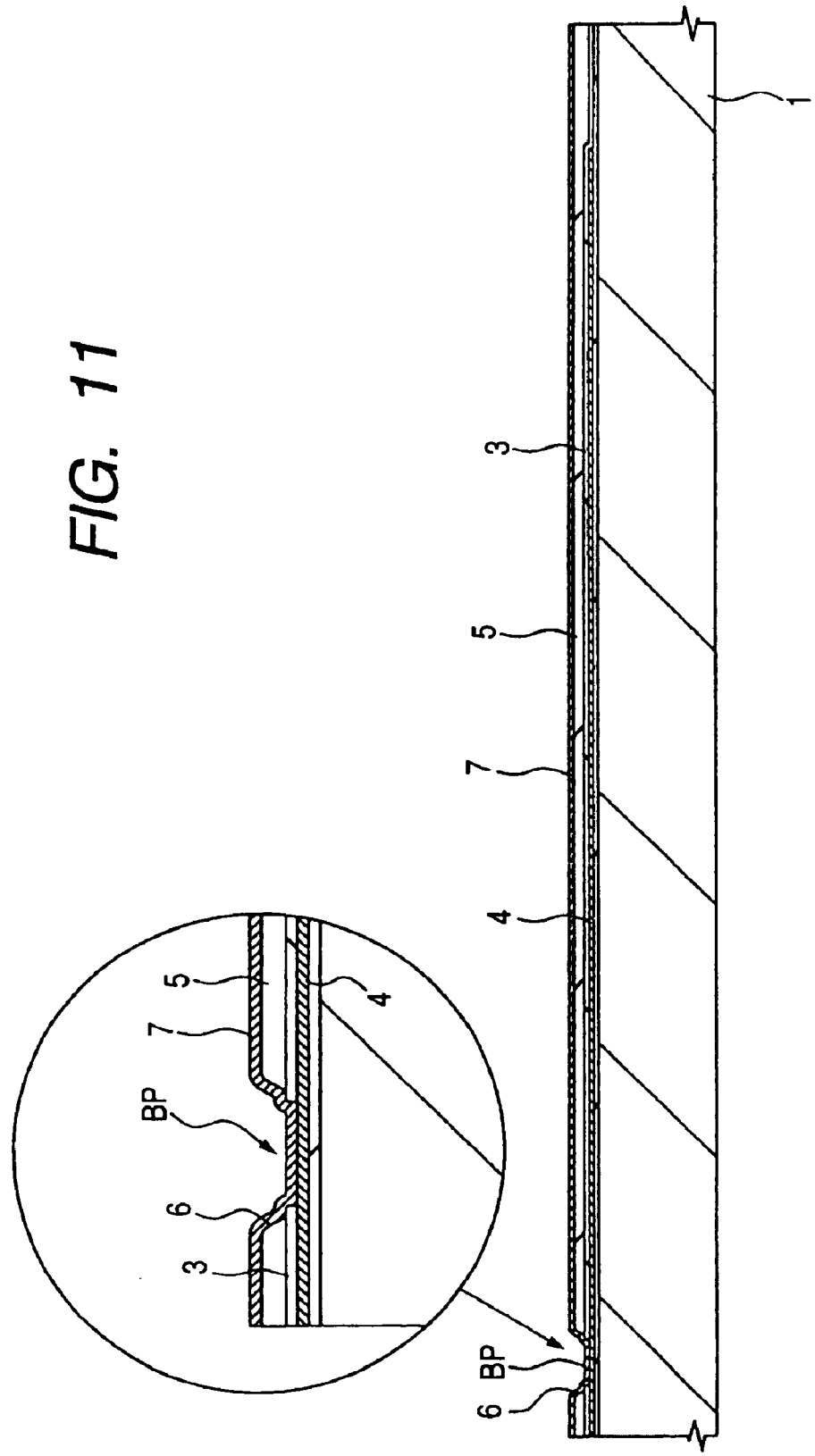
FIG. 11 is a fragmentary cross-sectional view illustrating the manufacturing method of the semiconductor integrated circuit device according to the one embodiment of the present invention.

Then, the wafer 1 is baked to completely harden the semi-hardened photosensitive polyimide resin film 5, thereby making it into a film of about 15 $\mu$m thick, followed by the formation of a plating seed layer 7, as illustrated in FIG. 11, over the photosensitive polyimide resin film 5 including the surface of the bonding pad BP exposed from the bottom of the opening 6. The plating seed layer 7 is formed, for example, of a Cr (chromium) film of about 50 nm to 150 nm thick and a Cu (copper) film of about 0.1 to 0.7 $\mu$m thick, each deposited by sputtering.

Figure 12:
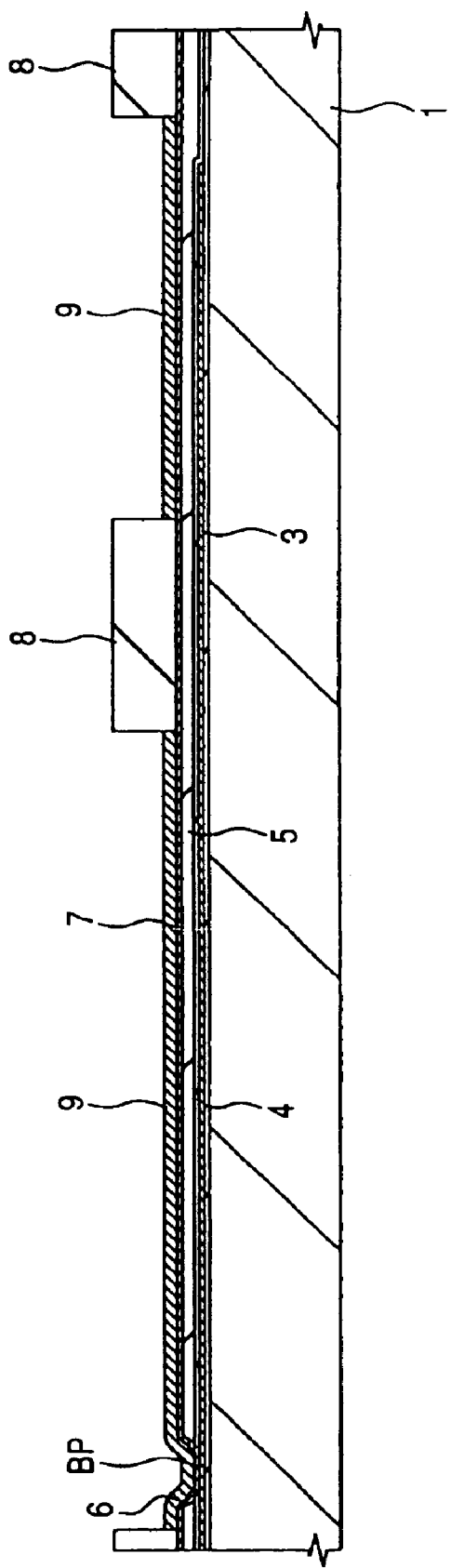
FIG. 12 is a fragmentary cross-sectional view illustrating the manufacturing method of the semiconductor integrated circuit device according to the one embodiment of the present invention.

As illustrated in FIG. 12, a photoresist film 8 opened at a relocating wiring layer formation region is formed over the plating seed layer 7, followed by the formation of a metal film 9 over the plating seed layer 7 in the relocating wiring layer formation region by electroplating. The metal film 9 is made of, for example, a Cu film of about 3 $\mu$m to 15 $\mu$m and a Ni (nickel) film of about 2 $\mu$m to 5 $\mu$m.

Figure 13:
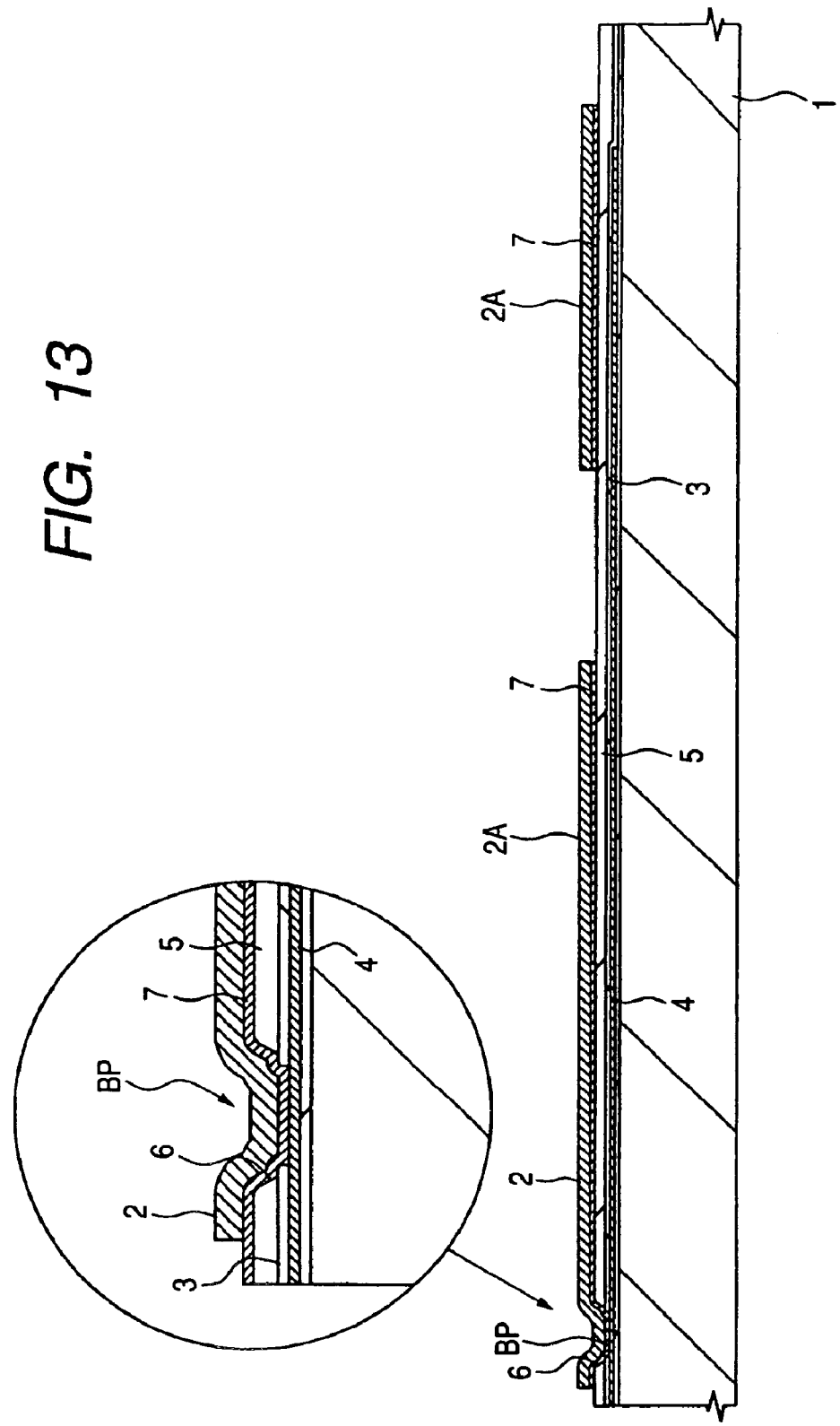
FIG. 13 is a fragmentary cross-sectional view illustrating the manufacturing method of the semiconductor integrated circuit device according to the one embodiment of the present invention.
Figure 14:
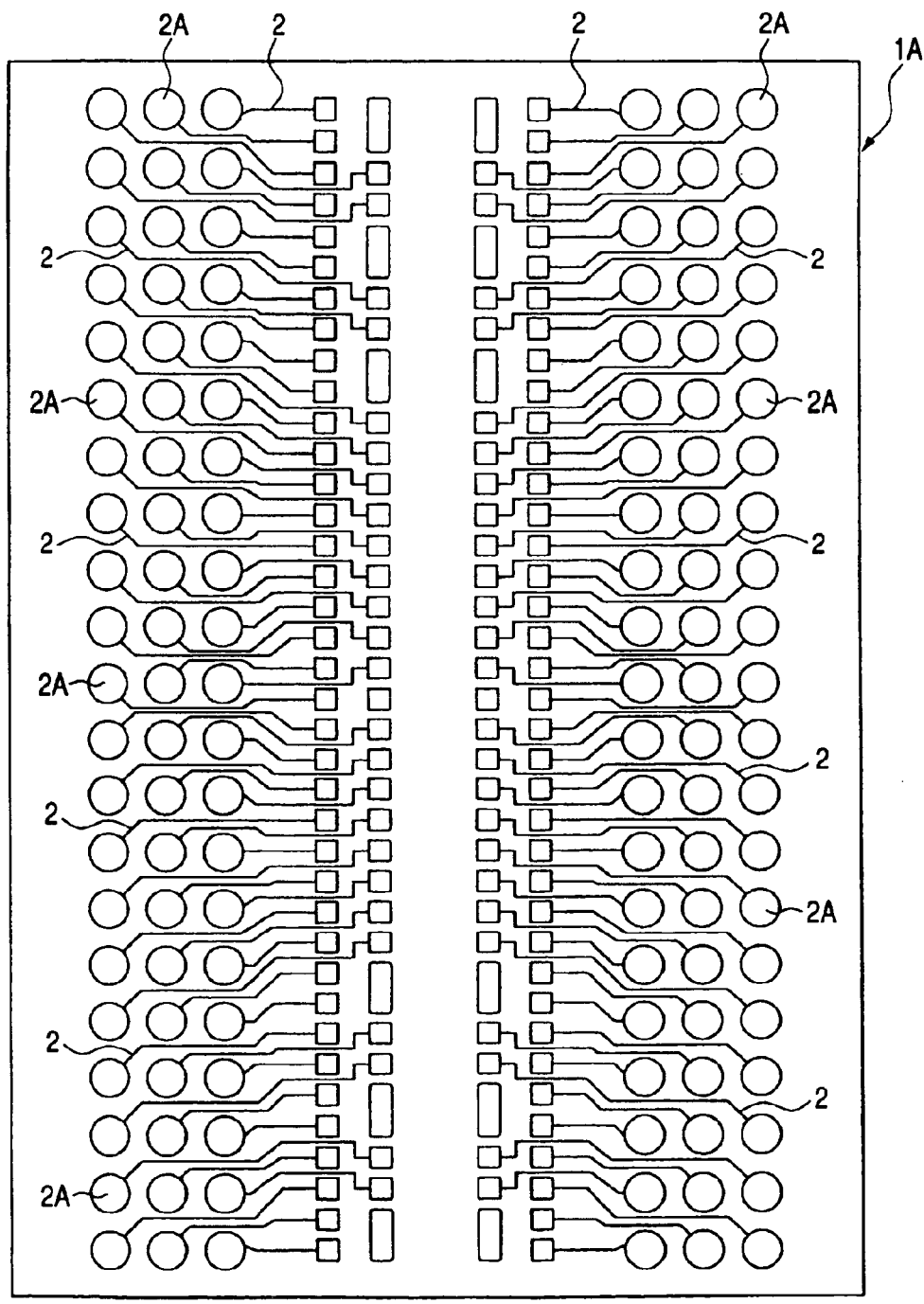
FIG. 14 is a fragmentary plan view illustrating the manufacturing method of the semiconductor integrated circuit device according to the one embodiment of the present invention.

After removal of the photoresist film 8, the underlying plating seed layer 7 is removed by wet etching, whereby a relocating wiring layer 2 made of the metal film 9 is formed as illustrated in FIGS. 13 and 14. Upon wet etching of the plating seed layer 7 below the photoresist film 8, the surface of the metal film 9 is etched simultaneously, but it does not offer any hindrance because the metal film 9 is far thicker than the plating seed layer 7.

As described above, the relocating wiring layer 2 is formed by electroplating in Embodiment 1. For the formation of the relocating wiring layer 2, use of electroplating makes thickening and miniaturization of the film easier compared with etching of the metal film deposited over the photosensitive polyimide resin film 5 deposited by sputtering.

Figure 15:
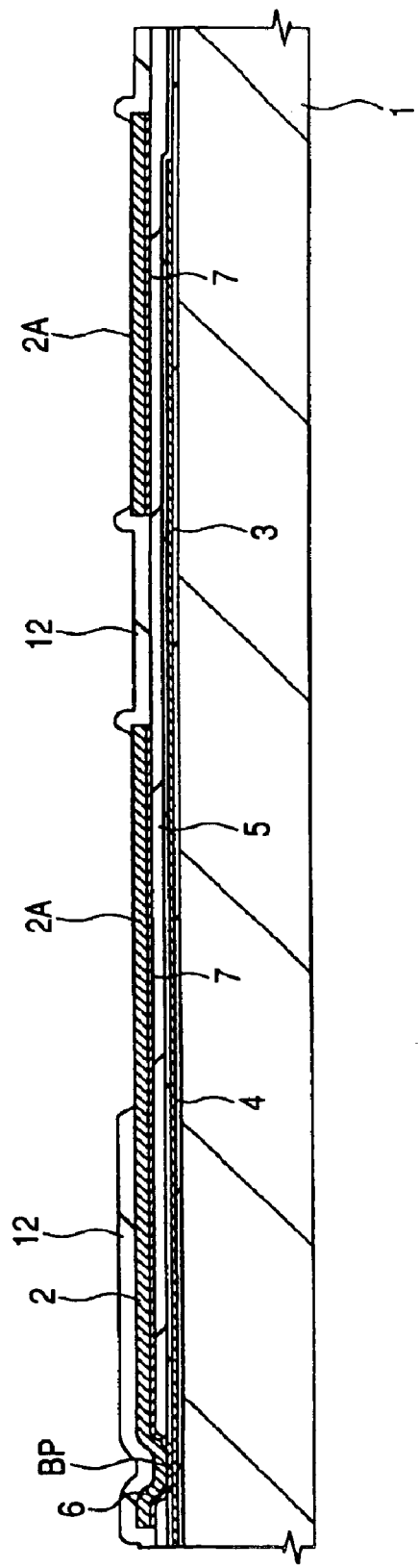
FIG. 15 is a fragmentary cross-sectional view illustrating the manufacturing method of the semiconductor integrated circuit device according to the one embodiment of the present invention.

As illustrated in FIG. 15, a bump land 2A is exposed by forming, over the relocating wiring layer 2, an uppermost protective film 12 made of a photosensitive polyimide resin film to give a thickness of 5 to 25 $\mu$m after the final hardening, and then removing the uppermost protective film 12 from the upper portion of one end (bump land 2A) of the relocating wiring layer 2. The bump land 2A is exposed by exposure and semi-hardening of the photosensitive polyimide resin film in a region other than the upper portion of the one end of the relocating wiring layer 2 and then removing the unexposed (unhardened) portion over the one end of the relocating wiring layer 2 by development. As the uppermost protective film 12, the photosensitive polyimide resin can be replaced with a solder resist or the like.

Figure 16:
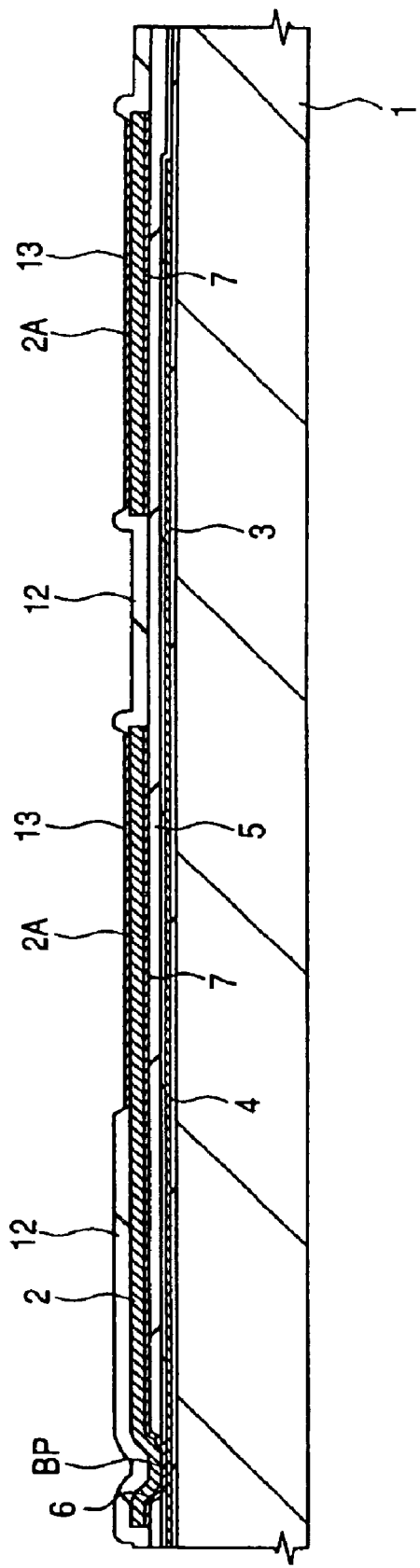
FIG. 16 is a fragmentary cross-sectional view illustrating the manufacturing method of the semiconductor integrated circuit device according to the one embodiment of the present invention.

After removal of a natural oxide film or pollutant by subjecting the surface of the bump land 2A to pretreatment such as ashing, an Au plating layer 13 of about 20 nm to 100 nm thick is formed over the surface of the bump land 2A by electroless plating as illustrated in FIG. 16.

The resulting wafer 1 having the Au plating layer 13 formed over the surface of the bump land 2A is stored as is until the design of the product is determined. The term "design" as used herein means a specification different in bit (word) constitution, for example, ×32 or ×64, or operation mode such as DDR (Double Data Rate) or Synchronous.

In the manufacturing method of this Embodiment 1, a large number of the wafers 1 each having the Au plating layer 13 formed over the surface of the bump land 2A are stored by each lot (several tens of wafers/lot) in advance and after determination of its design and production amount, a necessary lot is taken out and external connection terminals (solder bumps 14) having a layout in accordance with the design is formed on each wafer of the lot. In the case of limited production of diversified products or prototype production, the necessary number of the wafers are taken out from a lot and external connection terminals (solder bumps 14) are formed to have a layout in accordance with the design.

Figure 17:
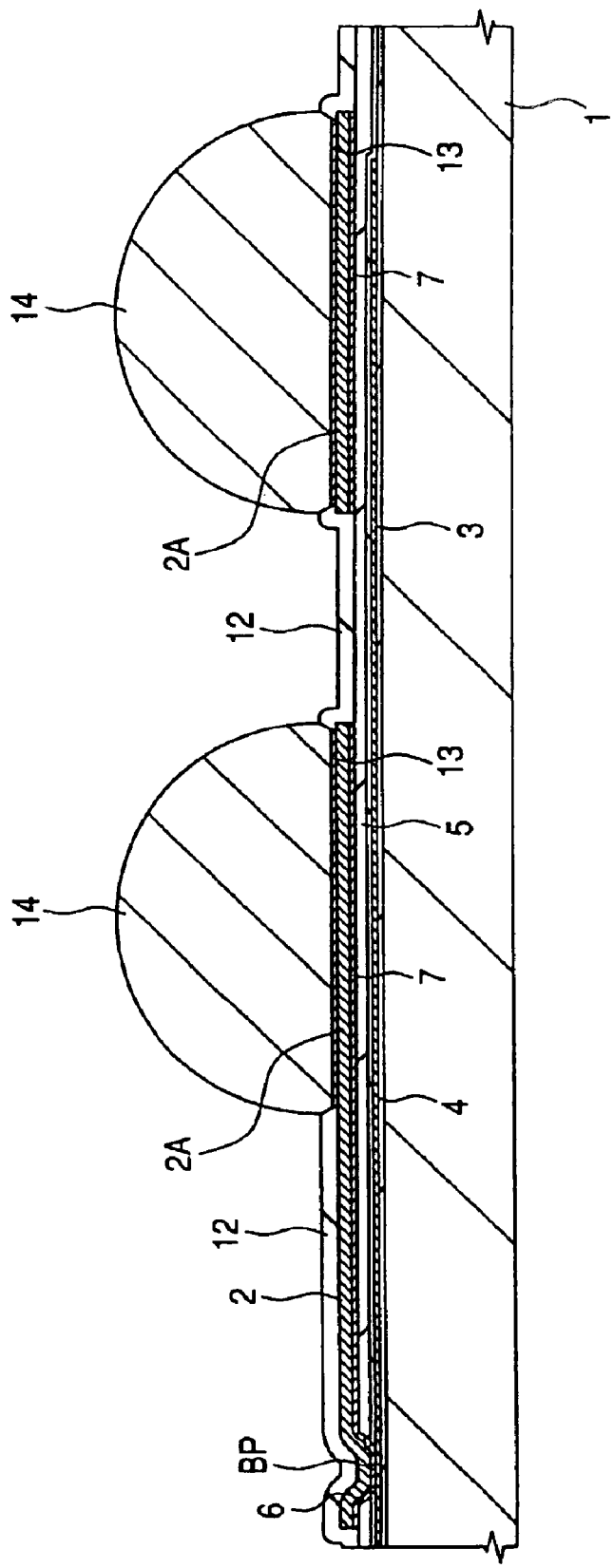
FIG. 17 is a fragmentary cross-sectional view illustrating the manufacturing method of the semiconductor integrated circuit device according to the one embodiment of the present invention.

FIG. 17 is a view illustrating the solder bumps 14 connected onto the bump lands 2A. The solder bumps 14 are each made of, for example, a solder free of Pb (lead) (melting temperature: 220 to 230° C.) composed of 98.5% of Sn (tin), 1% of Ag (silver) and 0.5% of Cu and has a diameter of about 200 to 450 $\mu$m. Prior to the formation of the solder bumps 14 over the bump lands 2A, the back surface of the wafer 1 may be polished to thin the wafer 1 further.

The solder bumps 14 are formed over the bump lands 2A, for example, by overlapping, in alignment over the wafer 1, a solder print mask 31 having openings 30 formed therein to correspond them to the positions of the bump lands 2A, and printing solder pastes 14A over the surface of the bump lands 2A by a squeegee 32.

Figure 19:
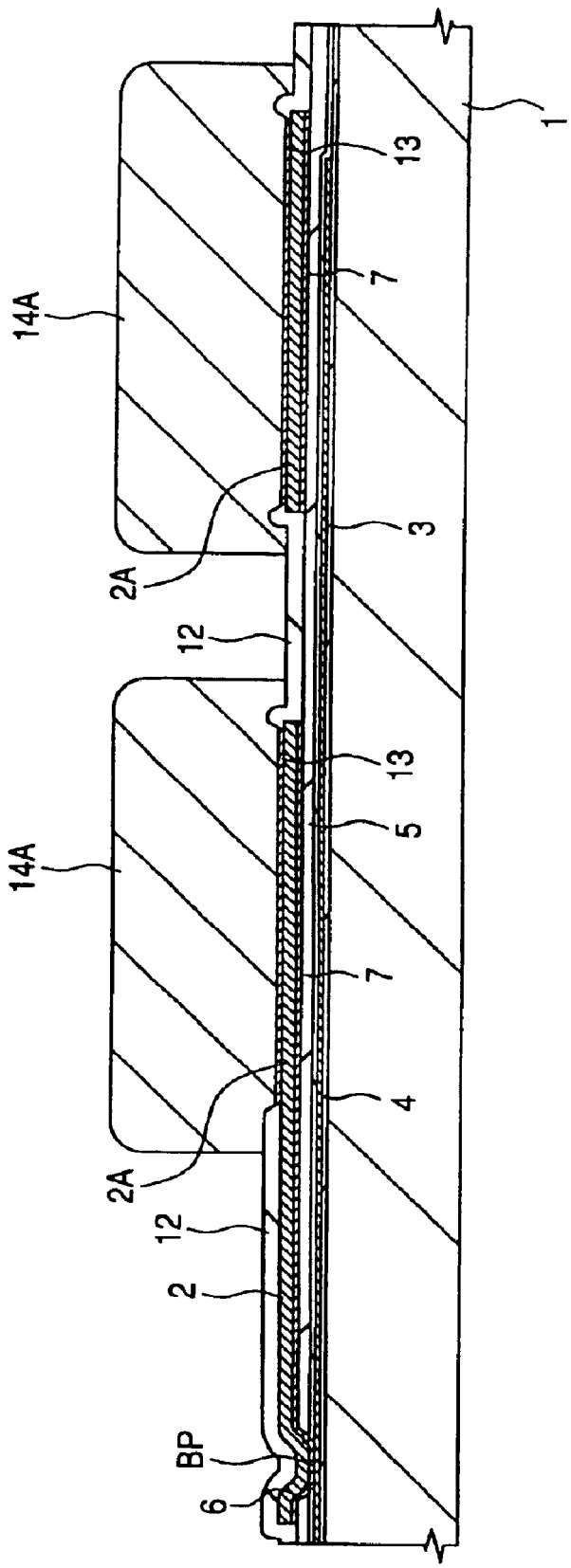
FIG. 19 is a fragmentary cross-sectional view illustrating the manufacturing method of the semiconductor integrated circuit device according to the one embodiment of the present invention.

As illustrated in FIG. 19, the solder pastes 14A just after printing are each almost flat in a region wider than the bump land 2A. By heating the wafer 1 at about 240° C. to cause reflow of the solder pastes 14A, solder bumps 14 having a spherical shape as illustrated in FIG. 17 can be formed. The solder bumps 14 may be formed by plating instead of the above-described printing method. Alternatively, a solder ball which has been formed to have a spherical shape in advance is fed onto the bump land 2A, followed by heating of the wafer 1 to cause reflow of the solder ball to make it an external connection terminal.

A description will next be made of a method of switching the design by changing the layout of external connection terminals (solder bumps 14) based on FIGS. 20 to 22.

Figure 20:
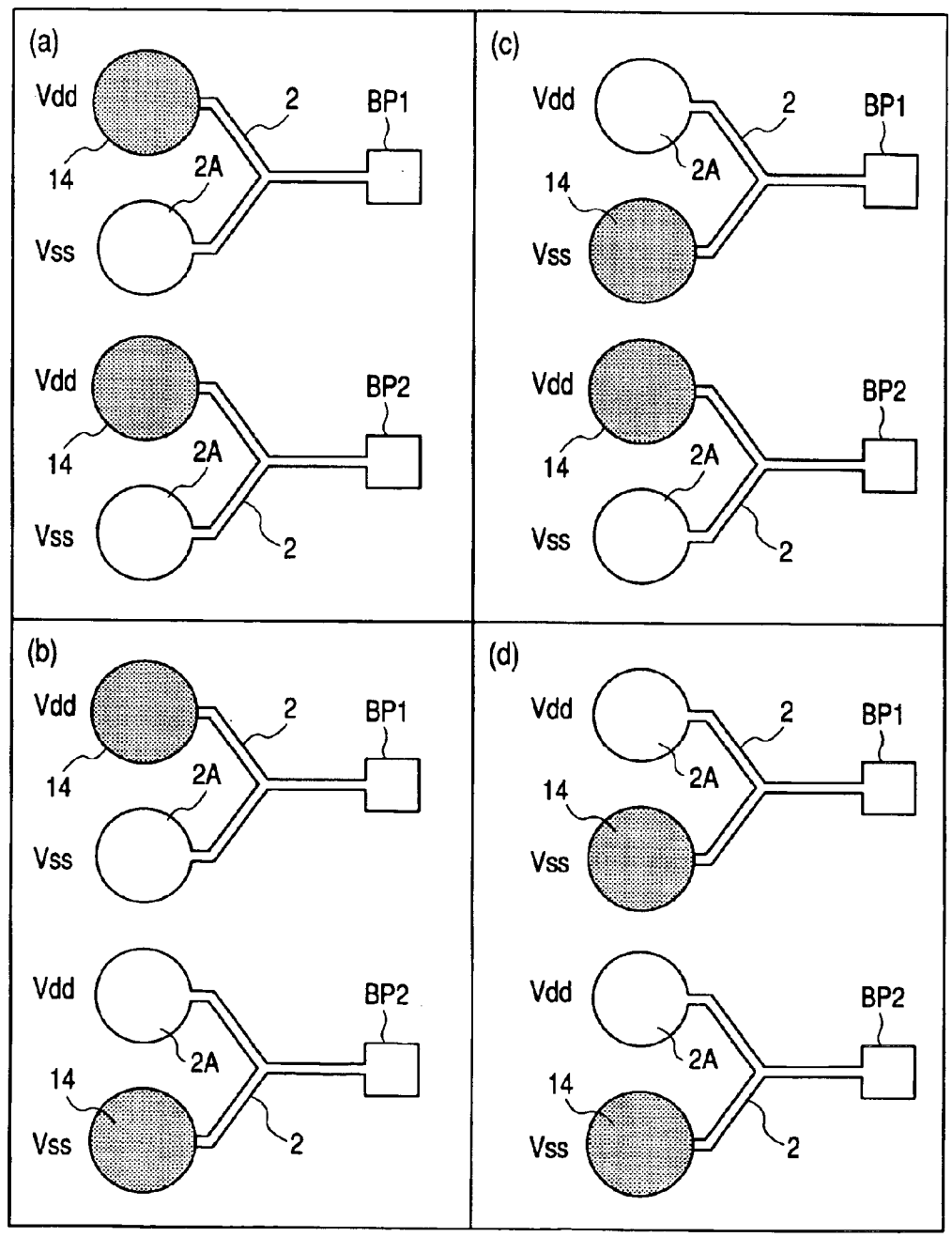
FIGS. 20(a) to (d) are each a plan view illustrating the connection state of a function-selecting bump land and an external connection terminal.

FIGS. 20(*a*) to (*d*) each illustrates the connection state of the solder bump 14 for application of power supply voltage (Vdd) and solder bump 14 for application of referential voltage (Vss) with the bonding pads BP1 and BP2. In the diagrams (a) and (b), the solder bump 14 for application of power supply voltage (Vdd) is connected to the bonding pad BP1, while in the diagrams (c) and (d), the solder bump 14 for application of reference voltage (Vss) is connected to BP1. In the diagrams (a) and (c), the solder bump 14 for application of power supply voltage (Vdd) is connected to the bonding pad BP2, while in the diagrams (b) and (d), the solder bump 14 for application of reference voltage (Vss) is connected to the bonding pad BP2.

Figure 21:
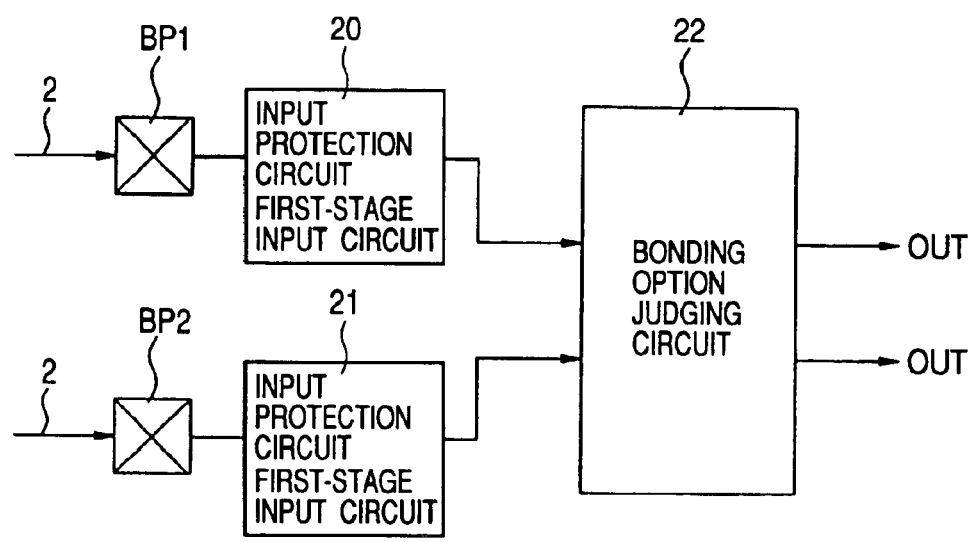
FIG. 21 is a block diagram illustrating an input circuit connected to a function selecting bonding pad.

As illustrated in FIG. 21, a bonding option judging circuit 22 is connected to the bonding pads BP1 and BP2 via an input protection circuit and first-stage input circuit 20,21. The bonding option judging circuit 22 controls an internal signal to be output to a subsequent-stage circuit (not illustrated) to a high level or low level, depending on whether the input voltage fed from the bonding pads BP1, BP2 is high level (Vdd) or low level (Vss). This internal signal is utilized for the control of an address buffer, predecoder or main amplifier, whereby the bit constitution or operation mode is determined.

For example, when a power supply voltage (Vdd) is supplied to the bonding pad BP1, the bit constitution becomes ×32, while when a referential voltage (Vss) is supplied, the bit constitution becomes ×64. When a power supply voltage (Vdd) is supplied to the bonding pad BP2, the operation mode becomes DDR (double data rate), while a referential voltage (Vss) is applied, it becomes synchronous. Accordingly, in the case of FIG. 20(*a*), a DRAM having ×32 bit constitution and a DDR mode can be realized, while in the case of (b), DRAM having a ×32 bit constitution and a synchronous mode can be realized. In the case of (c) a DRAM having a ×64 bit constitution and DDR mode can be realized, while in the case of (d), a DRAM having a ×64 bit constitution and a synchronous mode can be realized. Such a relationship is illustrated in FIG. 22.

Figure 18:
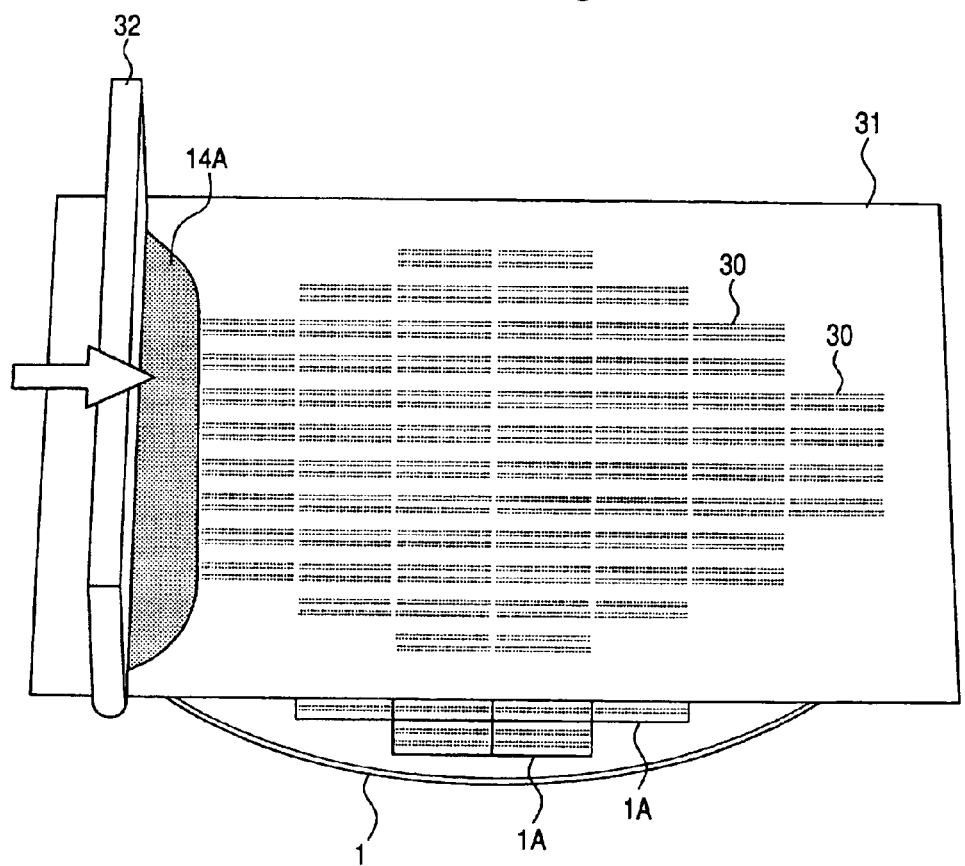
FIG. 18 is a perspective view illustrating the manufacturing method of the semiconductor integrated circuit device according to the one embodiment of the present invention.

In order to alter the layout of the external connection terminals (solder bumps 14) depending on the design, it is only necessary to prepare the necessary number of solder print masks 31 varied in the pattern of the openings 30 as illustrated in FIG. 23(*a*) or (*b*) and to print solder pastes 14A over the bump lands 2A by the method as illustrated in FIG. 18.

Figure 24:
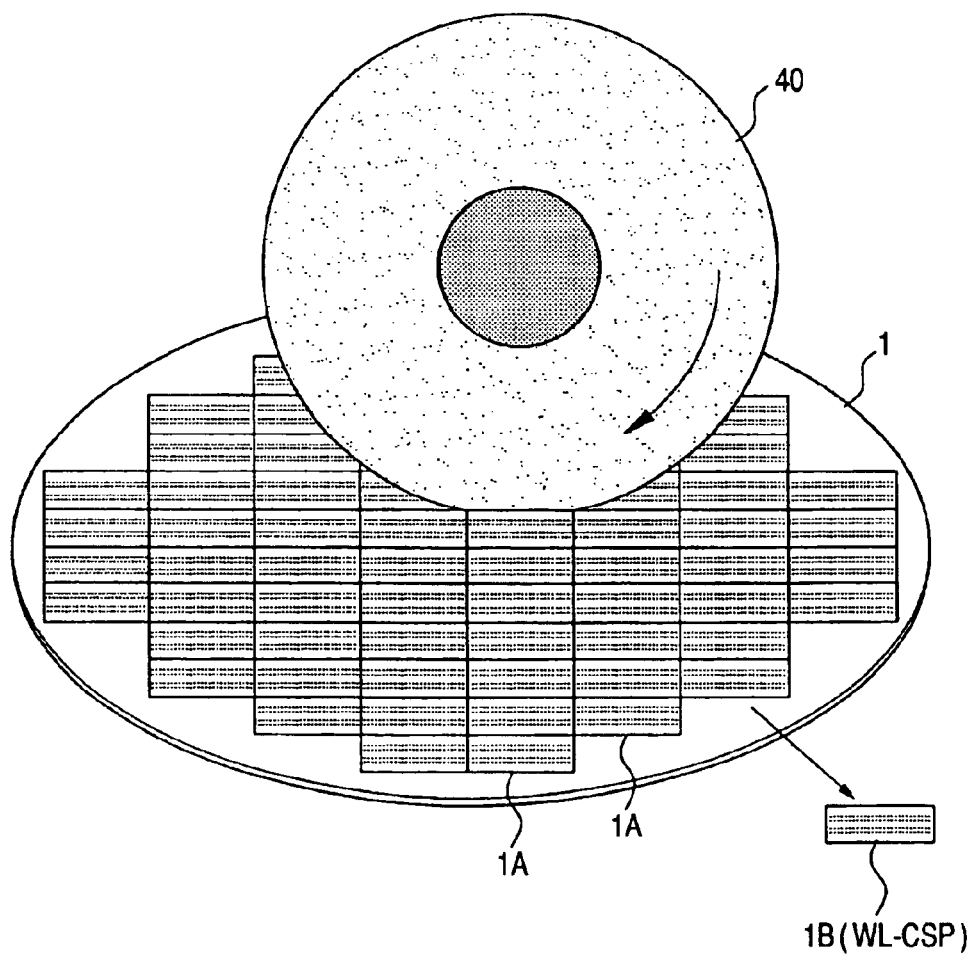
FIG. 24 is a perspective view illustrating the manufacturing method of the semiconductor integrated circuit device according to the one embodiment of the present invention.

After carrying out the burn-in test of the wafer 1 to judge whether the chip region 1A is good or not, chip regions 1A of the wafer 1 are cut and separated into each chip 1B by a dicing blade 40 as illustrated in FIG. 24, whereby the WL-CSP as illustrated in FIGS. 1 to 4 are completed. The WL-CSP thus formed is, after various final tests on performance, appearance and the like as needed, shipped in a tray jig.

Figure 25:
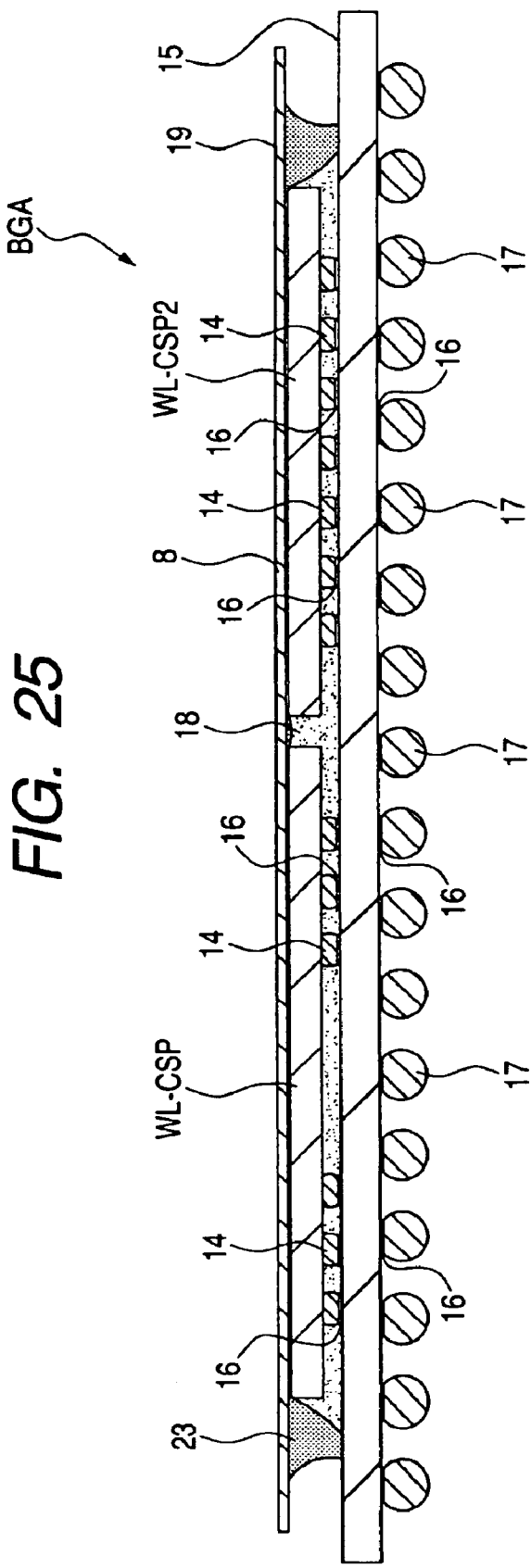
FIG. 25 is a cross-sectional view of BGA using the semiconductor integrated circuit device according to the one embodiment of the present invention.

FIG. 25 illustrates a BGA (Ball Grid Array) obtained by face-down bonding, over the main surface of a package substrate 15, of the WL-CSP of Embodiment 1 having a DRAM formed thereon and another chip (WL-CSP2) having, for example, a microcomputer formed thereon.

The package substrate 15 is made of a general-purpose printed circuit board obtained by forming a Cu interconnect over a substrate made of a glass epoxy resin or BT (Bismaleimide Triazine) resin and to an electrode pad 16 on the back surface (lower surface) of the substrate, a plurality of solder bumps 17 constituting external connection terminals of the BGA are connected. Two chips (WL-CSP and WL-CSP2) are packaged by the flip chip system in which each of a plurality of solder bumps 14 formed on the main surface of the chips are connected to the corresponding electrode pads 16 over the main surface of the package substrate 15.

The space between the chip (WL-CSP, WL-CSP2) and the package substrate 15 is filled with an underfill resin 18 made of, for example, an epoxy resin added with a silicon filler. The underfill resin 18 has both a function of relaxing a stress to be applied to the solder bumps 14, which are connecting portions of the chips (WL-CSP, WL-CSP2) and the package substrate 15, owing to a difference in thermal expansion coefficient therebetween, and a function of preventing water penetration into the main surface of the chips (WL-CSP, WL-CSP2). On the back surface (upper surface) of the chips (WL-CSP, WL-CSP2), a protective plate 19 made of a metal is adhered with an adhesive 23.

Embodiment 1 brings about such advantages as described below:

(1) A change in the layout of the solder bumps 14 facilitates switch-over of the design by wafer, making it possible to shorten the development term of a WL-CSP.

(2) A change in the layout of the solder bumps 14 facilitates selection of a plurality of functions such as bit constitution and operation mode suited for each wafer.

(3) Accordingly, it is possible to meet the user's request promptly.

(4) A stock can be reduced by market production.

(5) The advantages described above in (1) to (4) lead to a reduction in a production cost of a WL-CSP.

(6) Without necessity of treatment for each chip upon switch-over of the design, the development term can be shortened and a prompt response to the user's request can be carried out.

(Embodiment 2)

Figure 26:
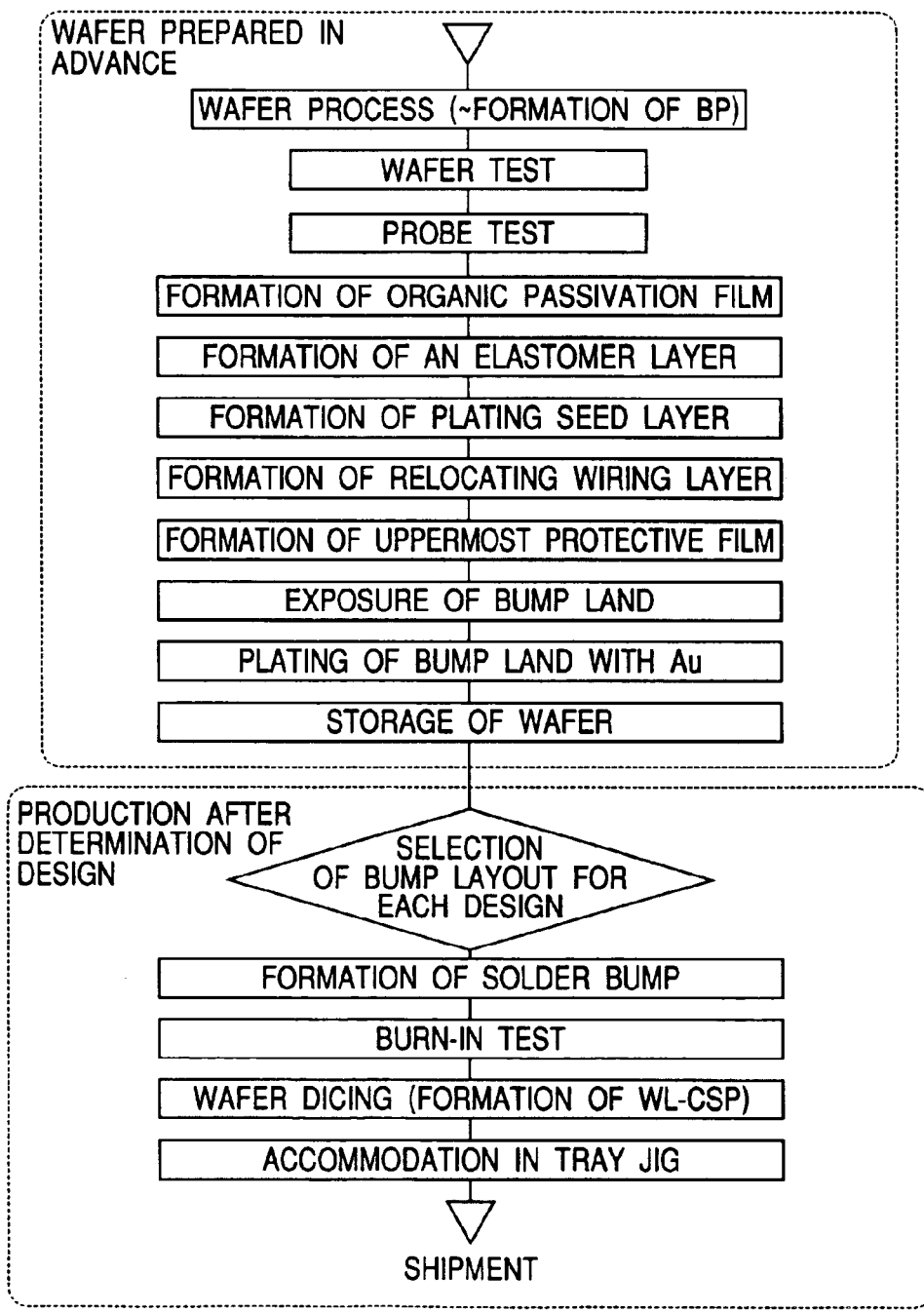
FIG. 26 is a flow chart illustrating a manufacturing step of a semiconductor integrated circuit device according to another embodiment of the present invention.
Figure 27:
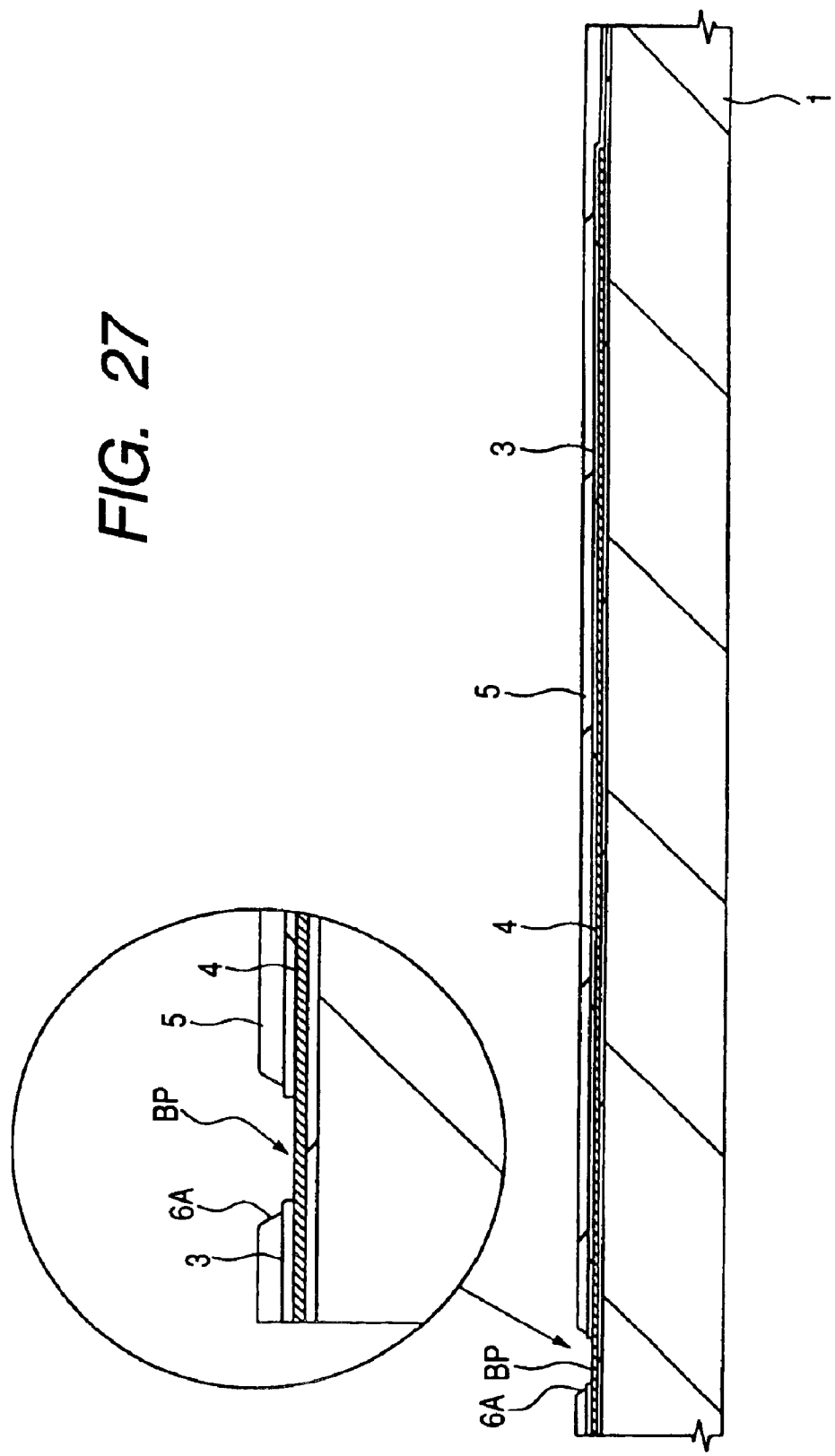
FIG. 27 is a fragmentary cross-sectional view illustrating a manufacturing method of the semiconductor integrated circuit device according to the another embodiment of the present invention.

FIG. 26 is a flow chart of a manufacturing step of a WL-CSP according to Embodiment 2; FIG. 27 is a fragmentary cross-sectional view of a semiconductor wafer, in stock, illustrated in the production flow chart of FIG. 26; and FIGS. 28 to 34 are fragmentary cross-sectional views illustrating the steps from the formation an organic passivation layer after determination of the design to the formation of a bump.

As is apparent from the production flow chart of FIG. 26, in the manufacturing method according to Embodiment 2, a WL-CSP is formed by once stocking the wafer 1 after completion of the formation of a relocating wiring layer 2 thereon; after determination of the design, forming solder bumps 14 over bump lands 2A in accordance with the layouts different in design; and then cutting the wafer into a plurality of chips 1B. Steps up to the formation of an organic passivation film (photosensitive polyimide resin film 5) are substantially similar to those of Embodiment 1. The manufacturing method will next be described specifically along with the production flow in FIG. 26.

As illustrated in FIG. 27, after formation of the photosensitive polyimide resin film 5 over the surface of the wafer 1 by spin coating method, an opening 6A is made in the photosensitive polyimide resin film 5 over the bonding pad BP in a similar manner to that employed for Embodiment 1. Steps up thereto are similar to those of Embodiment 1.

Figure 28:
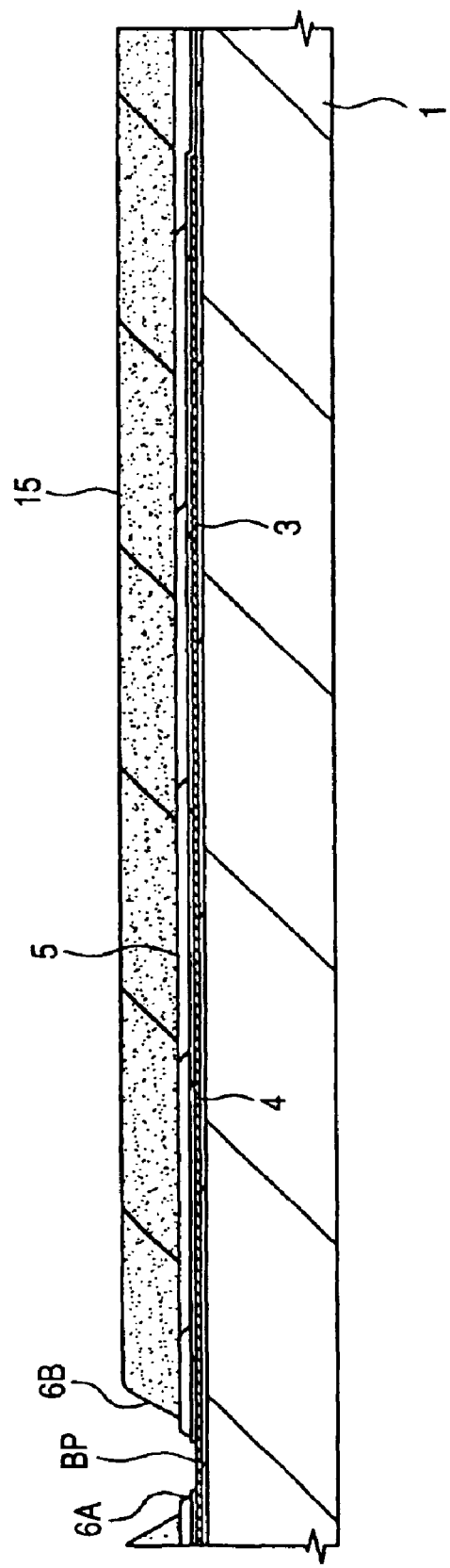
FIG. 28 is a fragmentary cross-sectional view illustrating the manufacturing method of the semiconductor integrated circuit device according to the another embodiment of the present invention.

As illustrated in FIG. 28, an elastomer layer 15 of about 75 μm thick and made of a low elasticity resin is formed over the photosensitive polyimide resin film 5 by the printing method, followed by the formation of an opening 6B in the elastomer layer 15 over the bonding pad BP. This opening 6B is formed to have a diameter greater than that of the opening 6A formed in the photosensitive polyimide resin film 5.

Figure 29:
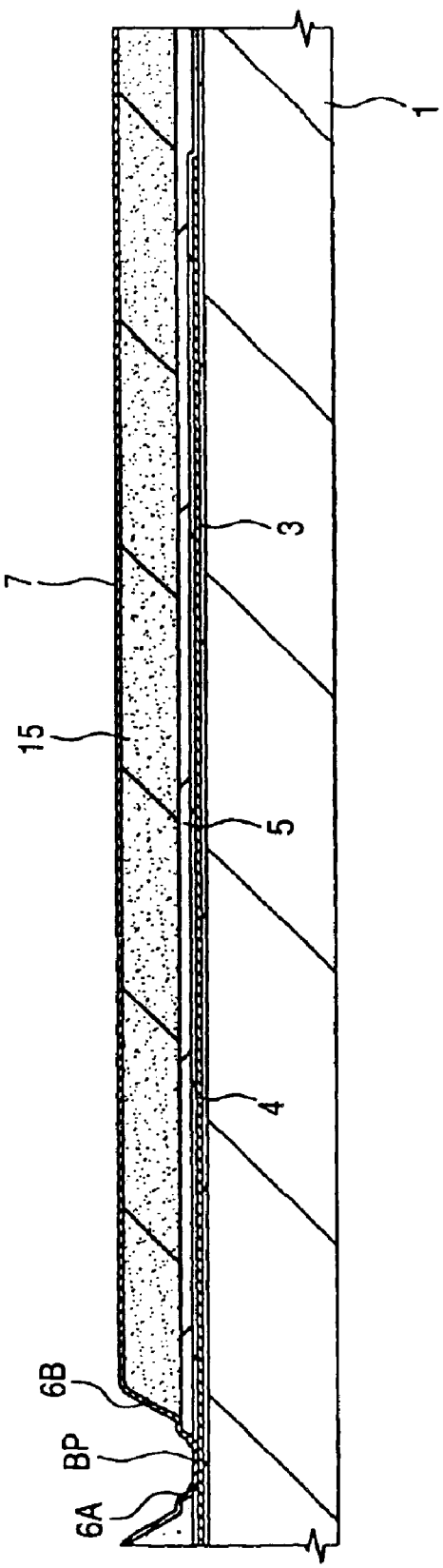
FIG. 29 is a fragmentary cross-sectional view illustrating the manufacturing method of the semiconductor integrated circuit device according to the another embodiment of the present invention.
Figure 30:
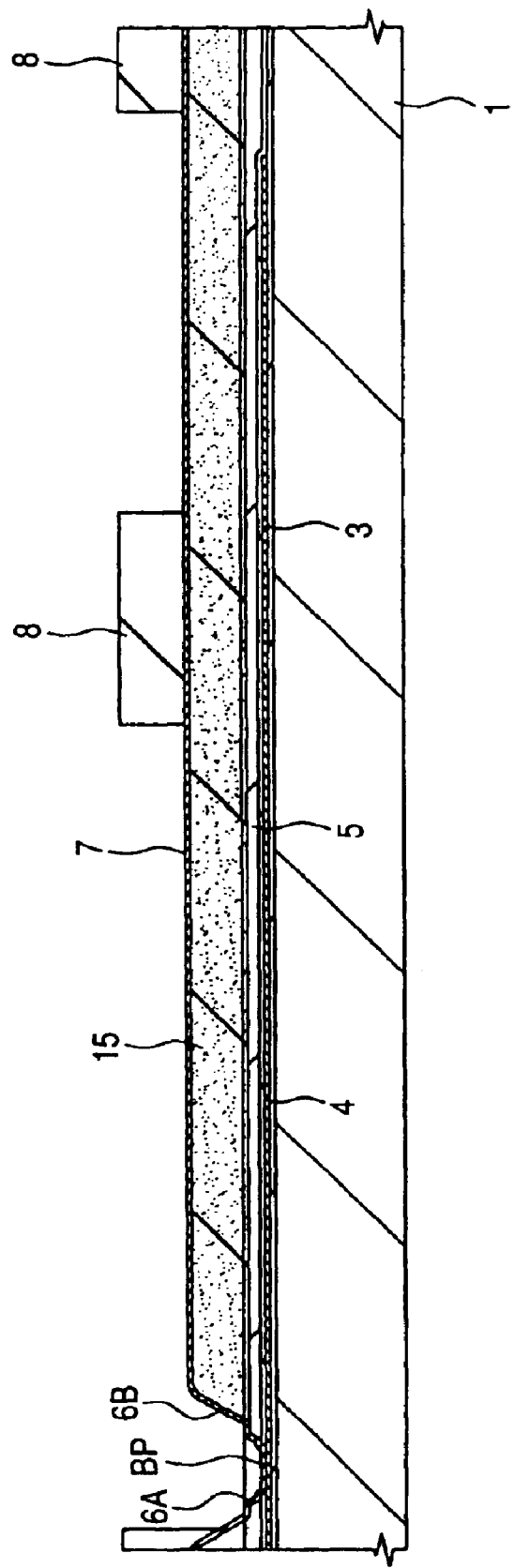
FIG. 30 is a fragmentary cross-sectional view illustrating the manufacturing method of the semiconductor integrated circuit device according to the another embodiment of the present invention.
Figure 31:
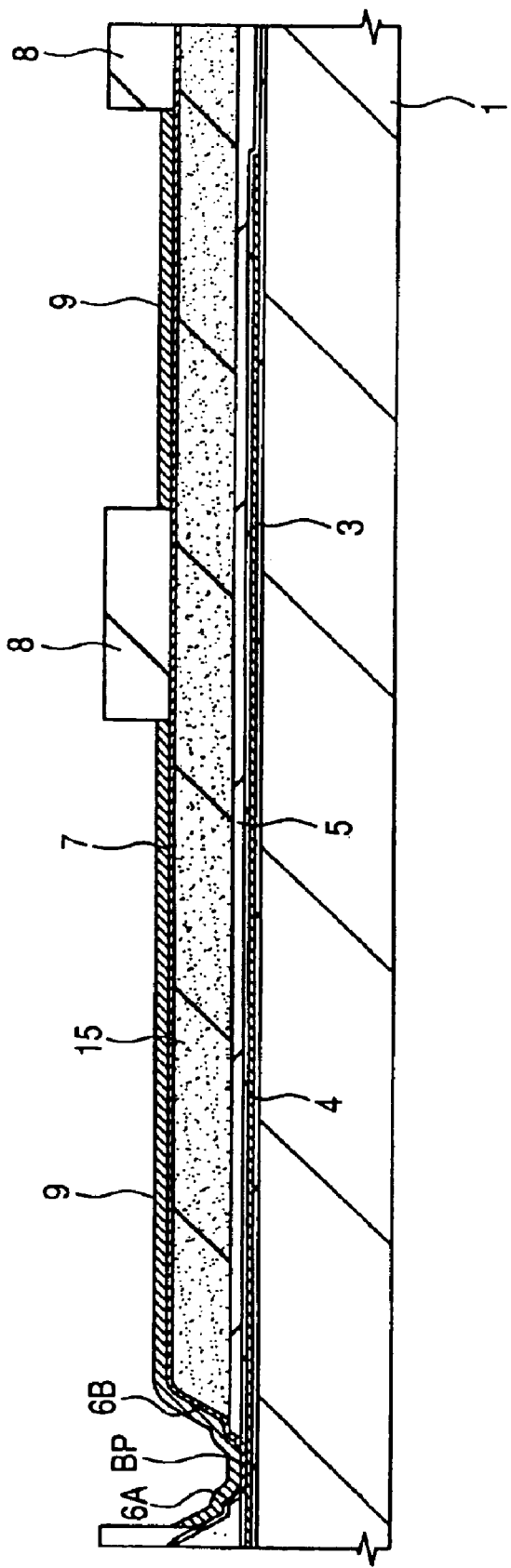
FIG. 31 is a fragmentary cross-sectional view illustrating the manufacturing method of the semiconductor integrated circuit device according to the another embodiment of the present invention.
Figure 32:
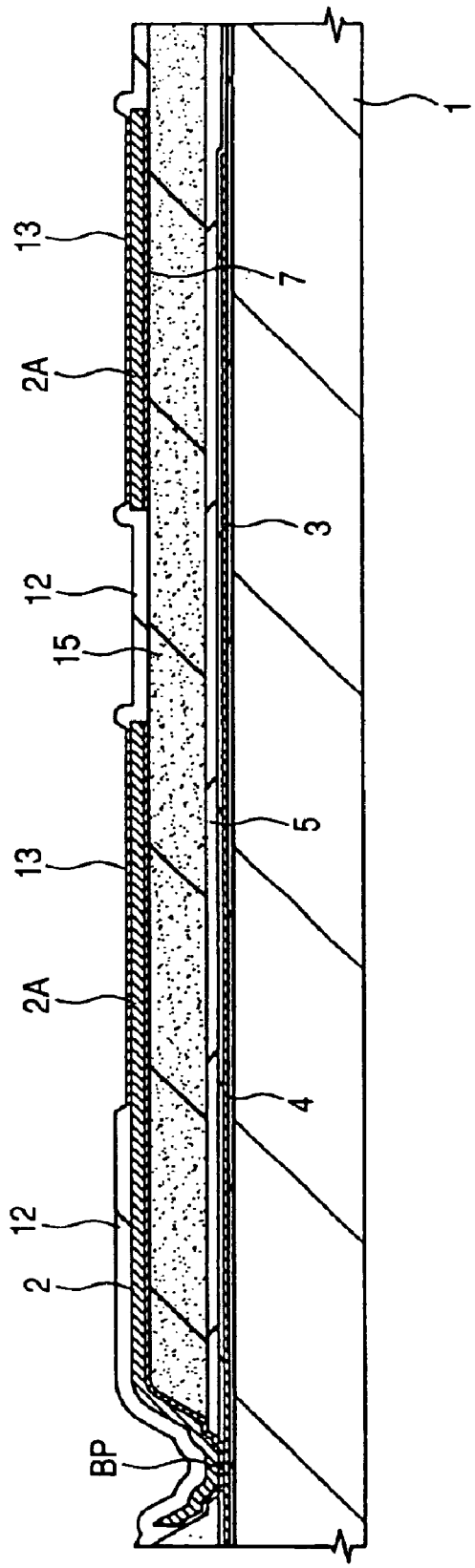
FIG. 32 is a fragmentary cross-sectional view illustrating the manufacturing method of the semiconductor integrated circuit device according to the another embodiment of the present invention.

As illustrated in FIG. 29, a plating seed layer 7 is formed over the elastomer layer 15 including the surface of the bonding pad BP exposed from the bottom of the opening 6B. As illustrated in FIG. 30, a photoresist film 8 having an opening in a relocating wiring layer formation region is formed over the plating seed layer 7 and then, as illustrated in FIG. 31, a metal film 9 is formed by electroplating over the surface of the plating seed layer 7 in the relocating wiring layer formation region.

After removal of the photoresist film 8, the plating seed layer 7 thereunder is removed by photo etching to form a relocating wiring layer 2 made of the metal film 9. Over the relocating wiring layer 2, an uppermost protective film 12 made of a photosensitive polyimide resin film is formed. After the bump land 2A is exposed by removing the uppermost protective film 12 over one end (bump land 2A) of the relocating wiring layer 2, an Au plating layer 13 is formed over the surface of the bump land 2A by electroless plating.

Figure 33:
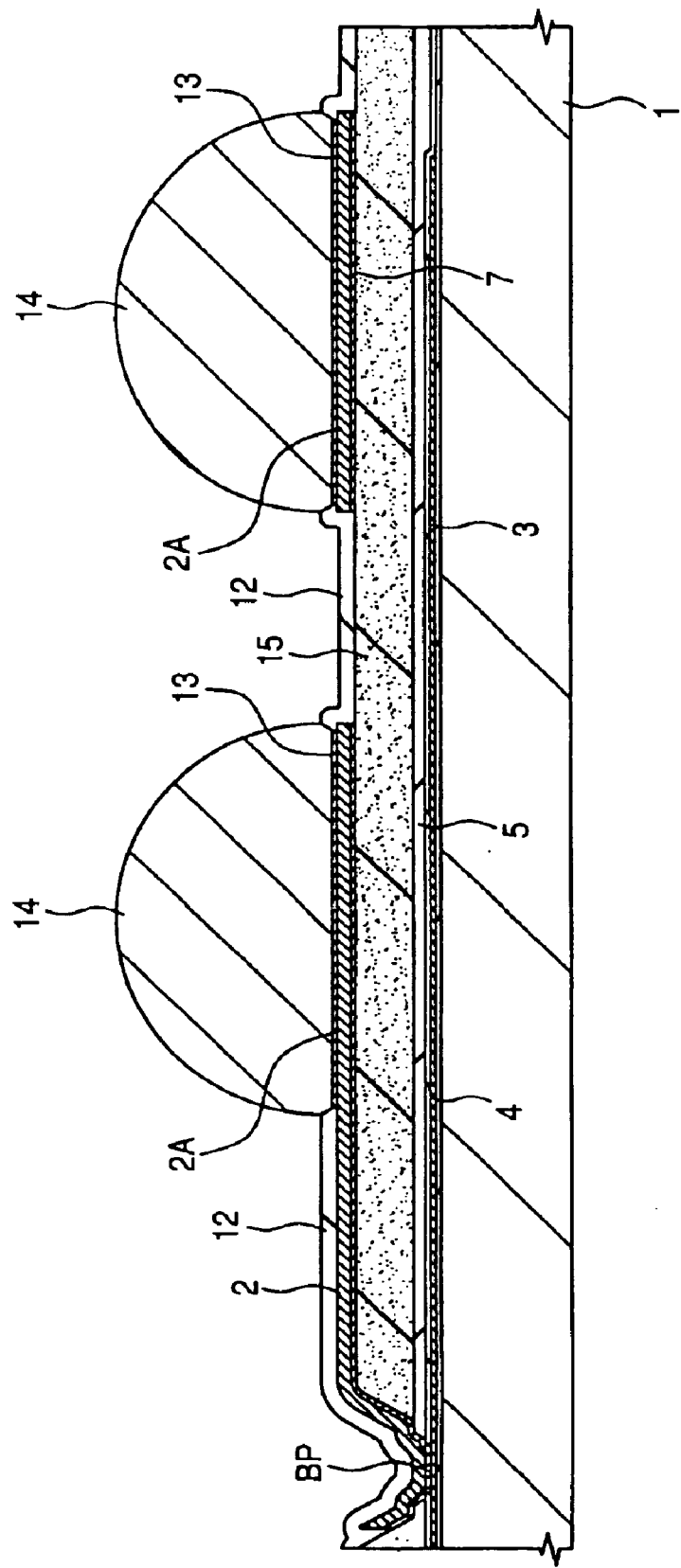
FIG. 33 is a fragmentary cross-sectional view illustrating the manufacturing method of the semiconductor integrated circuit device according to the another embodiment of the present invention.

The wafer 1 which has finished the formation of the Au plating layer 13 over the surface of the bump land 2A is once stocked as is until the determination of the design. When the design and production amount are determined, the necessary number of wafers 1 are taken out and external connection terminals (solder bumps 14) having the layout suited for the selected design are formed as illustrated in FIG. 33. Also in Embodiment 2, a WL-CSP of plural designs different in bit constitution or operation mode can be manufactured using the wafers 1 having the same DRAM formed thereon.

Since the WL-CSP of Embodiment 2 has, between the uppermost interconnect 4 and relocating wiring layer 2, the elastomer layer 15 made of a low elasticity resin, a thermal stress upon mounting of the WL-CSP on a package substrate or a thermal stress generated upon actual use after packaging can be relaxed effectively by this elastomer layer 15. This relaxes a stress applied to connecting portions (solder bumps 14) between the WL-CSP and package substrate further, thereby improving the connection life of the solder bumps 14.

The WL-CSP of Embodiment 1 having no such stress relaxing layer such as the elastomer layer 15 requires a sealant resin (underfill resin 18), as illustrated in FIG. 25, to fill a space with the package substrate as a stress relaxing countermeasure, but the WL-CSP in Embodiment 2 can omit such a filling step of the sealant resin. This simplifies the packaging step of the WL-CSP on the package substrate and at the same time, facilitates repair of the WL-CSP mounted on the package substrate.

Advantages available by this Embodiment 2 are as follows:

(1) A change in the layout of the solder bumps 14 facilitates switch-over of the design by wafer, making it possible to shorten the development term of a WL-CSP.

(2) A change in the layout of the solder bumps 14 facilitates selection of a plurality of functions such as bit constitution and operation mode suited for each wafer.

(3) Accordingly, it is possible to meet the user's request promptly.

(4) A stock can be reduced by market production.

(5) The advantages described above in (1) to (4) lead to a reduction in a production cost of a WL-CSP.

(6) Without necessity of treatment for each chip upon switch-over of the design, the development term can be shortened and a prompt response to the user's request can be carried out from this point of view.

(7) A thermal stress upon packaging of a WL-CSP on a package substrate or a thermal stress generated upon practical use after packaging can be relaxed by the formation of the elastomer layer 15.

(8) The filling step of an underfill resin can be omitted upon packaging, leading to simplification of the packaging step of a WL-CSP.

(Embodiment 3)

Figure 34:
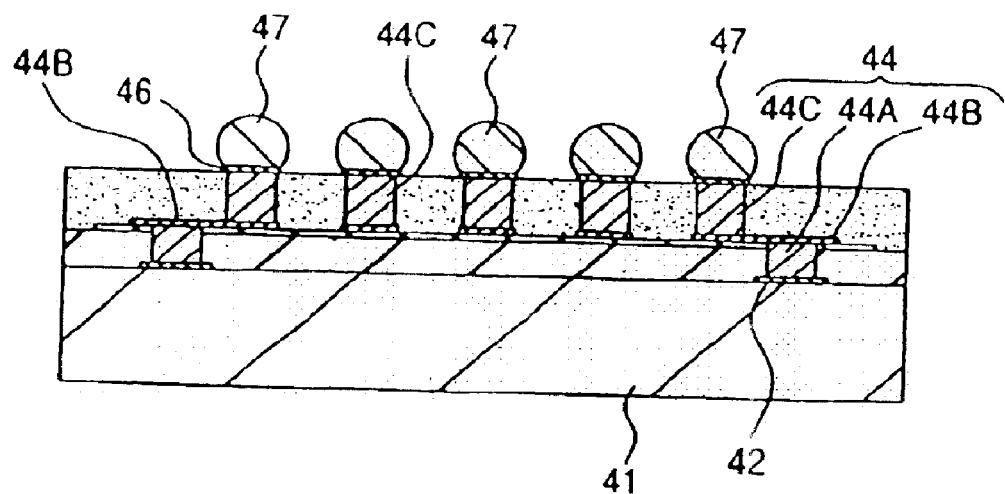
FIG. 34 is a fragmentary cross-sectional view illustrating a semiconductor integrated circuit device according to a further embodiment of the present invention.

FIG. 34 is a cross-sectional view of a WL-CSP according to Embodiment 3. In this WL-CSP, bonding pads 42 formed at the periphery of the main surface of a semiconductor chip 41 are connected to the solder bumps 47 via relocating wiring layers 44. These relocating wiring layers 44 are each made of Cu layers 44A and 44B, and Cu post (column) 44C. Between the Cu post 44C and solder bump 47, a barrier metal 46 is formed. The barrier metal 46 is made of, for example, a Cu film and an Ni film.

Even in such a structure, by stocking the wafer after formation of the relocating wiring layer 44 and forming the solder bumps 47 to have a layout in accordance with the design determined later, WL-CSPs of plural kinds different in design can be manufactured from one type of a wafer having LSI formed thereon.

(Embodiment 4)

Figure 35:
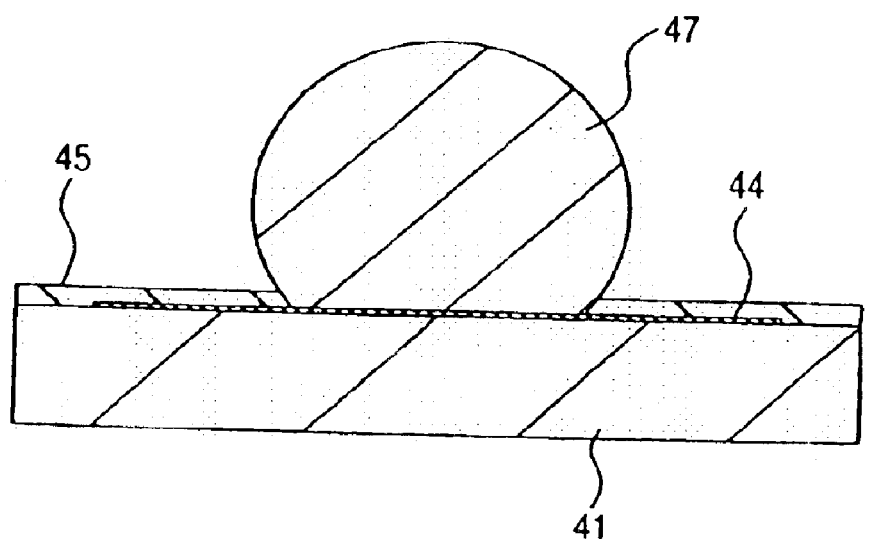
FIG. 35 is a fragmentary cross-sectional view illustrating a semiconductor integrated circuit device according to a still further embodiment of the present invention.

FIG. 35 is a cross-sectional view illustrating a WL-CSP of Embodiment 4. In this WL-CSP, a bonding pad (not illustrated) formed on the main surface of a chip 41 is connected to a solder bump 47 via a relocating wiring layer 44 made of Al/NiV/Cu. Even in such a structure, by stocking the wafer after formation of the relocating wiring layer 44 and forming the solder bumps 47 to have a layout in accordance with the design determined later, WL-CSPs of plural kinds different in design can be manufactured from one type of wafer having LSI formed thereon.

(Embodiment 5)

Figure 36:
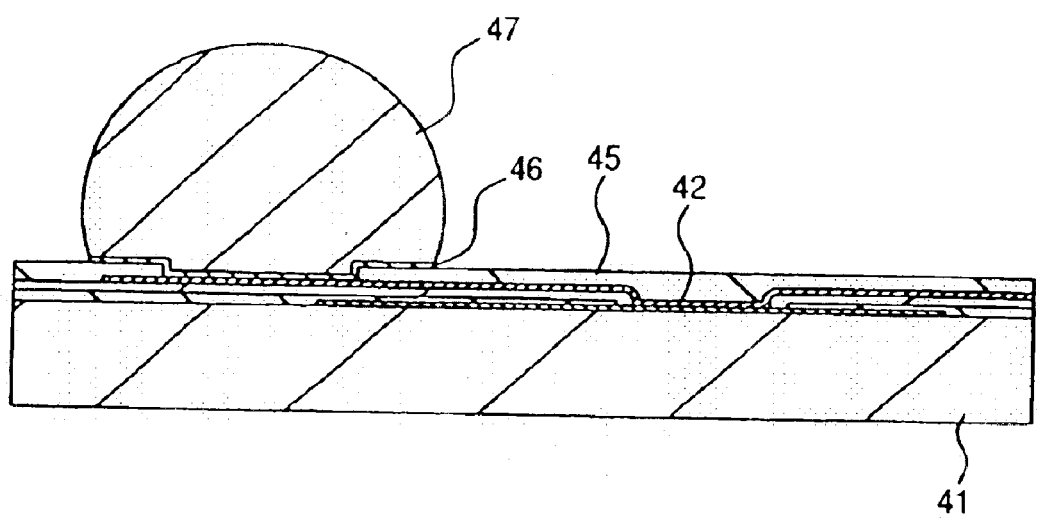
FIG. 36 is a fragmentary cross-sectional view illustrating a semiconductor integrated circuit device according to a still further embodiment of the present invention.

FIG. 36 is a cross-sectional view illustrating a WL-CSP according to Embodiment 5. In this WL-CSP, a bonding pad 42 formed on the main surface of the chip 41 is connected to a solder bump 47 via a relocating wiring layer 44 made of Cu or Al. Between the relocating wiring layer 44 and the solder bump 47, a barrier metal 46 made of, for example, a Cu film and an Ni film is formed.

Even in such a structure, by stocking the wafer after formation of the relocating wiring layer 44 and forming the solder bumps 47 to have a layout in accordance with the design determined later, WL-CSPs of plural kinds different in design can be manufactured from one type of a wafer having LSI formed thereon.

(Embodiment 6)

Figure 37:
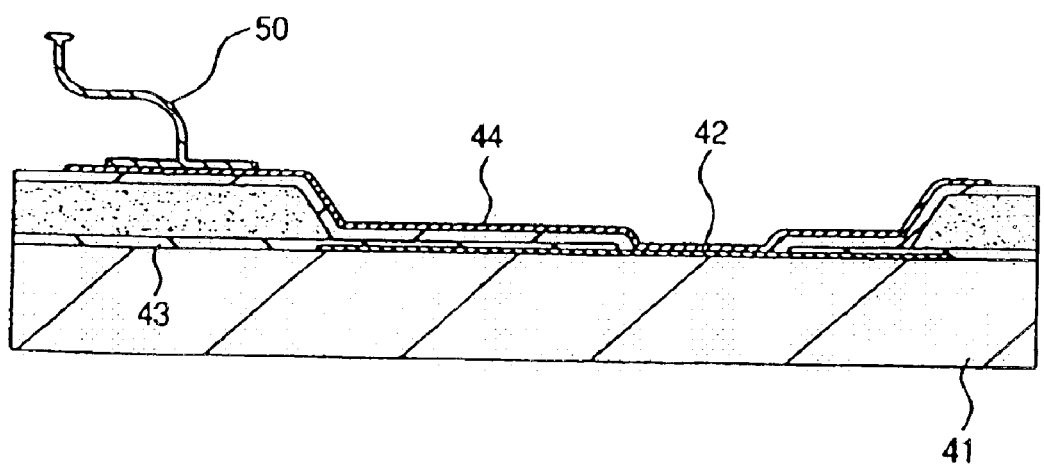
FIG. 37 is a fragmentary cross-sectional view illustrating a semiconductor integrated circuit device according to a still further embodiment of the present invention.

FIG. 37 is a cross-sectional view illustrating a WL-CSP of Embodiment 6. In this WL-CSP, the solder bump, as an external connection terminal, is replaced with a micro spring 50. Also in this case, by forming the microsprings 50 to have a layout in accordance with the design determined later, WL-CSPs of plural kinds different in design can be manufactured from one type of wafer having LSI formed thereon.

In Embodiments 1 to 6, described were methods of selecting a function such as bit constitution or operation mode by changing the layout of external connection terminals (solder bumps). In Embodiments 7 to 9, on the other hand, a method of selecting characteristics of a semiconductor integrated circuit device by changing the layout of external connection terminals (solder bumps) will be described.

(Embodiment 7)

In Embodiment 7, a method of switching drivability (driving force) of an output buffer, which is one of the characteristics of a semiconductor integrated circuit device, by changing the layout of external connection terminals (solder bumps) will be described.

General-purpose LSIs such as SRAM (Static Random Access Memory) and microcomputer are mounted on a variety of electronic devices having different external loads. Unless the drivability of the output buffer of LSI is optimized in accordance with the external load, noise or an increase in power consumption sometimes occurs. It is effective to optimize, according to the external load, the drivability of the output buffer, that is, the output impedance ($Z_0$) of a signal transmission path in order to avoid such a noise or increase in power consumption.

A method of preparing, in a chip, some I/O drive circuits different in drivability, changing Al interconnect patterns in the chip depending on the load of an electronic device on which the chip is to be mounted, and selecting the I/O drive circuit having the most suitable drivability is considered as one method of switching the drivability of the output buffer. This method is however accompanied with the drawback that the wafer process (pre-step) must become cumbersome because some kinds of wafers different in Al interconnect patterns must be prepared in advance.

A method of connecting bonding pads to a plurality of I/O drive circuits, respectively and selecting an I/O drive circuit having the most suitable drivability by switch-over of the bonding wire is considered as another method.

This method is however accompanied with such a drawback as an increase in the area of the bonding pads in the chip owing to an increase in the number of bonding pads.

A method of selecting an I/O drive circuit by disposing, on the substrate side on which a chip is mounted, a resistor element which can vary a resistance and detecting the intensity of the resistance input from the exclusively used bonding pad (input pin) connected to the resistor element. This method is however accompanied with the inconveniences that a bonding pad (input pin) for exclusive use must be disposed on the chip side, a circuit for detecting the intensity of the resistance must be disposed; and necessity to form a resistor element on the substrate side increases a burden on the design of a package substrate.

In order to select an I/O drive circuit having most suited drivability without causing any inconvenience, employed in this Embodiment 7 is a method of partially changing the layout upon formation of external connection terminals (solder bumps) over one end (bump land) of a relocating wiring layer. A description will next be made on a specific example of the method of selecting an I/O drive circuit by changing the layout of solder bumps.

Figure 38:
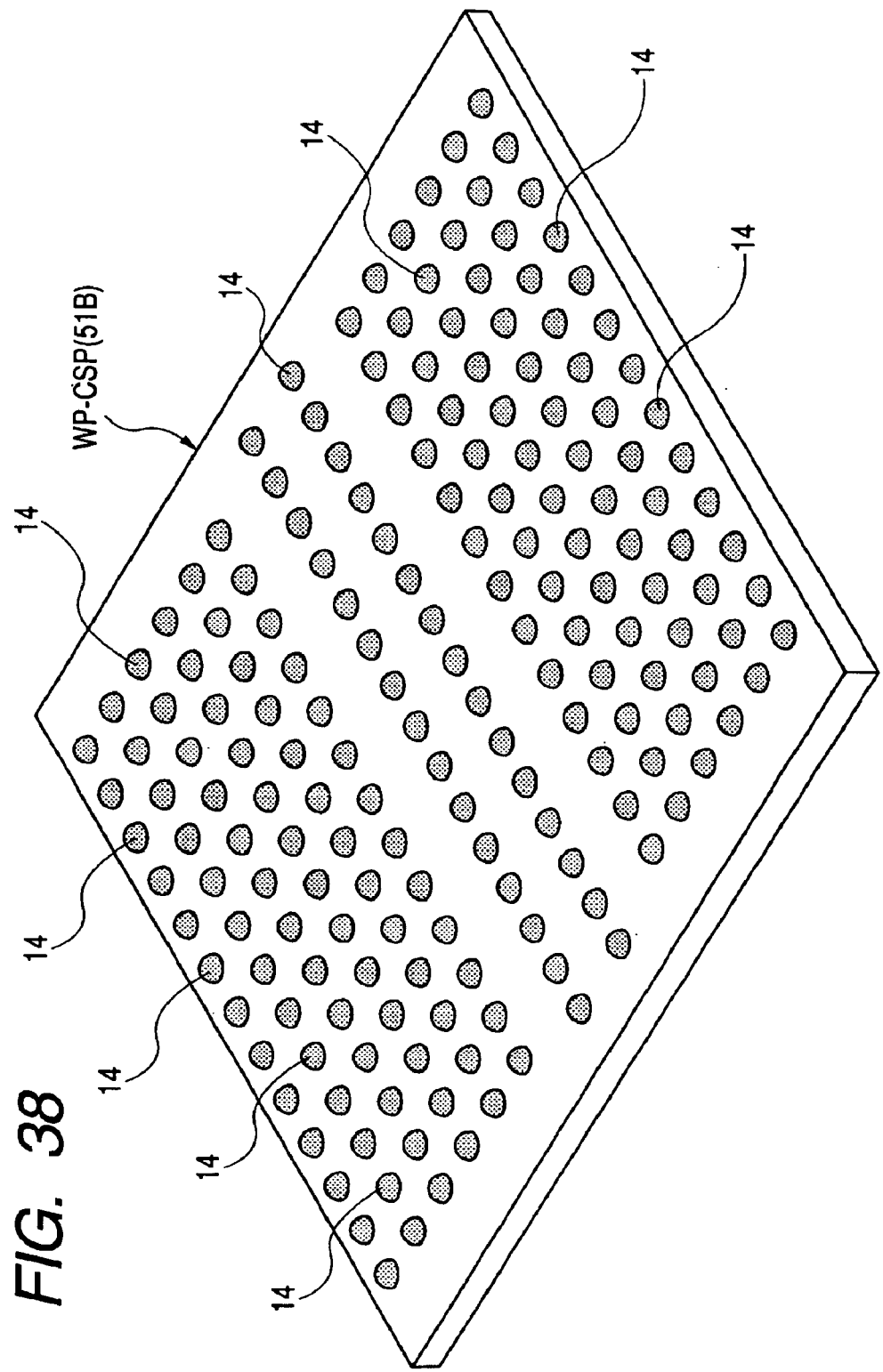
FIG. 38 is a perspective view illustrating the appearance of a semiconductor integrated circuit device according to a still further embodiment of the present invention.

FIG. 38 is a perspective view illustrating the main surface of the WL-CSP (chip 51B). Over the main surface of the chip 51B, there are arranged in the matrix form a plurality of solder bumps 14. Although there is no particular limitation, the chip 51B has an outside dimension of 8 mm×9 mm and has 196 solder bumps 14. The diameter of each of the solder bumps 14 is about 200 $\mu$m and a pitch between any two adjacent solder bumps 14 is 0.54 mm. The solder bumps 14 are each made of Pb free solder (melting temperature: 220 to 230° C.) made of, for example, 98.5% of Sn (tin), 1% of Ag (silver) and 0.5% of Cu and substantially free of Pb (lead).

Figure 39:
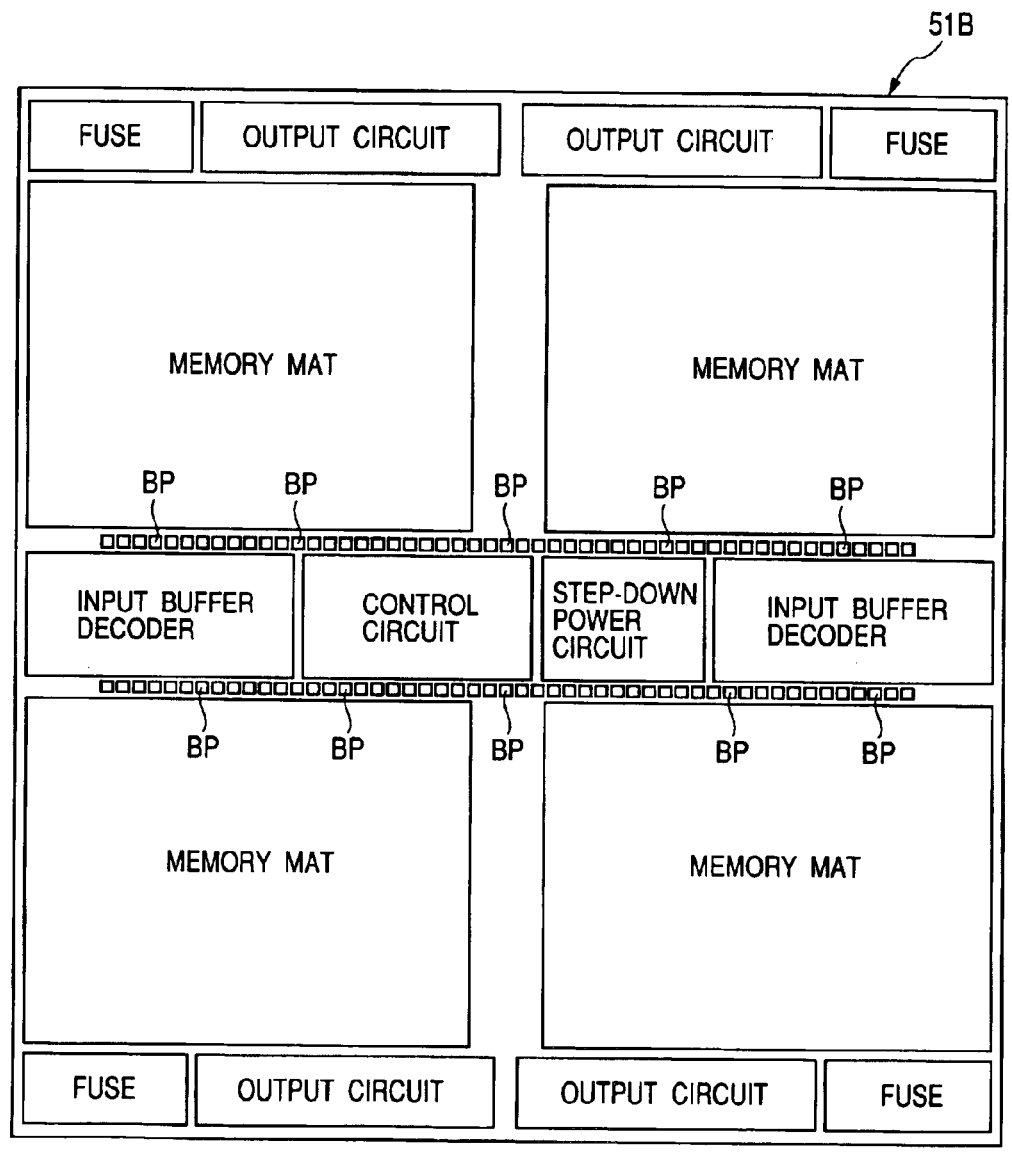
FIG. 39 is a block diagram of the semiconductor integrated circuit device according to the still further embodiment of the present invention.

Over the main surface of the chip 51B, an SRAM having a storage capacity of, for example, 8 mega bit (Mbit) is formed. This SRAM is used as cache memory of a work station and as illustrated in FIG. 39, has a memory section divided into a plurality of memory mats, and a peripheral circuit section formed of an input/output circuit (input buffer decoder, output circuit), control circuit and step-down power circuit. In the central part of the main surface of the chip 51B, a plurality of bonding pads BP are arranged in 2 rows in the right-to-left direction of this diagram.

Figure 40:
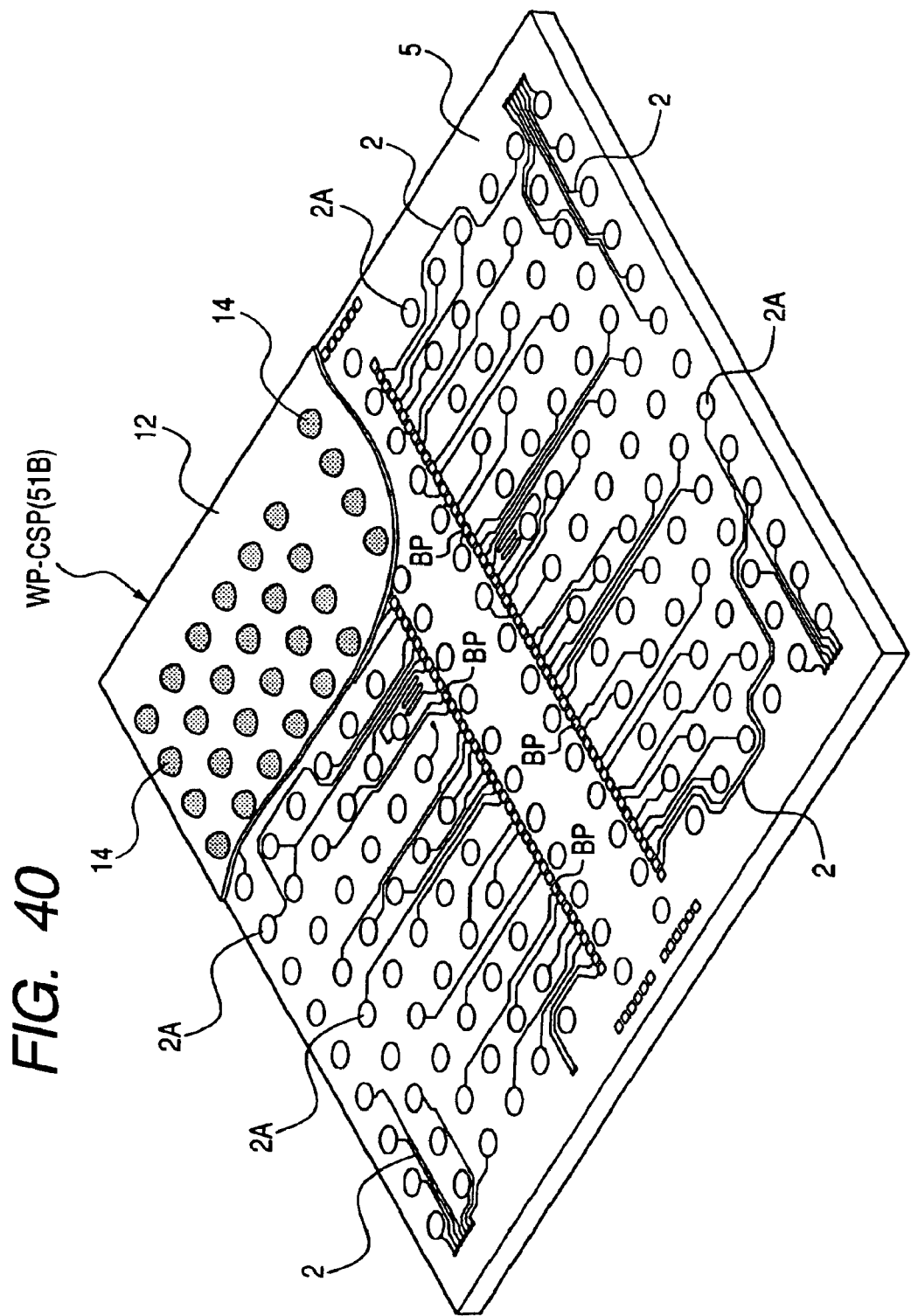
FIG. 40 is a perspective view illustrating the relocating wiring (relocating wiring layer) and bonding pad of the semiconductor integrated circuit device according to the still further embodiment of the present invention.
Figure 41:
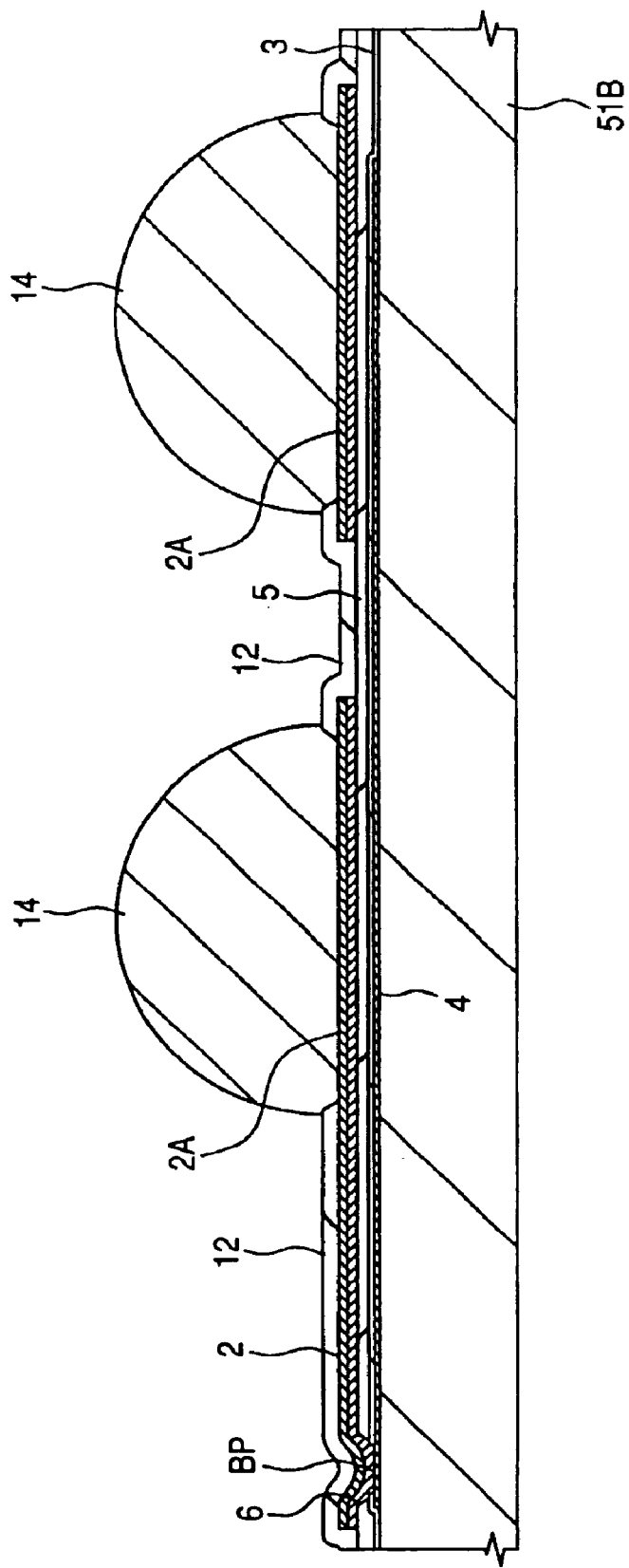
FIG. 41 is a fragmentary cross-sectional view illustrating the semiconductor integrated circuit device according to the still further embodiment of the present invention.

FIG. 40 is a perspective view illustrating a part of the relocating wiring layer 2 connected to the solder bump 14, and FIG. 41 is a fragmentary cross-sectional view of the chip 51B.

The main surface of the chip 51B except a region in which the solder bumps 14 are formed is covered with an uppermost protective film 12. The uppermost protective film 12 is composed of a photosensitive polyimide resin film of about 15 $\mu$m thick. Below the uppermost protective film 12, a relocating wiring layer 2 made of Cu and bump land 2A constituting one end thereof are formed. The solder bump 14 constituting an external connection terminal of the WL-CSP is connected onto the bump land 10A. Below the relocating wiring layer 2 and bump land 2A, a photosensitive polyimide resin film 5 of about 5 μm thick is formed. The other end of the relocating wiring layer 2 is electrically connected to the bonding pad BP via an opening 6 formed in the photosensitive polyimide resin film 5. The bonding pad BP, relocating wiring layer 2 and bump land 2A are formed in a similar manner to those employed in Embodiment 1.

Figure 42:
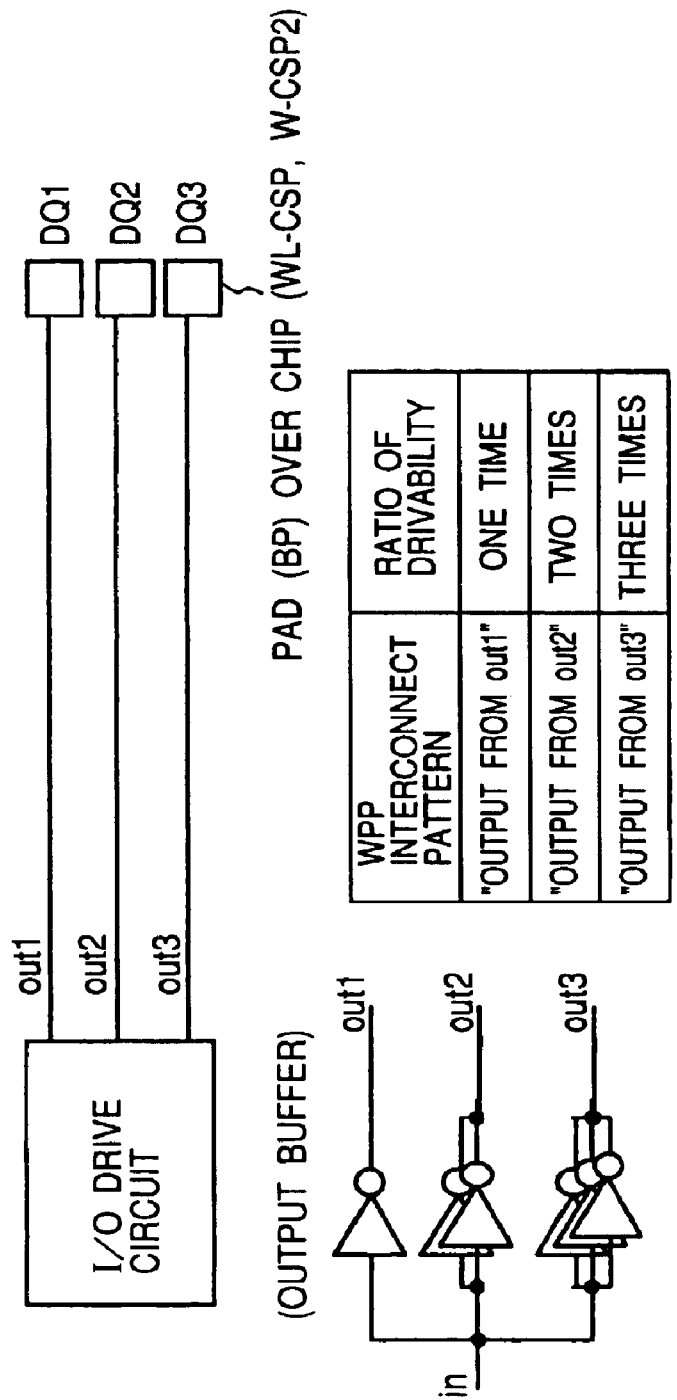
FIG. 42 is a block diagram illustrating an I/O drive circuit of the semiconductor integrated circuit device according to the still further embodiment of the present invention.

FIG. 42 illustrates one example of an I/O drive circuit formed in the chip 51. This I/O drive circuit is equipped with, for example, three output buffers different in drivability and their outputs (out1, out2, out3) are connected to bonding pads BP (DQ1), BP (DQ2) and BP (DQ3) via an Al alloy interconnect. With regards to the intensity of the drivability output from this I/O drive circuit, that from output (out2) is twice and that from output (out3) is three times as much as that of the output (out1).

Figure 43:
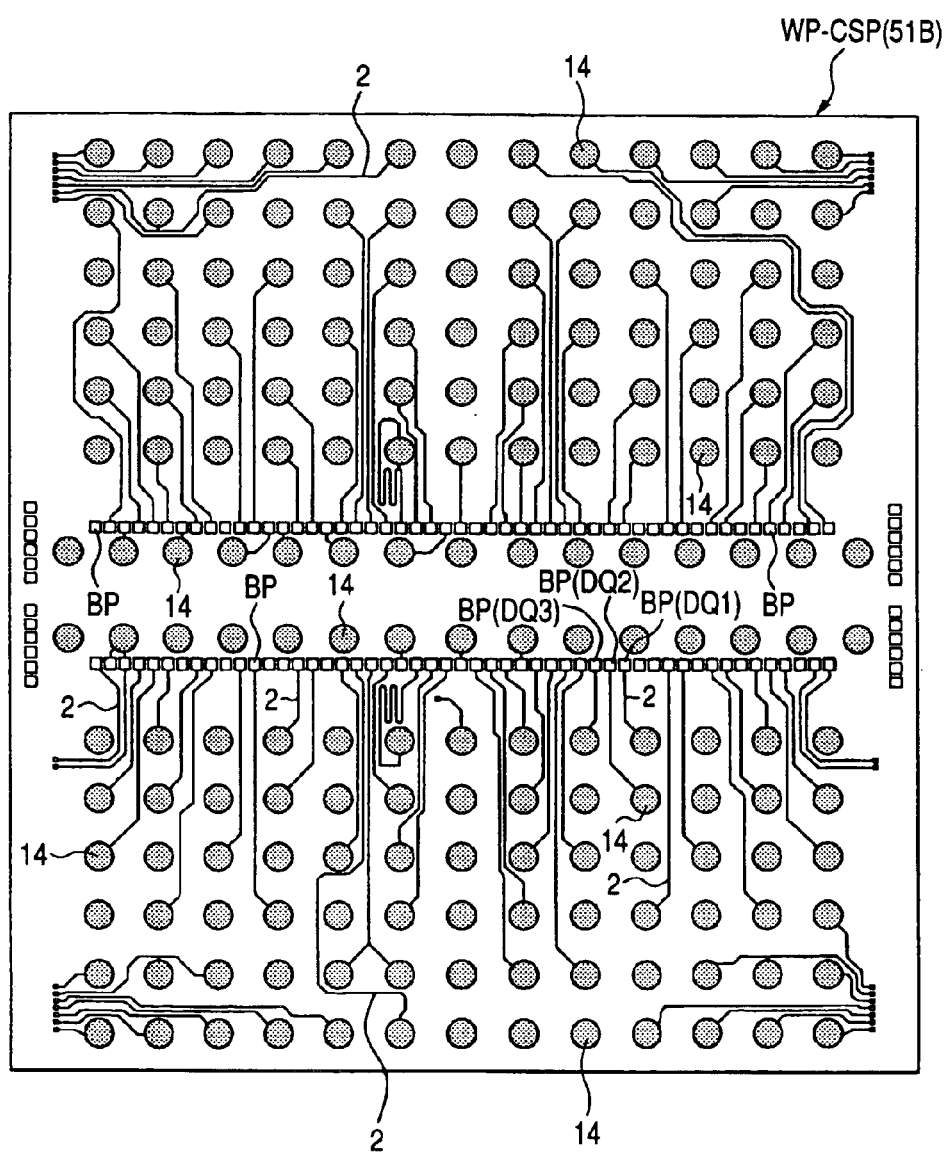
FIG. 43 is a plan view illustrating the semiconductor integrated circuit device according to the still further embodiment of the present invention.
Figure 44:
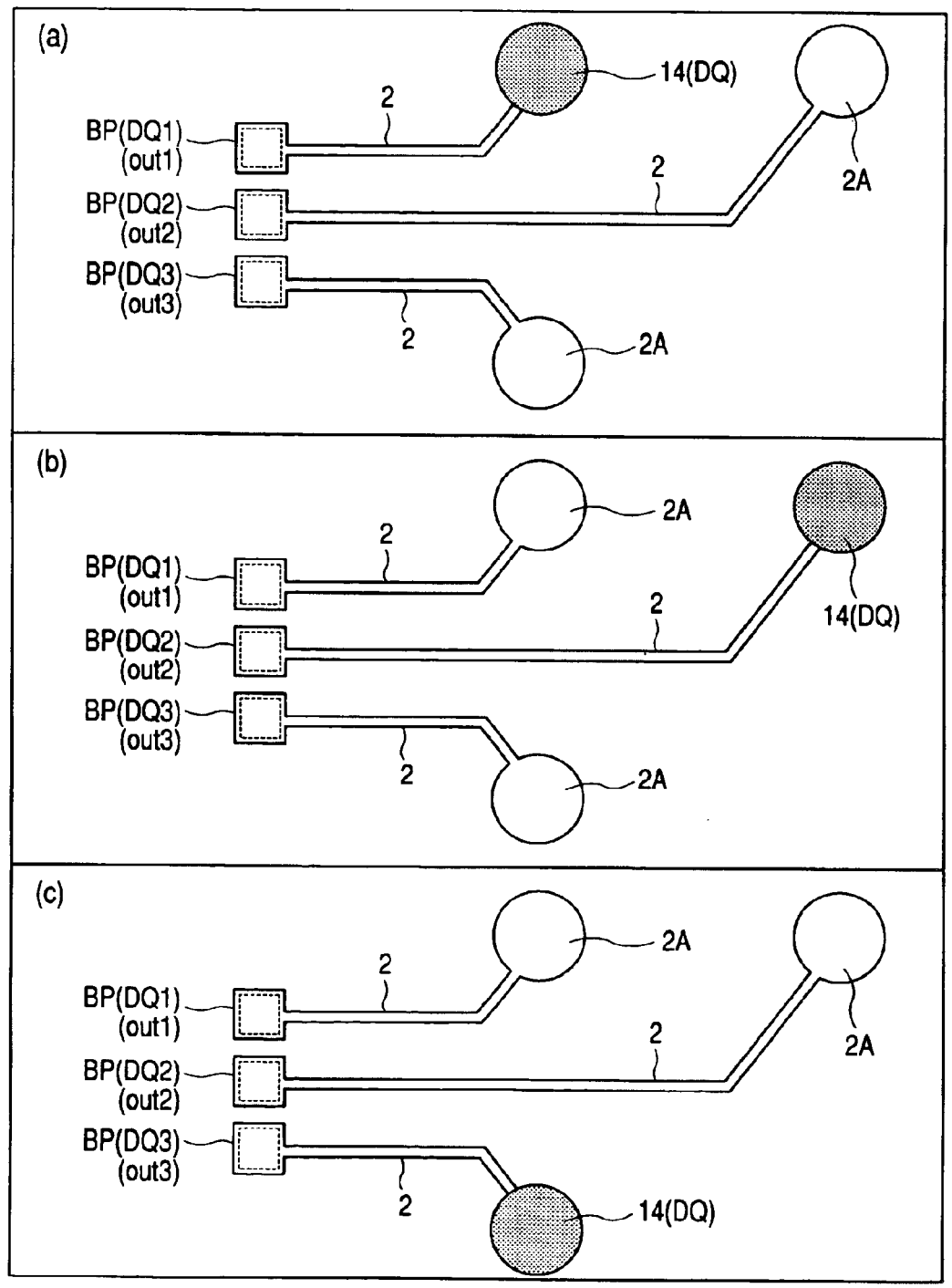
FIGS. 44(a) to (c) are each a plan view illustrating the connection state of a characteristics-selecting bump land and an external connection terminal.

FIG. 43 is a plan view of a WL-CSP (chip 51B) having the bonding pads BP (DQ1, DQ2, DQ3) and relocating wiring layer 2 formed thereon; and FIG. 44 is a fragmentary enlarged view of FIG. 43.

As illustrated in FIG. 44, in order to switch the drivability of the WL-CSP, it is only necessary to connect the solder bump 14 (external connection terminal) constituting the DQ pin to any one of three bump lands 2A connected to the bonding pads BP (DQ1, DQ2, DQ3). For example, in the WL-CSP illustrated in FIG. 44(*a*), the solder bump 14 constituting the DQ pin is connected to the bonding pad BP (DQ1) via the relocating wiring layer 2. In this case, since the solder bump 14 constituting the DQ pin is connected to the output (out1) via the bonding pad BP (DQ1), the drivability of the WL-CSP becomes minimum. In the WL-CSP illustrated in FIG. 44(*b*), the DQ pin (solder bump 14) is connected to the bonding pad BP (DQ2) via the relocating wiring layer 2. In this case, the DQ pin (solder bump 14) is connected to the output (out2) via the bonding pad BP (DQ2) so that the drivability of the WL-CSP becomes twice as much as that of FIG. 44(*a*). In the WL-CSP illustrated in FIG. 44(*c*), the DQ pin (solder bump 14) is connected to the bonding pad BP (DQ3) via the relocating wiring layer 2. In this case, the DQ pin (solder bump 14) is connected to the output (out3) via the bonding pad BP (DQ3) so that the drivability of the WL-CSP becomes three times as much as that of FIG. 44(*a*).

Figure 45:
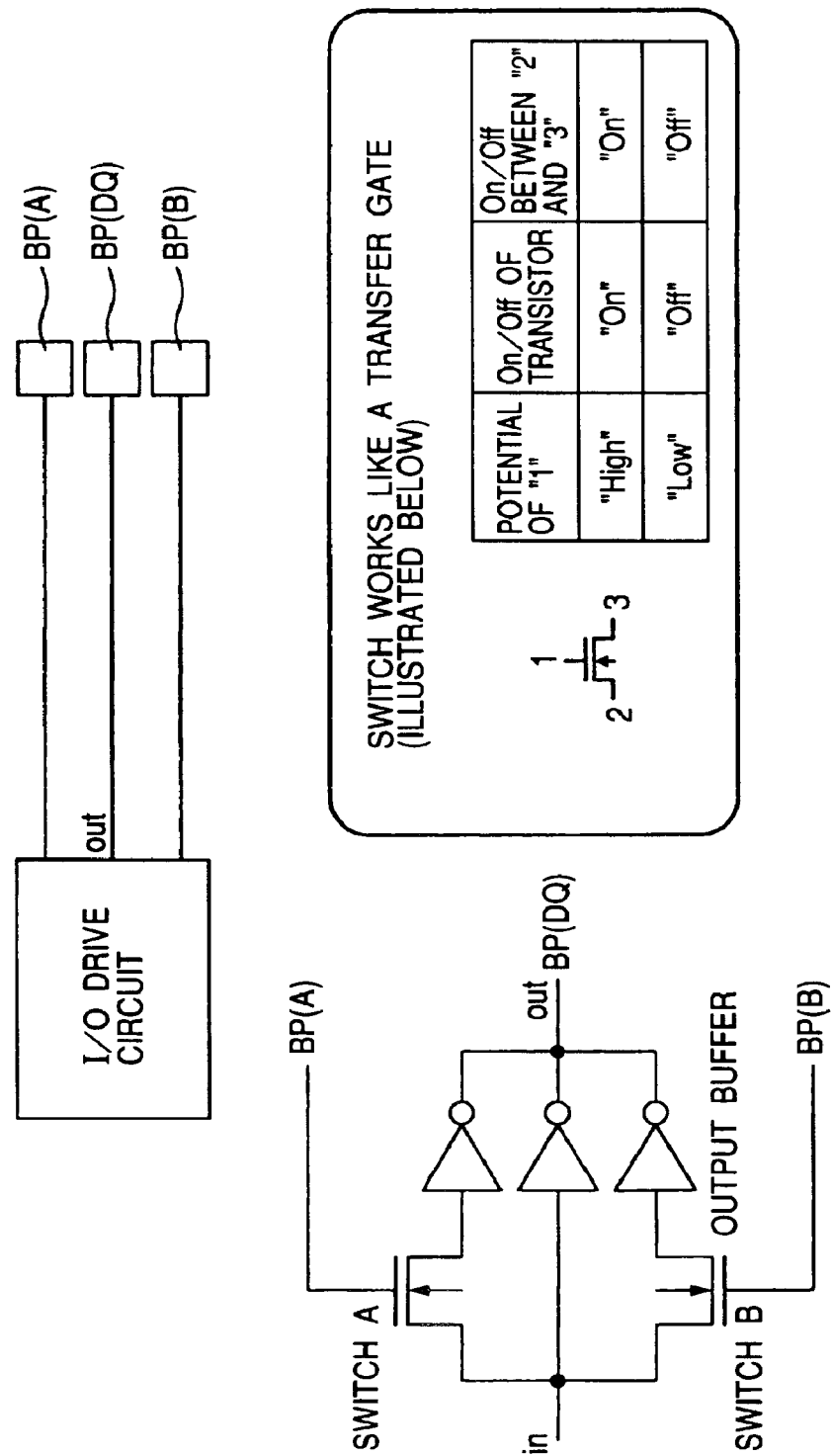
FIG. 45 is a block diagram illustrating another example of the I/O drive circuit.

FIG. 45 illustrates another example of an I/O drive circuit. In this I/O drive circuit, for example, three output buffers equal in drivability are connected in parallel and one bonding pad BP (DQ) is connected to the output (out) via an Al alloy interconnect. Switch A is connected to one of the three output buffers, while switch B is connected to the remaining output buffer. The switches A and B are each made of one n-channel type MOS transistor. To the gate electrode of the n-channel type MOS transistor constituting the switch A, a bonding pad BP (A) is connected via an Al alloy interconnect, while to the gate electrode of the n-channel type MOS transistor constituting the switch B, a bonding pad BP (B) is connected via an Al alloy interconnect.

By the input of high level voltage (Vdd) to the switch A via the bonding pad BP (A), the n-channel type MOS transistor is turned ON and by the input of low level voltage (Vss), it is turned Off. Similarly, by the input of high level voltage (Vdd) to the switch B via the bonding pad BP, the n-channel type MOS transistor is turned ON and by the input of low level voltage (Vdd), it is turned Off. Accordingly, when the switches A and B are each Off, the output to the bonding pad BP (DQ) only from one output buffer connected to neither the switch A nor switch B occurs and the drivability of the WL-CSP becomes minimum. When one of the switches A and B is ON and the other one is Off, output to the bonding pad BP (DQ) occurs from two output buffers, so the drivability of the WL-CSP becomes twice as much as that when the switches A and B are Off. When the switches A and B are both ON, output to the bonding pad BP (DQ) occurs from three output buffers, making the drivability of the WL-CSP three times as much as that when the switches A and B are both Off.

Figure 46:
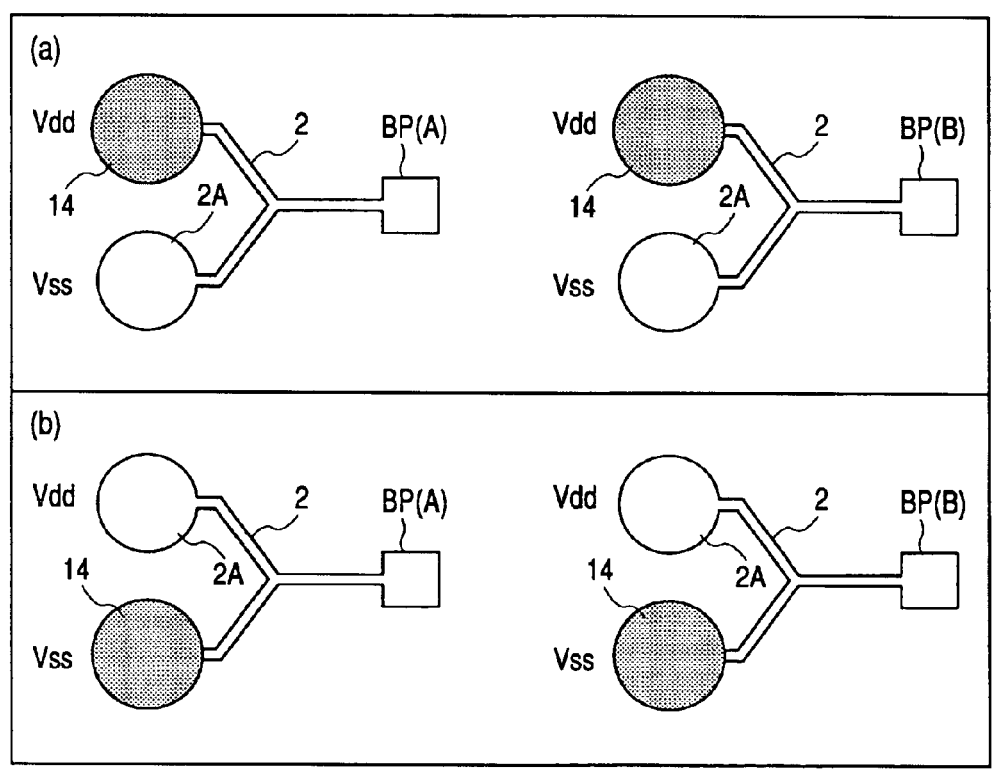
FIGS. 46(a) and (b) are each a plan view illustrating the connection state of a power-applying bump land and an external connection terminal.

In order to switch the drivability of the WL-CSP, either a high level voltage (Vdd) or a low level voltage (Vss) is input to each of the bonding pad BP (A) connected to the switch A and the bonding pad BP (B) connected to the switch B via the solder bumps 14. For example, in order to turn the switch A On, a high level voltage (Vdd) is input, via the solder bump 14, to the bonding pad BP (A) connected to the switch A as illustrated in FIG. 46(*a*). In order to turn the switch A Off, a low level voltage (Vss) is input, via the solder bump 14, to the bonding pad BP (A) connected to the switch A as illustrated in FIG. 46(*b*). Similarly, in order to turn the switch B ON, a high level voltage (Vdd) is input, via the solder bump 14, to the bonding pad BP (B) connected to the switch B as illustrated in FIG. 46(*a*). In order to turn the switch B Off, a low level voltage (Vss) is input, via the solder bump 14, to the bonding pad BP (B) connected to the switch B as illustrated in FIG. 46(*b*).

In the above-described example, the three-stage switch-over of the drivability of the output buffer is conducted, but it is needless to say that four or more-stage switchover of the drivability can be conducted. For example, the I/O drive circuit illustrated in FIG. 47 is a combination of the I/O drive circuit illustrated in FIG. 42 and the I/O drive circuit illustrated in FIG. 45. In this I/O drive circuit, switches A, B and C are connected to three output buffers different in drivability. It is therefore possible to carry out 6-stage switch-over of the drivability of the output buffer within a range of from 1 to 6 times by changing the layout of the solder bumps 14, thereby turning the three switches A, B and C ON/Off.

Figure 48:
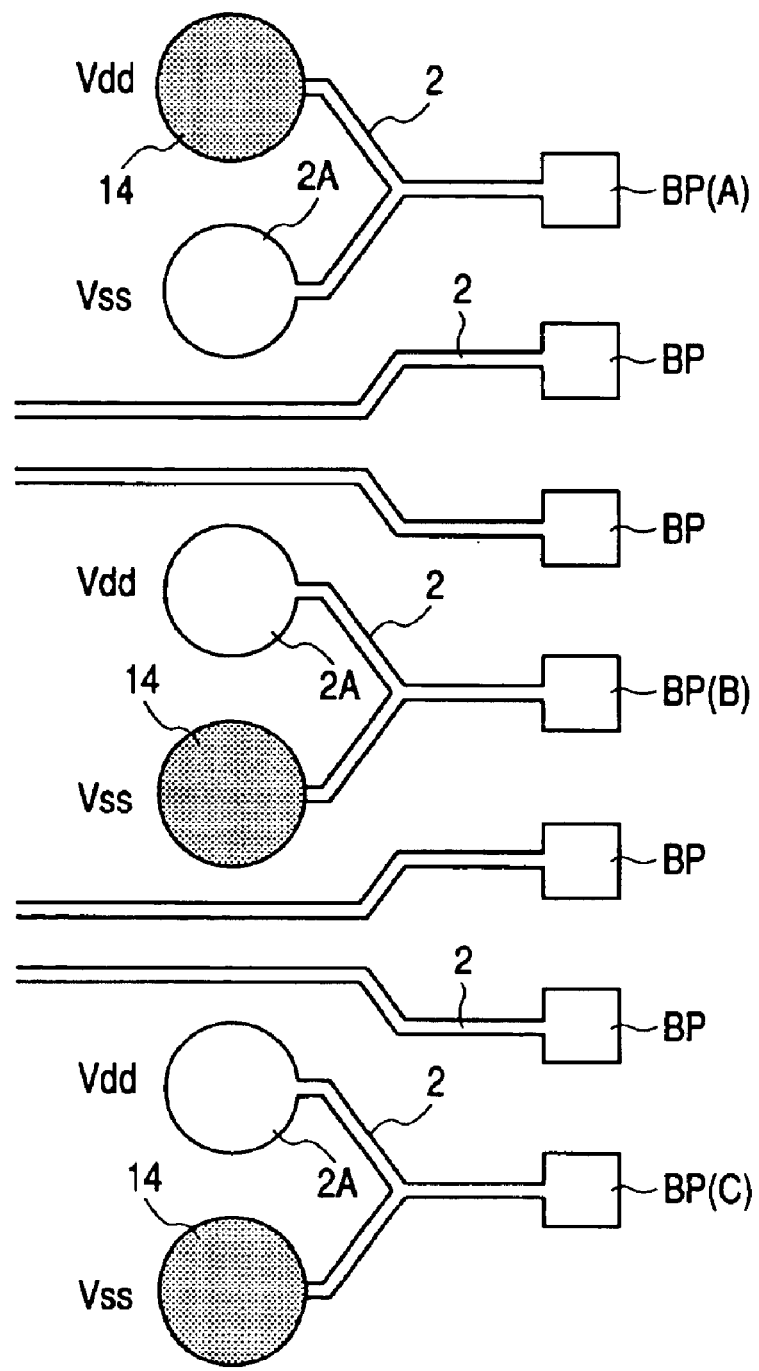
FIG. 48 is a plan view illustrating the connection state of a power applying bump land and an external connection terminal.

For example, in the WL-CSP as illustrated in FIG. 48, a high-level voltage (Vdd) is input, via the solder bump 14, to the bonding pad BP (A) connected to the switch A, while a low-level voltage (Vss) is input, via the other solder bumps 14,14, to the bonding pad BP (B) connected to the switch B and the bonding pad BP (C) connected to the switch C. Then, the switch A is turned ON and the switches B,C are turned Off, whereby the output to the bonding pad BP (DQ) occurs only from the output buffer connected to the switch A and having the minimum drivability and the drivability of the WL-CSP becomes minimum.

In the above-described example, the switch is composed of one n-channel type MOS transistor. Alternatively, any element or circuit whose ON/Off is turned by a high level/low level signal input such as one p channel type MOS transistor or CMOS circuit is usable as a switch.

According to this Embodiment 7, drivability of the output buffer can be switched easily only by changing the layout of the solder bumps 14.

(Embodiment 8)

In Embodiment 7, a method of changing the layout of the solder bumps 14, thereby switching the drivability of the output buffer was described. In Embodiment 8, a method of switching the voltage (I/O voltage) of the output buffer will be described.

When the voltage of the signal output from LSI is not optimized for external loads, an unnecessary voltage swing occurs in a signal transmission path and it sometimes causes noise or increases power consumption. A large voltage swing may disturb high speed operation of a circuit. For preventing noise or an increase in power consumption, or actualizing high-speed operation, it is effective to optimize the I/O voltage, depending on the external load, thereby narrowing the voltage swing of an output signal.

In Embodiment 8, a change in a part of the layout of solder bumps 14 upon connecting them onto the bump land 2A is adopted as a method of selecting the most suited I/O voltage. A specific example of the method of switching an operation voltage by changing the layout of the solder bumps 14 will next be described.

Figure 49:
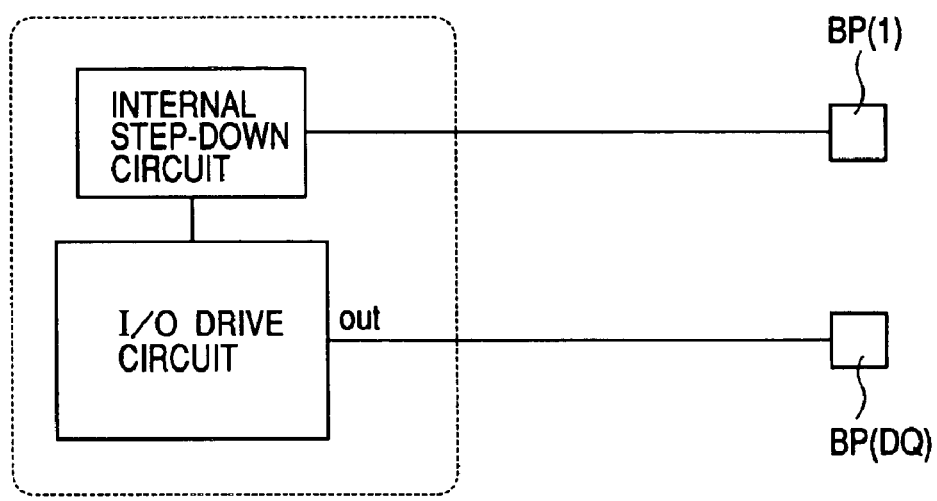
FIG. 49 is a block diagram illustrating an I/O voltage control circuit.

FIG. 49 is a block diagram of an I/O voltage swing controlled circuit formed in a WL-CSP. This I/O voltage swing controlled circuit is composed of an I/O drive circuit and an internal step-down circuit connected thereto. To the I/O drive circuit, a bonding pad BP (DQ) is connected via an Al alloy interconnect, while to the internal step-down circuit, a bonding pad BP1 is connected via an Al alloy interconnect.

Figures 50, 51:
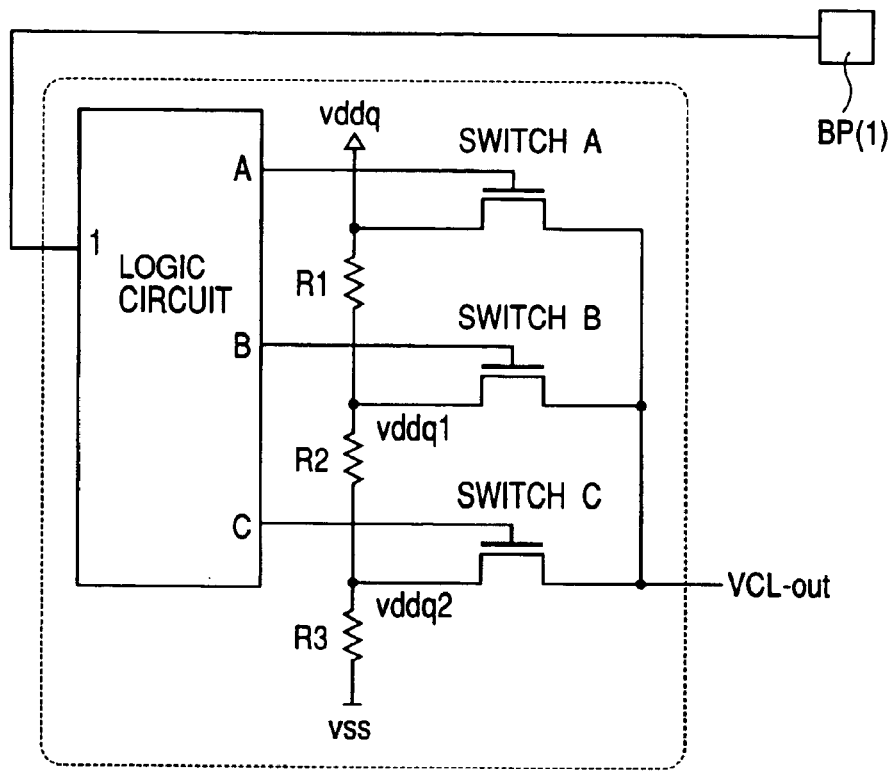
FIG. 50 is a block diagram illustrating an internal step-down circuit.
FIG. 51 is an explanatory view of the corresponding relationship between voltage to be input into a bonding pad and ON/OFF of a switch.

FIG. 50 is a block diagram illustrating one example of the constitution of the internal step-down circuit. This internal step-down circuit has, for example, a logic circuit made of a CMOS gate or the like, switches (a,b,c) made of an n channel type MOS transistor and resistor elements (R1, R2, R3). To the logic circuit, either of a high level (Vdd) or low level (Vss) voltage, or neither voltage is input via the bonding pad BP1. As illustrated in the logic diagram of FIG. 51, a high level or low level voltage is output from the outputs (A, B, C) of the logic circuit, depending on the above-described three states.

Between the power-supply voltage (vddq) and referential voltage (Vss), three resistor elements (R1, R2, R3) are connected in series and voltage are divided by these three resistor elements (R1, R2, R3) into vddq, vddq1 and vddq2. For example, supposing that vddq=3.3 V, R1=100 kΩ, R2=87.5 kΩ, and R3=225 kΩ, voltages available are as follows: vddq1=2.5V and vddq2=1.8V.

To these resistor elements (R1, R2, R3), switches (a, b, c) are connected and depending on the voltage level (high or low) of the outputs (A, B, C) of the logic circuit, these switches (a, b, c) are turned ON/Off. By the combination of ON/Off of these switches (a, b, c), one of the three voltages (vddq, vddq1, vddq2) is output as the final voltage (VCL-out), whereby the I/O voltage of the I/O drive circuit is determined.

Figure 52:
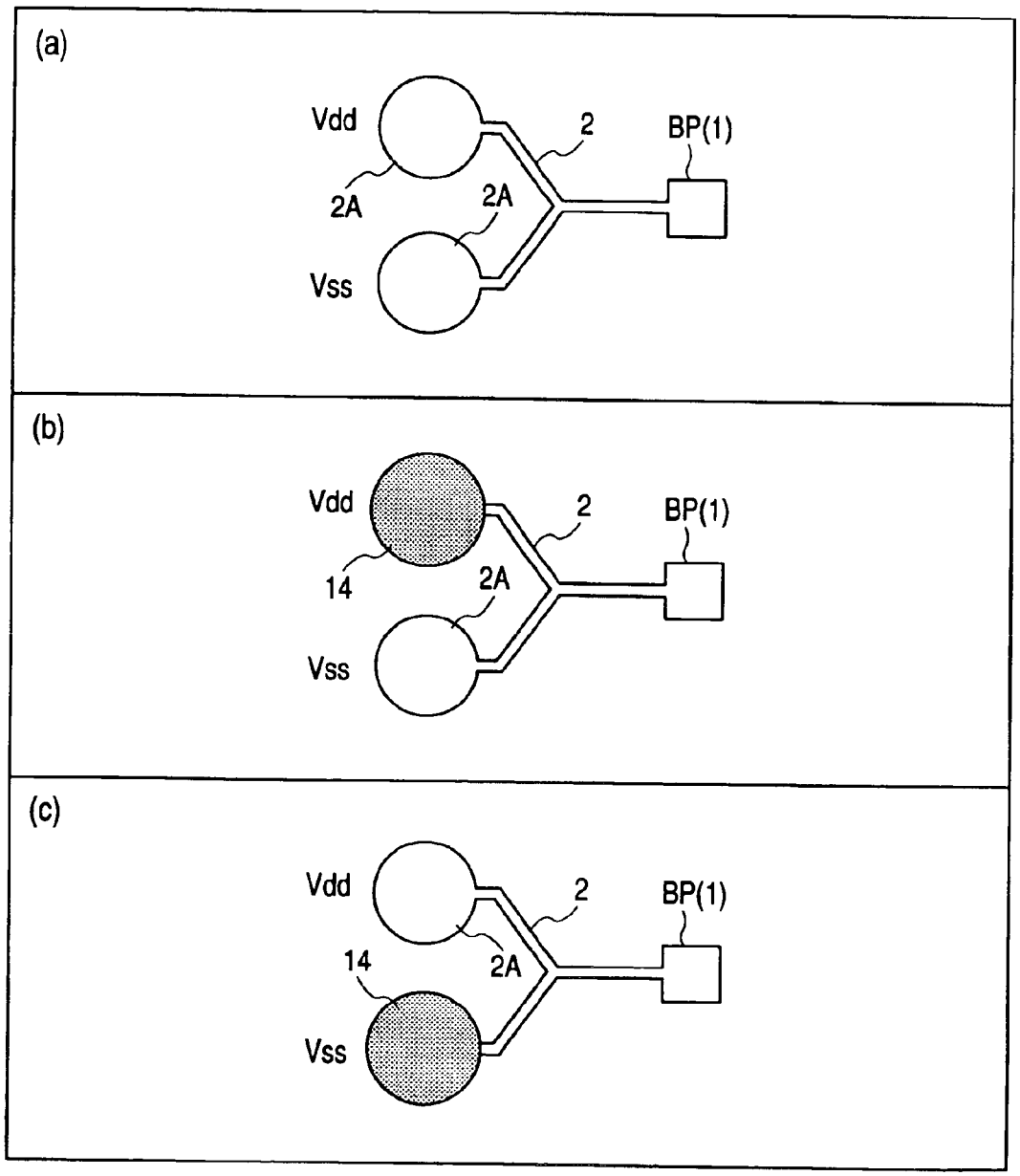
FIGS. 52(a) to (c) are each a plan view illustrating the connection state of a power applying bump land and an external connection terminal.

The I/O voltage of the WL-CSP is switched by inputting or not inputting, to the bonding pad BP1 connected to the logic circuit, a high-level voltage (Vdd) or a low level voltage (Vss) via the solder bump 14 as illustrated in FIG. 52. When nothing is input to the bonding pad BP1 as illustrated in FIG. 52(a), only the switch a, among the three switches (a, b, c) of the internal step-down circuit, is turned ON and only vddq=3.3V becomes the output voltage (VCL-out), making the I/O voltage of the I/O drive circuit the greatest value, 3.3V. When the high-level voltage (Vdd) is input to the bonding pad BP1 via the solder bump 14 as illustrated in FIG. 52(b), only the switch b of the internal step-down circuit becomes ON and vddq1=2.5V becomes the output voltage (VCL-out) so that the I/O voltage of the I/O drive circuit corresponds to vddq2=2.5V. When the low-level voltage (Vss) is input to the bonding pad BP1 via the solder bump 14 as illustrated in FIG. 52(c), only the switch c of the internal step-down circuit becomes ON and vddq1=1.8V becomes the output voltage (VCL-out) so that the I/O voltage becomes 1.8V.

By changing the layout of the solder bumps 14 to be connected to the bonding pad BP1, the voltage of the signal output from the WL-CSP can be optimized for the external load. This makes it possible to narrow the voltage swing in a signal transmission path, thereby reducing noise or power consumption or actualizing high-velocity operation. In the above-described example, switchover of the I/O voltage is carried out by three stages, which can, needless to say, be increased to four or more stages. As the switch, any element or circuit whose ON/Off can be switched by the input of a high-level/low level signal is usable.

According to Embodiment 8, the I/O voltage of the output buffer can easily be switched only by changing the layout of the solder bumps 14.

(Embodiment 9)

In Embodiment 9, a method of switching the through rate of the output buffer by changing the layout of the solder bumps 14 will be described.

With regards to the wave pulse of a signal output from LSI, the smoother the pulse shape, in other words, the greater the gradient of the pulse shape, the greater the signal delay and less the noise. When priority is given to a reduction in noise over an increase in the operation speed, it is desired to increase the gradient (through rate) of the pulse shape of the signal. When noise is on the negligible level, on the other hand, it is desired to reduce the through rate, thereby improving operation rate.

In this Embodiment 9, a method of partially changing the layout of solder bumps 14 upon connection of them onto the bump land 2A is adopted as a method of selecting the most suitable through rate. A specific example of the method of switching the through rate by changing the layout of solder bumps 14 will hereinafter be described.

Figure 53:
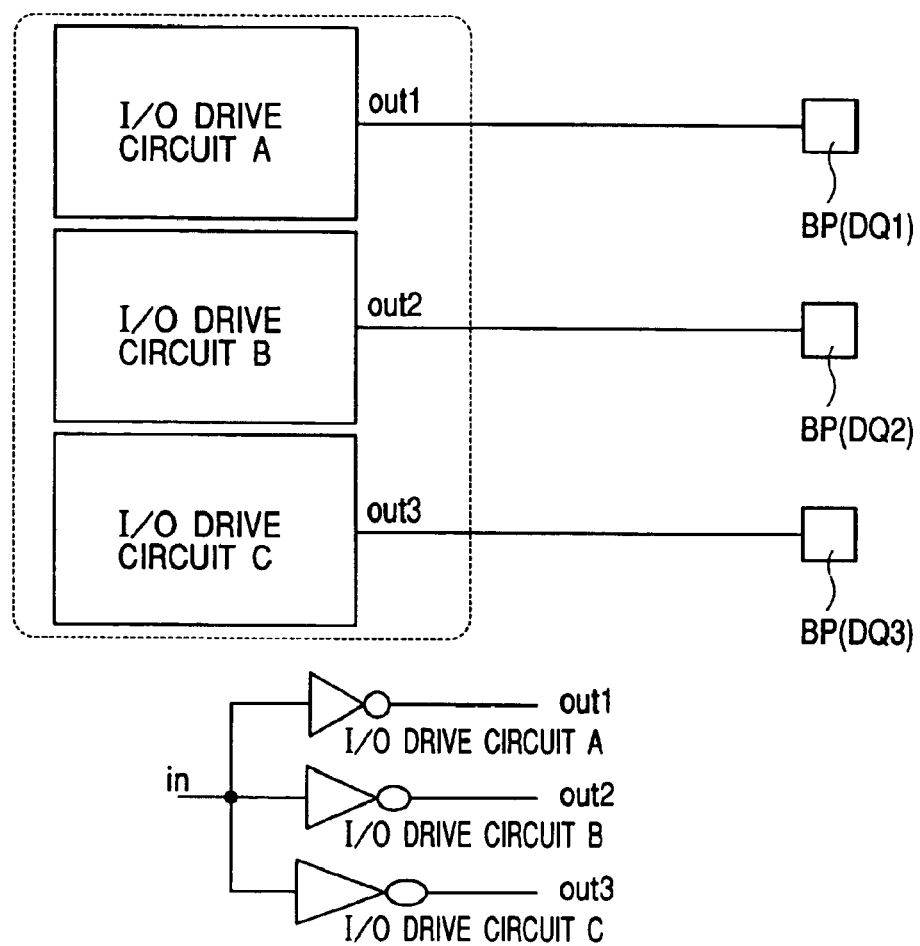
FIG. 53 is a block diagram illustrating a through rate control circuit.

FIG. 53 is a block diagram of a through rate control circuit formed in a WL-CSP. This through rate control circuit has three I/O drive circuits (A, B, C) different in through rate. The outputs (out1, out2, out3) of the I/O drive circuits (A, B, C) are connected to bonding pads BP (DQ1), BP (DQ2), BP (DQ3) via an Al alloy interconnect.

Figure 54:
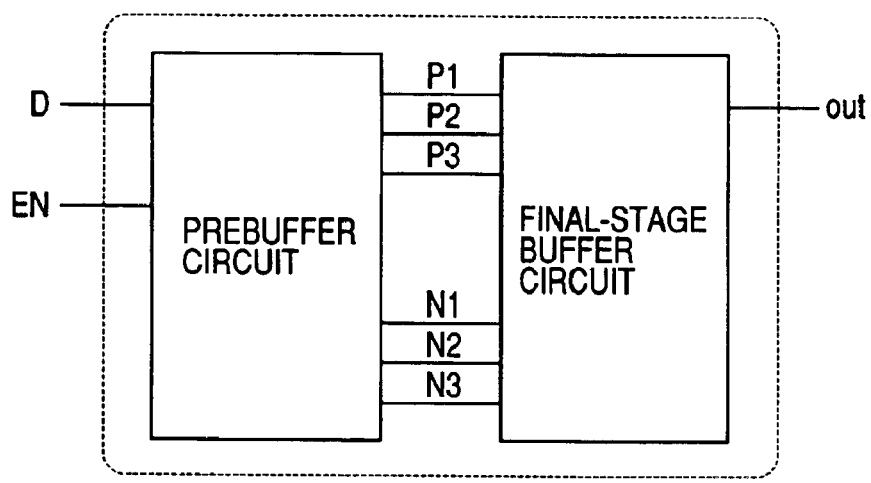
FIG. 54 is a block diagram illustrating an I/O drive circuit in the through rate control circuit.
Figure 55:
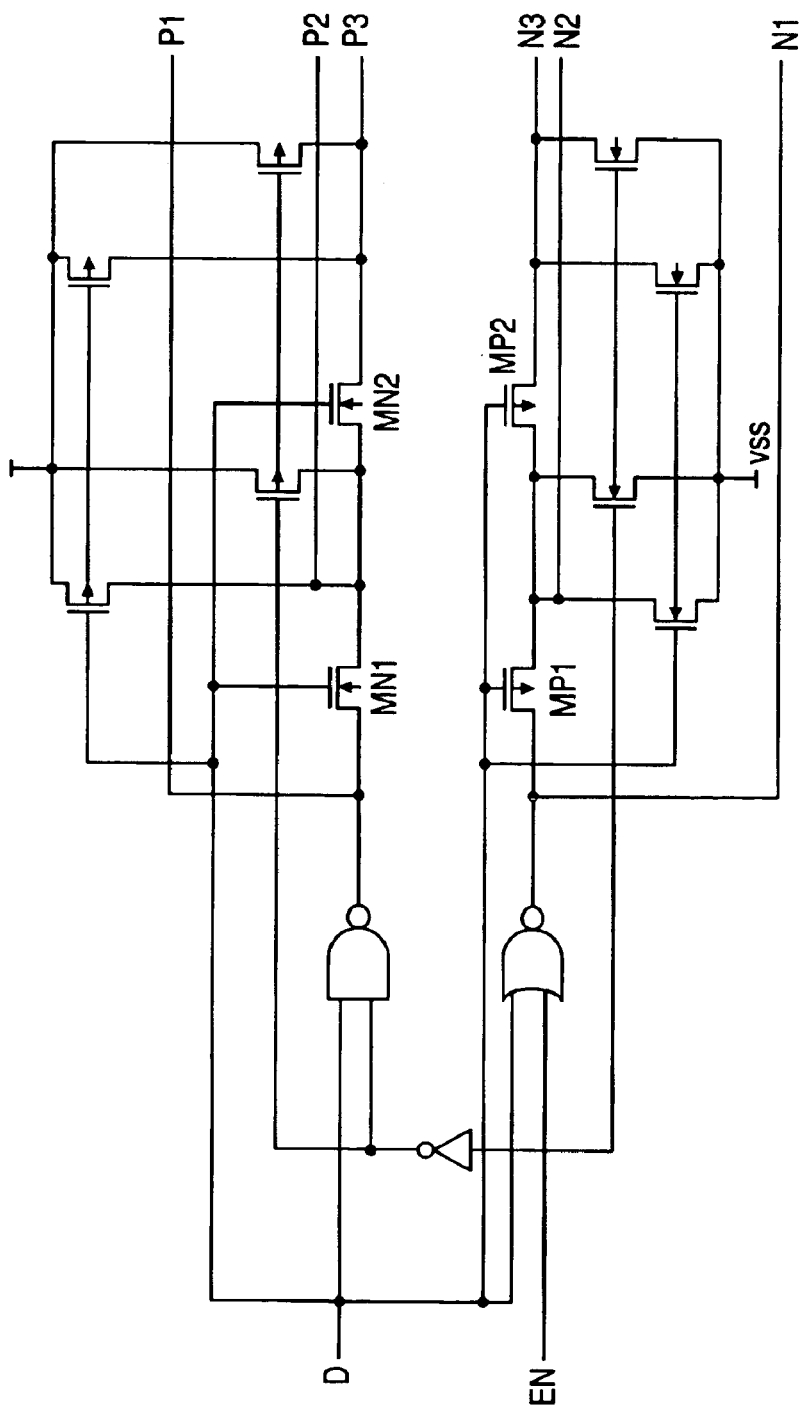
FIG. 55 is a circuit diagram illustrating a pre-buffer circuit in the I/O drive circuit illustrated in FIG. 51.
Figure 56:
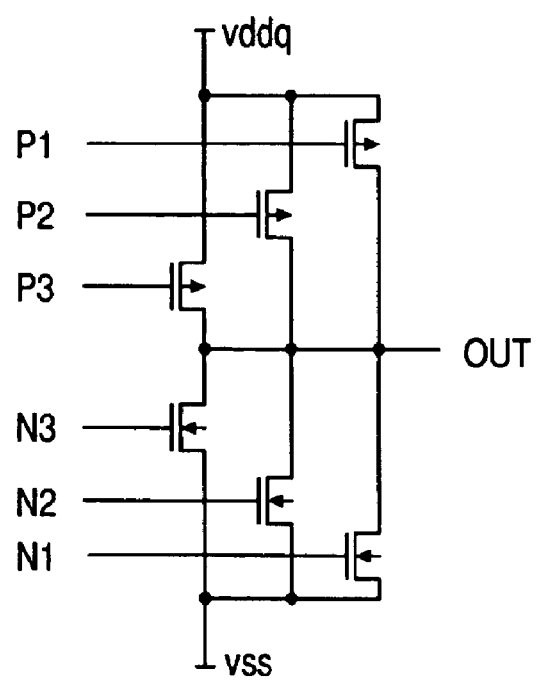
FIG. 56 is a circuit diagram illustrating a final-stage buffer circuit in the I/O drive circuit illustrated in FIG. 51.

As illustrated in FIG. 54, each of the three I/O drive circuits (A, B, C) is made of a prebuffer circuit and a final-stage buffer circuit. The prebuffer circuit is constituted as illustrated in FIG. 55, while the final-stage buffer circuit is constituted as illustrated in FIG. 56. The D terminal of the prebuffer circuit is a single input terminal, while the EN terminal is an enable terminal which turns the output of the final-stage buffer circuit ON/Off.

Figure 57:
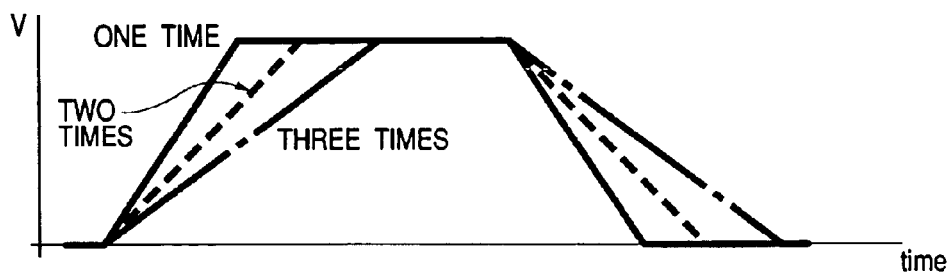
FIG. 57 is a view illustrating the relation between a through rate and a gradient of a wave form.

Illustrated in FIG. 57 is an W/L ratio (W=gate length, L=gate width) of the n-channel type MOS transistors (MN1, MN2) and p-channel type MOS transistors (MP1, MP2) formed on the I/O drive circuits (A, B, C). As is apparent from the diagram, the W/L ratio of the MOS transistors (MN1, MN2, MP1, MP2) of the I/O drive circuit B is half of that of the MOS transistors (MN1, MN2, MP1, MP2) of the I/O drive circuit A. The W/L ratio of the MOS transistors (MN1, MN2, MP1, MP2) of the I/O drive circuit C is one third of that of the MOS transistors (MN1, MN2, MP1, MP2) of the I/O drive circuit A. Since the drivability of the MOS transistor is in proportion to the W/L ratio, the drivability of the MOS transistors (MN1, MN2, MP1, MP2) of the I/O drive circuit B is twice, and that of the MOS transistors (MN1, MN2, MP1, MP2) of the I/O drive circuit A is three times, as much as that of the drivability of the MOS transistors (MN1, MN2, MP1, MP2) of the I/O drive circuit C. Accordingly, the delay in timing among three outputs (P1, P2, P3) of the prebuffer circuit becomes greater in the order of the I/O drive circuits A, B and C. Similarly, the delay in timing among the three outputs (N1, N2, N3) of the prebuffer circuit becomes greater in the order of the I/O drive circuits A, B and C.

The final-stage buffer circuit as illustrated in FIG. 56 is made of a circuit having a pre-CMOS transistor, a mid-CMOS transistor and a post-CMOS transistor connected in parallel and by a difference in turning timing of these three-stage CMOS transistors ON, the gradient (through rate) of the pulse shape of a signal to be output changes. As described above, when delay in timing is compared among the outputs of the prebuffer circuit, that of the I/O drive circuit B is twice and that of the I/O drive circuit C is three times, as much as that of the I/O drive circuit A. Accordingly, the through rate of the I/O drive circuit B is twice and the through rate of the I/O drive circuit C is three times, as much as the through rate of the I/O drive circuit A.

Figure 58:
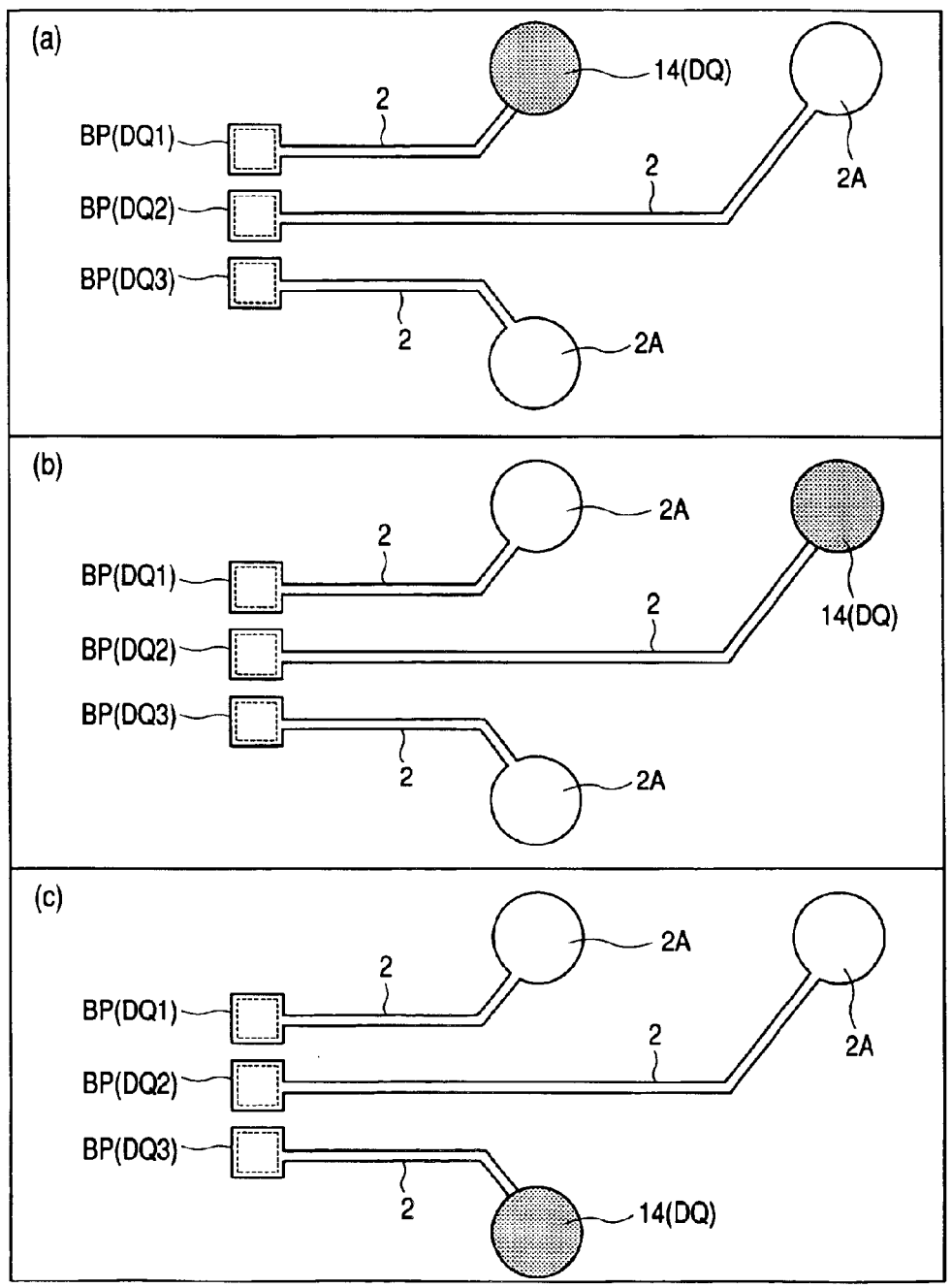
FIGS. 58(a) to (c) are each a plan view illustrating the connection state between a characteristics-selecting bump land and an external connection terminal.

The gradient (through rate) of the pulse shape of a signal output from the WL-CSP can be switched only by connecting the solder bump 14 (external connection terminal) constituting the DQ pin to any one of the three bump lands 2A connected to the bonding pads BP (DQ1, DQ2, DQ3). For example, in the WL-CSP as illustrated in FIG. 58(*a*), the solder bump 14 constituting the DQ pin is connected to the bonding pad BP (DQ1) via a relocating wiring layer 2. In this case, the solder bump 14 constituting the DQ pin is connected to the output (out1) of the I/O drive circuit A via the bonding pad BP (DQ1), which minimizes the through rate of the WL-CSP. In the WL-CSP as illustrated in FIG. 58(*b*), the DQ pin (solder bump 14) is connected to the bonding pad BP (DQ2) via the relocating wiring layer 2. In this case, the DQ pin (solder bump 14) is connected to the output (out2) of the I/O drive circuit B via the bonding pad BP (DQ2), which makes the through rate of WL-CSP twice as much as that of the WL-CSP of FIG. 58(*a*). In the WL-CSP as illustrated in FIG. 58(*c*), the DQ pin (solder bump 14) is connected to the bonding pad BP (DQ3) via the relocating wiring layer 2. In this case, the DQ pin (solder bump 14) is connected to the output (out3) of the I/O drive circuit C via the bonding pad BP (DQ3), which makes the through rate of the WL-CSP three times as much as that of the WL-CSP of FIG. 58(*a*).

Figure 59:
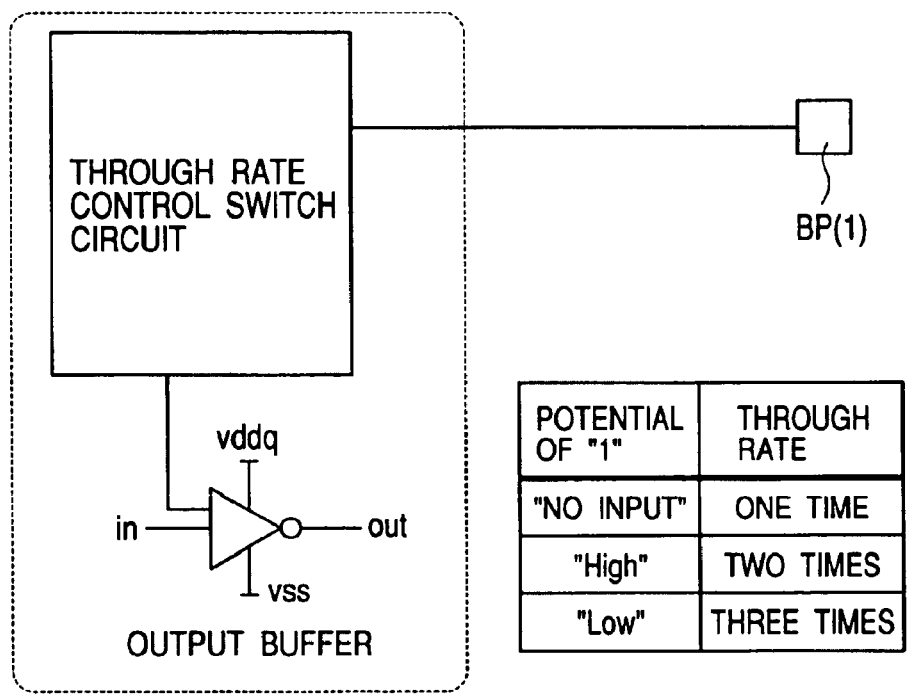
FIG. 59 is a block diagram illustrating another example of a through rate control circuit.

FIG. 59 illustrates another example of a through rate control circuit. This through rate control circuit is made of one output buffer and a through rate control switch circuit connected to the input side thereof. To the through rate control switch circuit, a high level voltage (Vdd), a low level voltage (Vss), or no voltage is input via the bonding pad BP1. Depending on these three states, a signal different in through rate is output from the output buffer.

As illustrated in FIG. 60(*a*), the through rate control switch circuit is made of a logic circuit, three switches (a, b, c) having an n-channel type MOS transistor, and three n-channel type MOS transistors equal in W/L ratio. To the logic circuit, a high level voltage (Vdd), a low level voltage (Vss) or no voltage is input via the bonding pad BP1. As illustrated in the logic diagram of FIG. 61, a high level or low level voltage is output from the outputs (A, B, C) of the logic circuit, depending on the above-described three states and depending on a change in ON/Off of the three switches (a, b, c), the through rate of an output signal becomes 1, 2 or 3 times.

As illustrated in FIG. 60(*b*), the through rate control switch circuit may be composed of a logic circuit, switches (a, b, c) having a p-channel type MOS transistor, and p-channel type MOS transistors equal in W/L ratio.

Alternatively, the circuit as illustrated in FIG. 60(*a*) may be used in combination with the circuit as illustrated in FIG. 60(*b*).

Figure 62:
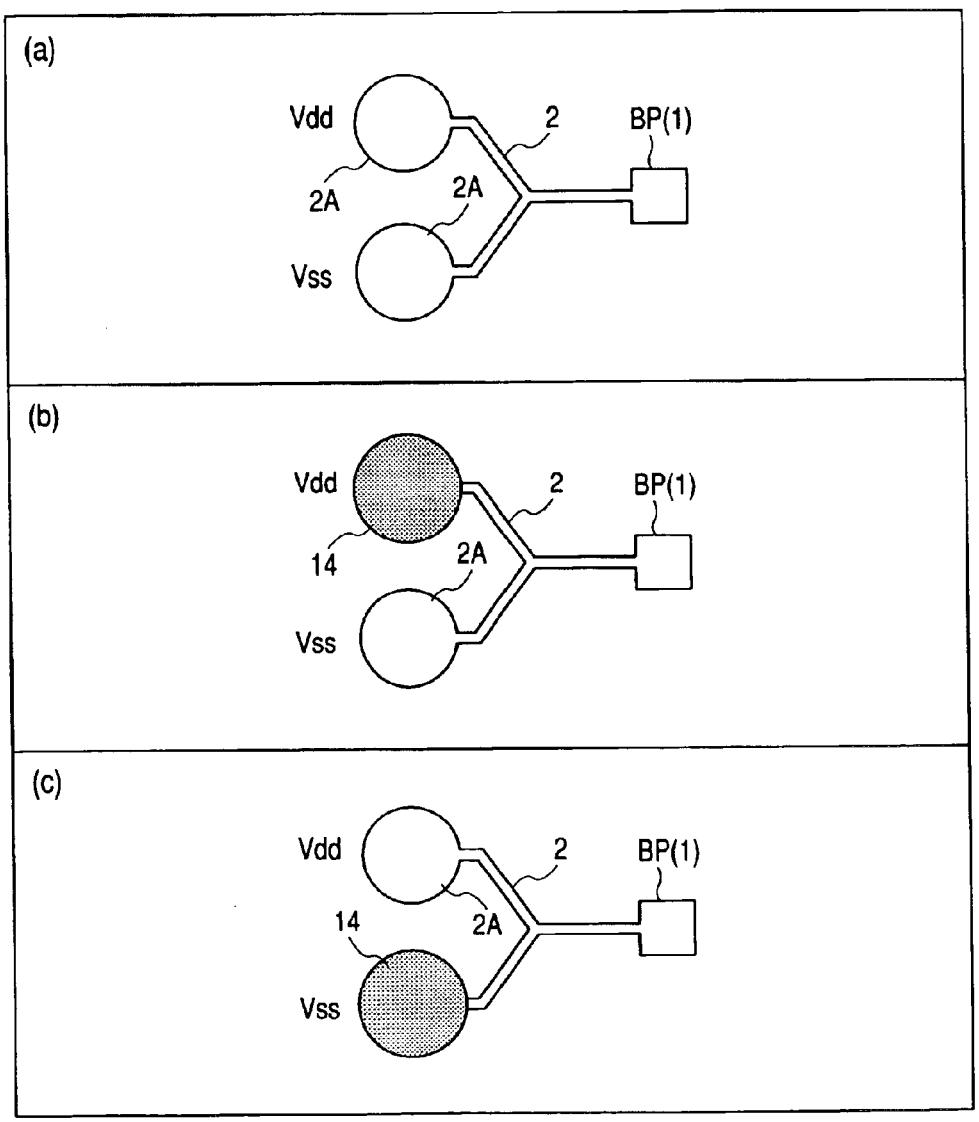
FIGS. 62(a) to (c) are each a plan view illustrating the connection state between a power applying bump land and an external connection terminal.

The through rate of the WL-CSP can be switched by, as illustrated in FIG. 62, inputting, via the solder bump 14, a high level voltage (Vdd), a low level voltage (Vss) or no voltage to the bonding pad BP1 connected to the logic circuit. For example, when no voltage is input to the bonding pad BP1 as illustrated in FIG. 62(*a*), only the switch a, of the three switches (a, b, c) of the through rate control switch circuit, is turned ON, whereby the through rate of the output signal minimum becomes minimum (one time) as is apparent from the logic diagram of FIG. 61. When a high level voltage (Vdd) is input to the bonding pad BP1 via the solder bump 14 as illustrated in FIG. 62, only the switch b, of the three switches (a, b, c) of the through rate control switch circuit, is turned ON, whereby the through rate of the output signal becomes two times. As illustrated in FIG. 62(*c*), when a low level voltage (Vss) is input via the solder bump 14 to the bonding pad BP1, only the switch c, of the three switches (a, b, c) of the through rate control switch circuit is turned ON, whereby the through rate of the output signal becomes maximum (three times).

Since in such a manner, the through rate of a signal output from the WL-CSP can be changed by altering the pattern of the relocating wiring layer 2 to be connected to the bonding pad BP1, noise of the output signal can be reduced. In the above-described example, a through rate is changed in three stages, but it is needless to say that it can be changed in four or more stages. As the switch, any element or circuit whose ON/Off can be switched by the input of a high level or low level signal is usable.

According to Embodiment 9, the through rate of an output buffer can be switched easily only by changing the layout of the solder bumps 14.

Figure 63:
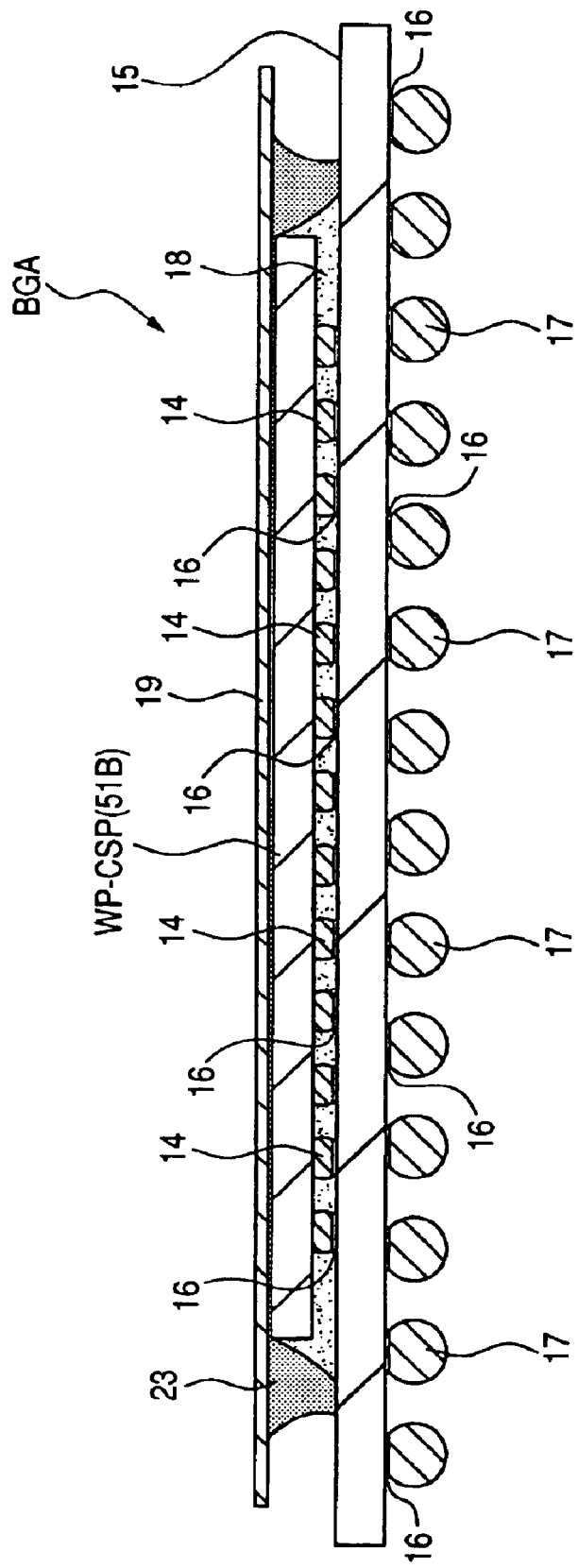
FIG. 63 is a cross-sectional view of BGA using a semiconductor integrated circuit device according to a still further embodiment of the present invention.

FIG. 63 is a BGA obtained by face-down bonding of the WL-CSP of Embodiment 9 having an SRAM formed thereon onto the main surface of a package substrate 15. The package substrate 15 is made of a general-purpose printed circuit board having a Cu interconnect formed on a resin substrate. To an electrode pads 16 on the back surface (lower surface) of the substrate, a plurality of solder bumps 17 are connected to constitute external connection terminals of the BGA. In the WL-CSP, a plurality of solder bumps 14 formed on the main surface of the chip 51B are packaged, respectively, by a flip chip system of connecting them to the corresponding electrode pads 16 on the main surface of the package substrate 15. A space between the WL-CSP (chip 51B) and the package substrate 15 is filled with an underfill resin 18 made of an epoxy resin added with, for example, a silicon filler. On the back surface (upper surface) of the WL-CSP (chip 51B), a metal-made protection plate 19 is adhered with an adhesive 23.

The inventions made by the present inventors have so far described specifically based on Embodiments 1 to 9. It should be noted that the present invention is not limited thereto. It is needless to say that it can be changed within an extent not departing from the gist of the invention.

For example, a relocating wiring layer may be formed by sputtering or CVD instead of plating. As the materials for the relocating wiring layer, metals other than Cu and Ni can be employed.

Not only DRAM or SRAM, the present invention can be applied to various memories using a nonvolatile memory device or various logic LSIs such as microcomputer.

Industrial Applicability

By changing the layout of external connection terminals, characteristics or functions of a semiconductor integrated circuit device can be selected easily for each wafer. In particular, the present invention facilitates selection of one of a plurality of functions or one of a plurality of characteristics.

What is claimed is:

1. A semiconductor integrated circuit device comprising a semiconductor substrate having a main surface, a circuit element formed on the main surface and constituting an integrated circuit having a plurality of functions or a plurality of characteristics, an electrode formed on the main surface and connected to the circuit element, a first wiring formed in the same layer with the electrode and connecting the circuit element to the electrode, an insulating layer formed to cover the first wiring and the circuit element and to expose the electrode, a second wiring formed over the insulating layer and made of a layer different from that of the first wiring, and an external connection terminal disposed over the insulating layer and electrically connected to the second wiring, wherein one of the plurality of functions or plurality of characteristics of the integrated circuit is selected by the connection state of the second wiring and the external connection terminal.

2. A semiconductor integrated circuit device according to claim 1, wherein the function is a bit constitution or operation mode.

3. The semiconductor integrated circuit device according to claim 1, wherein the characteristic is output impedance, operation voltage or through rate.

4. A semiconductor integrated circuit device according to claim 1, wherein one of the plurality of functions or one of the plurality of characteristics is selected by feeding the electrode with a power-supply voltage or reference voltage via the external connection terminal and the second wiring, or by making the second wiring and the external connection terminal connectionless.

5. A semiconductor integrated circuit device according to claim 1, wherein the second wiring is made of a metal film formed over the insulating layer by thin film technology.

6. A semiconductor integrated circuit device according to claim 5, wherein the second wiring is comprised mainly of a copper film or a copper alloy film.

7. A semiconductor integrated circuit device according to claim 5, wherein the second wiring is made of chromium, copper or nickel.

8. A semiconductor integrated circuit device according to claim 1, wherein the external connection terminal is formed of a bump electrode.

9. A semiconductor integrated circuit device according to claim 8, wherein the external connection terminal is formed of a solder bump.

10. A semiconductor integrated circuit device according to claim 1, which comprises a plurality of the external connection terminals and a plurality of the electrodes, the distance between the plurality of the external connection terminals being greater than that between the plurality of the electrodes.

11. A semiconductor integrated circuit device according to claim 1, wherein the external connection terminal has an area greater than that of the electrode.

12. A semiconductor integrated circuit device according to claim 1, wherein the insulating layer is made of a polyimide resin.

13. A semiconductor integrated circuit device according to claim 1, wherein the insulating layer contains an elastomer layer.

14. A manufacturing method of a semiconductor integrated circuit device, comprising the steps of:

(a) forming, in a plurality of chip regions over the main surface of a semiconductor wafer, a circuit element constituting an integrated circuit having a plurality of functions or a plurality of characteristics;

(b) forming, over the circuit element, an electrode to be connected thereto and a first wiring formed in the same layer with the electrode and connecting the circuit element and the electrode;

(c) forming an insulating layer covering therewith the first wiring and the circuit element and exposing the electrode;

(d) forming over the insulating layer second wirings electrically connected, at one end thereof, to the electrode;

(e) connecting an external connection terminal to a predetermined interconnect of the second wirings, thereby selecting one of the plurality of functions or the plurality of characteristics, and (f) dividing the semiconductor wafer by the plurality of chip regions, thereby forming a plurality of semiconductor chips.

15. A manufacturing method of a semiconductor integrated circuit device according to claim 14, wherein following the step (d), after storage of the semiconductor wafer and determination of a design, the external connection terminal is connected to the predetermined interconnect of the second wirings, whereby a function or characteristic suited for the design is selected.

16. A manufacturing method of a semiconductor integrated circuit device according to claim 14, wherein the function is bit constitution or operation mode.

17. A manufacturing method of a semiconductor integrated circuit device according to claim 14, wherein the characteristic is output impedance, operation voltage or through rate.

18. A manufacturing method of a semiconductor integrated circuit device according to claim 14, wherein the second wirings are formed by the plating method.

19. A manufacturing method of a semiconductor integrated circuit device according to claim 14, wherein the external connection terminal is comprised of a solder bump.

20. A manufacturing method of a semiconductor integrated circuit device according to claim 14, wherein the insulating layer is comprised of a polyimide resin.

21. A manufacturing method of a semiconductor integrated circuit device according to claim 14, wherein a portion of the insulating layer is comprised of an elastomer layer.

* * * * *